(12) United States Patent
Sato

(10) Patent No.: US 6,337,163 B1
(45) Date of Patent: Jan. 8, 2002

(54) METHOD OF FORMING A PATTERN BY MAKING USE OF HYBRID EXPOSURE

(75) Inventor: Yasuhiko Sato, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/400,280

(22) Filed: Sep. 21, 1999

(30) Foreign Application Priority Data

Sep. 22, 1998 (JP) .......................... 10-268681

(51) Int. Cl.⁷ ............................. G03F 9/00; G03C 5/00
(52) U.S. Cl. ..................... 430/30; 430/296; 430/312; 430/313; 430/328
(58) Field of Search ................ 430/296, 312, 430/313, 328, 30

(56) References Cited

U.S. PATENT DOCUMENTS 5,994,030 A * 11/1999 Sugihara et al. ............ 430/328
6,159,644 A * 12/2000 Satoh et al. ................ 430/328

FOREIGN PATENT DOCUMENTS

JP          9-7924         1/1997

* cited by examiner

*Primary Examiner*—Christopher G. Young
(74) *Attorney, Agent, or Firm*—Finnegan, Henderson, Farabow, Garrett, & Dunner, L.L.P.

(57) ABSTRACT

A method of forming a pattern, which comprises the steps of, forming an underlying film on a work film, forming a resist film on the underlying film, exposing the resist film to ultraviolet rays of predetermined pattern, forming a resist pattern by subjecting the resist film to a developing treatment, exposing the underlying film to an electron beam of predetermined pattern, and dry-etching the underlying film with the resist pattern and the region of the predetermined pattern of exposure by means of the electron beam being employed as an etching mask.

16 Claims, 5 Drawing Sheets

METHOD OF FORMING A PATTERN BY MAKING USE OF HYBRID EXPOSURE

BACKGROUND OF THE INVENTION

This invention relates to a method of forming a pattern, and in particular, to a method of forming a pattern by making use of hybrid exposure, which is suited for the manufacture of a semiconductor device.

The photolithography has been widely employed in the manufacturing process of a semiconductor device because of its advantages such as processing simplicity and low cost. Owing to the continuous technological innovation, it is now becoming possible in recent years to miniaturize the semiconductor device of as small as not more than 0.25 µm by making use of a light source of increasingly shortened wavelength (KrF excimer laser source). An ArF excimer laser source having a more shortened wavelength and a Levenson type phase shifting mask are now being developed with a view to further miniaturize the semiconductor element, so that these new technologies are expected to become a mass production lithographic tool which is applied to a device of 0.15 µm rule.

However, there are still many problems that have to be solved before realizing the aforementioned new technologies in spite of the fact that it has already taken a long period of time for the development of these new technologies, so that it is feared that it may fail to catch up with the speed of the miniaturization of semiconductor device.

On the other hand, an electron beam lithography which is considered as one of the most prospective candidate for a post photolithography employs a finely throttled beam and has been proven to be useful for forming a pattern having a line width of 0.01 µm.

This electron beam lithography, however, is accompanied with a problem in throughput as it is used as a device mass-production tool though no problem may be raised with respect to the miniaturization of device for the time being. Namely, since a fine pattern is required to be depicted one by one by turns, it inevitably takes a long time.

With a view to overcome this problem, there has been proposed a patterning method which is excellent both in resolution that can be attained by the employment of an electron beam exposure and in productivity that can be attained by the employment of a light exposure. Specifically, a resist which is sensitive to both ultraviolet rays and electron beam is employed in this patterning method, so that only the fine pattern to which ultraviolet rays can be hardly applicable with a sufficient margin is subjected to exposure using an electron beam, and the patterns other than the aforementioned fine pattern are to be exposed using ultraviolet rays, a resist thus exposed to ultraviolet rays being subsequently developed thereby to form a resist pattern.

However, according to the aforementioned patterning method, it has been difficult to obtain an excellent profile of pattern both in the pattern to be formed by making use of ultraviolet rays and in the pattern to be formed by making use of electron beam, because the distribution in intensity of ultraviolet rays differs from the distribution in intensity of electron beam. Furthermore, it becomes important in this patterning method to align at a high precision the position of the pattern that has been formed by making use of ultraviolet rays with the position of the pattern that has been formed by making use of electron beam.

However, according to the conventional method of aligning these positions with each other, the position of pattern that has been formed by making use of ultraviolet rays as well as the position of pattern that has been formed by making use of electron beam are both required to be corrected with reference to the alignment marks that have been formed in advance on the underlying substrate. Namely, an indirect alignment system has been adopted in the conventional method. Therefore, this conventional method is defective in that it is impossible to improve the alignment precision, because it is not designed to directly align these patterns with each other.

BRIEF SUMMARY OF THE INVENTION

The present invention has been made under the circumstances, and therefore, an object of the present invention is to provide a method of forming a pattern, which is capable of forming a pattern having a high resolution specific to electron beam and capable of realizing an excellent productivity specific to light exposure, even if it employs a resist which is capable of forming an excellent profile when a light exposure is employed, but is incapable of forming an excellent profile when an electron beam exposure is employed.

Another object of the present invention is to provide a method of forming a pattern by making use of a hybrid exposure where patterns formed through light exposure and through electron beam are directly aligned with each other thereby making it possible to obtain a high precision alignment of these patterns.

Namely, according to this invention, there is provided a method of forming a pattern by making use of a hybrid exposure, the method comprising the steps of;

forming an underlying film on a work film;

forming a resist film on the underlying film;

exposing the resist film to a first energy beam of a first pattern;

forming a resist pattern by subjecting the resist film to a developing treatment;

exposing the underlying film to a second energy beam of a second pattern; and dry-etching the underlying film with the resist pattern and the region of the second pattern of exposure by means of the second energy beam being employed as an etching mask.

According to this invention, there is also provided a method of forming a pattern by making use of a hybrid exposure, the method comprising the steps of;

forming a resist film on a work film;

exposing the resist film to a first energy beam of a first pattern;

forming a first resist pattern by subjecting the resist film to a developing treatment;

detecting information on the position of the first resist pattern;

exposing the first resist pattern to a second energy beam of a second pattern based on a result of the information obtained on the position of the first resist pattern; and forming a second resist pattern by subjecting the first resist pattern to a developing treatment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
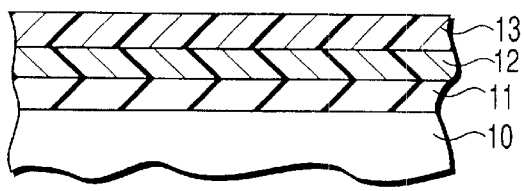
FIGS. 1A to 1D illustrate cross-sectional views sequentially showing the process of forming a pattern according to Example 1 of this invention.

According to a first embodiment of this invention, there is provided a method of forming a pattern by making use of a hybrid exposure, said method comprising the steps of; forming an underlying film on a work film; forming a resist film on said underlying film; exposing said resist film to a first energy beam with a first pattern; forming a resist pattern by subjecting said resist film to a developing treatment; exposing said underlying film to a second energy beam with a second pattern; and dry-etching said underlying film with said resist pattern and the region of said predetermined pattern of exposure by means of said second energy beam being employed as an etching mask.

According to the aforementioned first embodiment of this invention, since a resist film is patterned using a first energy beam, and an underlying film is patterned using a second energy beam, by using ultraviolet rays and an electron beam as the first energy beam and the second energy beam, respectively, it is now possible to form a pattern enabling to obtain a high resolution specific to, for example, electron beam and to realize an excellent productivity specific to, for example, light exposure, even if it employs a resist which is incapable of forming an excellent profile when the second energy beam exposure is employed.

The first embodiment of this invention involves the following specific aspects.

(1) The first energy beam may be ultraviolet rays, while the second energy beam may be a charged beam. As for the charged beam, an electron beam or an ion beam may be employed. Specific examples of ion beam include a Ga beam.

(2) The extinction coefficient k of ultraviolet rays in the underlying film should preferably be in the range of $0.1 < k < 1.0$. If the extinction coefficient k of ultraviolet rays is confined within this range, the reflection of exposure light from the surface of the underlying film to the resist at the occasion of light exposure can be reduced, thus making it possible to obtain a resist pattern having an excellent dimension control.

(3) The underlying layer may be formed of a resin film containing an organic silicon compound whose backbone chain includes a silicon-silicon bond. Since this resin film absorbs ultraviolet rays to be employed as an exposure light, it functions as an anti-reflection film. Further, since the etching rate of this resin film is decreased as a result of the irradiation of charged beam, the charged beam exposure region can be employed as an etching mask for etching the charged beam unexposure region thereby to form a pattern.

(4) The underlying layer may be formed of a material which can be cured by the irradiation of charged beam. Since the etching rate of this material is decreased as a result of the curing of an organic compound constituting the material by the irradiation of charged beam, the charged beam exposure region can be employed as an etching mask for etching the charged beam unexposure region thereby to form a pattern.

(5) The dry etching of the underlying layer may be performed by making use of a source gas containing chlorine atom or bromine atom. When such a source gas is employed and at the same time, when an organic silicon compound whose backbone chain includes a silicon-silicon bond is employed as the underlying film, the unexposure region can be etched at a high selective ratio in relative to the charged beam exposure region.

(6) The position of exposure to the underlying film for forming a predetermined pattern by making use of the second energy beam may be corrected based on the information on position of the resist pattern. Since the resist pattern formed through an exposure of the first energy beam is employed as an alignment mark in the alignment of the pattern to be formed using the second energy beam in this manner (i.e. these patterns are directly aligned with each other), the alignment (registration) accuracy can be improved.

(7) The detection of position may be performed using light or electron beam. If the detection of position is performed in this manner, the information on position of the resist pattern can be effectively detected.

According to a second embodiment of this invention, there is provided a method of forming a pattern by making use of a hybrid exposure, said method comprising the steps of; forming a resist film on a work film; exposing said resist film to a first energy beam with a first pattern; forming a first resist pattern by subjecting said resist film to a developing treatment; detecting information on the position of said first resist pattern; exposing said first resist pattern to a second energy beam with a second pattern based on a result of said information obtained on the position of said first resist pattern; and forming a second resist pattern by subjecting said first resist pattern to a developing treatment.

According to the aforementioned second embodiment of this invention, since the resist pattern formed by means of the first energy beam is employed as an alignment mark in the alignment of the pattern to be formed using the second energy beam (i.e. these patterns are directly aligned with each other), the alignment (registration) accuracy can be greatly improved.

The second embodiment of this invention involves the following specific aspects.

(1) The first energy beam may be ultraviolet rays, while the second energy beam may be a charged beam. As for the charged beam, an electron beam or an ion beam may be employed. Specific examples of ion beam include a Ga beam.

(2) The first energy beam may be charged beam, while the second energy beam may be ultraviolet rays.

(3) Both of the first resist pattern and the second resist pattern may be a positive pattern.

(4) The first resist pattern may be a positive pattern, while the second resist pattern may be a negative pattern.

(5) The detection of positional information may be performed using a light or electron beam.

(6) The aforementioned detection of position using a light or electron beam may be performed so as to prevent the resist from being photosensitized.

This invention will be further explained in detail with reference to the drawings.

First of all, the method of forming a pattern according to the first embodiment of this invention will be explained in details by referring to FIGS. 1A to 1D.

As shown in FIG. 1A, first of all, an underlying film 12 is formed on a work film 11 (i.e. a film to be worked). There is not any particular limitation on the kind of this work film 11. Namely, it may be a silicon oxide film, a silicon nitride film, a silicon oxynitride film, a spin-on-glass, a silicon-based insulating film to be used as a blank material in the manufacture of a mask, a silicon-based material (such as amorphous silicon, polysilicon (polycrystalline) Si or silicon substrate), or a wiring material such as aluminum, aluminum silicide, copper and tungsten.

The film thickness of the underlying film 12 should preferably be in the range of 0.005 to 5 µm. The reason is that if the film thickness of the underlying film 12 is less than 0.005 µm, it is difficult to sufficiently reduce a reflection light at the occasion of forming a pattern by means of light exposure. On the other hand, if the film thickness is more than 5 µm, it may become difficult to anisotropically etch the underlying film.

Further, it is preferable to employ an underlying film whose extinction coefficient k as it is subjected to an exposure with an exposure wavelength falls within the range of $0.1 < k < 1.0$. Because if the extinction coefficient k is less than 0.1, the absorption of the underlying film is too low to sufficiently reduce the reflection of the exposure light from the work film. On the other hand, if the extinction coefficient k is more than 1.0, the reflection of exposure light from the underlying film becomes too strong on the contrary.

As for the underlying film, it is required to employ a material whose etching rate would be lowered by the irradiation of charged beam. Examples of such a material includes an organosilicon compound having a silicon-silicon bond in its backbone chain. Since this organosilicon compound having a silicon-silicon bond in its backbone chain is capable of absorbing a light of ultraviolet wavelength zone, i.e. an exposure light, through the silicon-silicon bond, it functions effectively as an anti-reflection film at the occasion of light exposure.

Further, this organosilicon compound having a silicon-silicon bond in its backbone chain can be turned into a silicon oxide/carbide-like film as it is irradiated with a charged beam, thus rendering it to become hardly etched.

Examples of the organosilicon compound having a silicon-silicon bond in its backbone chain include polysilane to be represented by the general formula $(SiR^{11}R^{12})$ (wherein $R^{11}$ and $R^{12}$ are individually hydrogen atom, or a substituted or unsubstituted aliphatic or aromatic hydrocarbon group having 1 to 20 carbon atoms).

As for this polysilane, it may be a homopolymer or a copolymer, or it may of a structure wherein two or more polysilanes are bonded together via oxygen atom, nitrogen atom, an aliphatic group or an aromatic group.

Specific examples of organosilicon compounds useful in this invention are polysilane or polysilene represented by the following formulas (1-1) to (1-114). In these formulas, m and n respectively represent a positive integer.

[1-1]

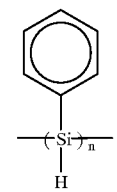

[1-2]

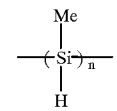

[1-3]

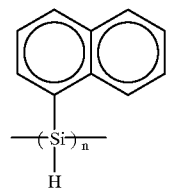

[1-4]

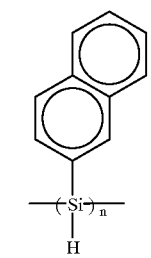

[1-5]

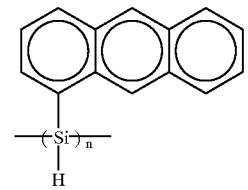

[1-6]

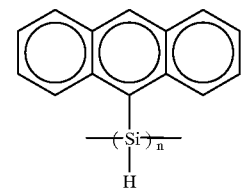

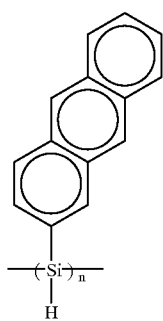
[1-7]
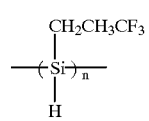
[1-8]
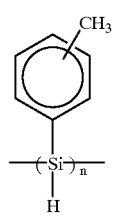
[1-9]
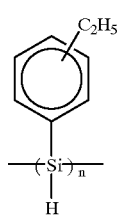
[1-10]
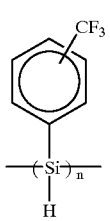
[1-11]
[1-12]
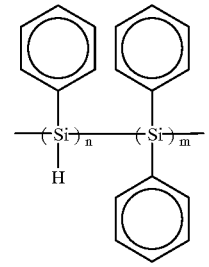
[1-13]
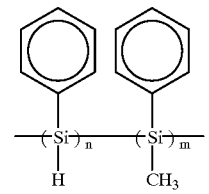
[1-14]
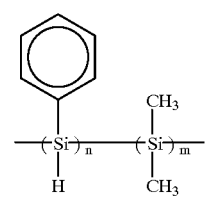
[1-15]
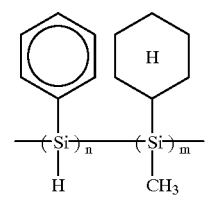
[1-16]
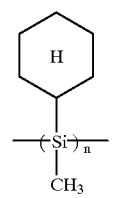
[1-17]
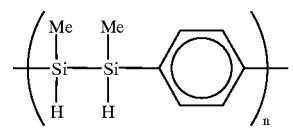
[1-18]
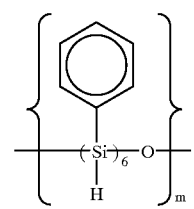
[1-19]

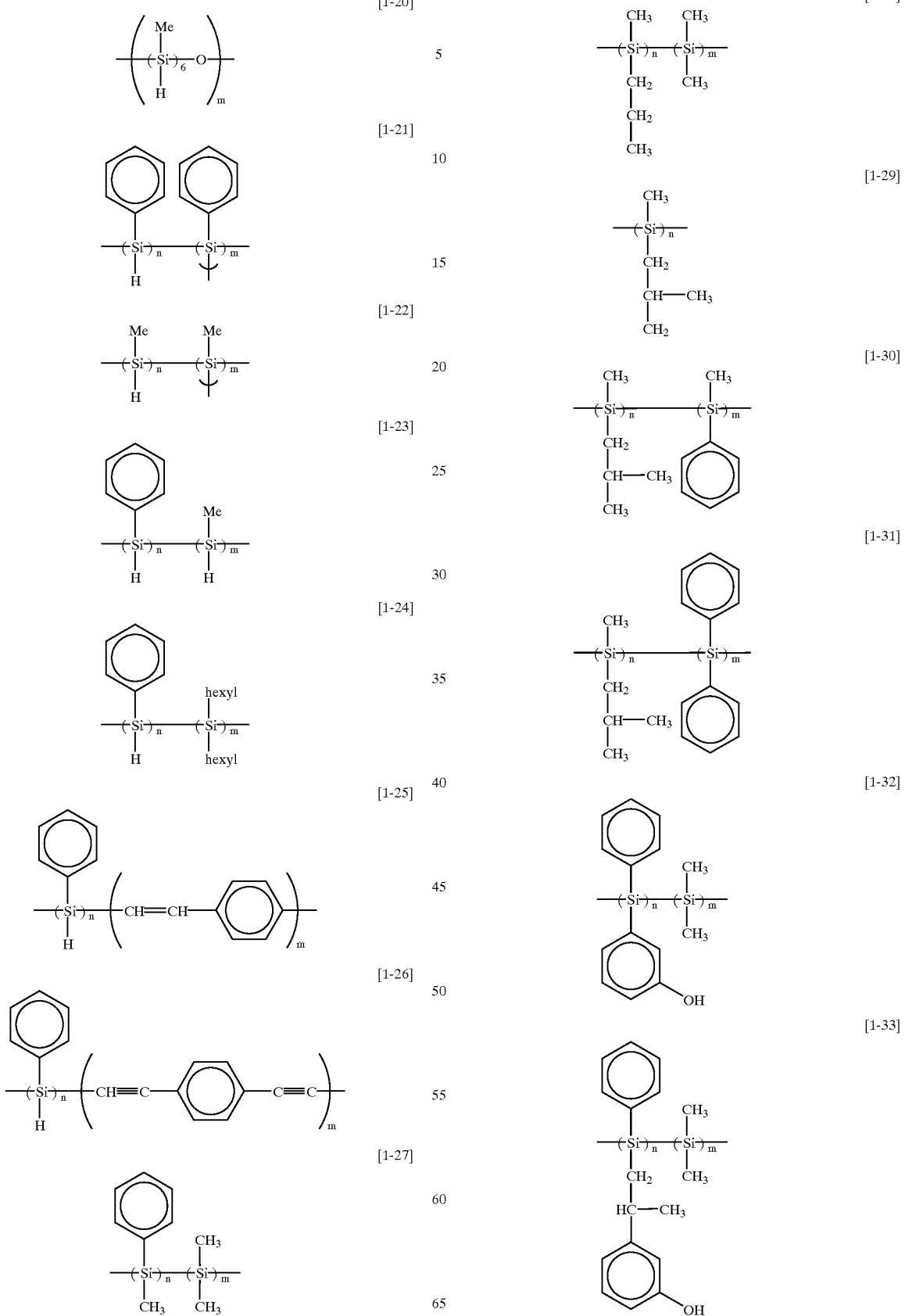

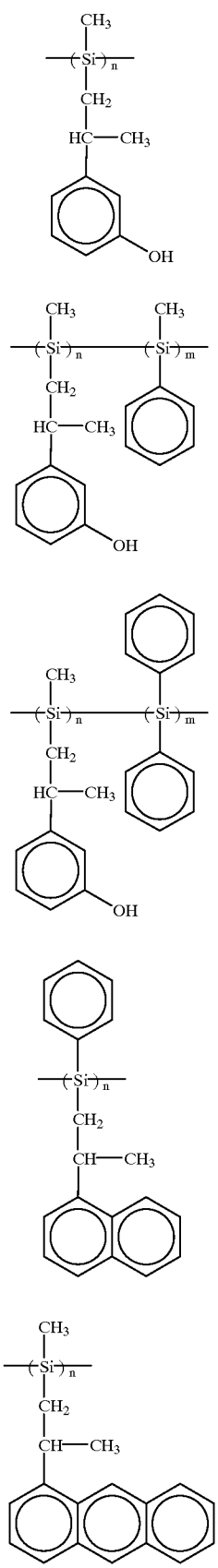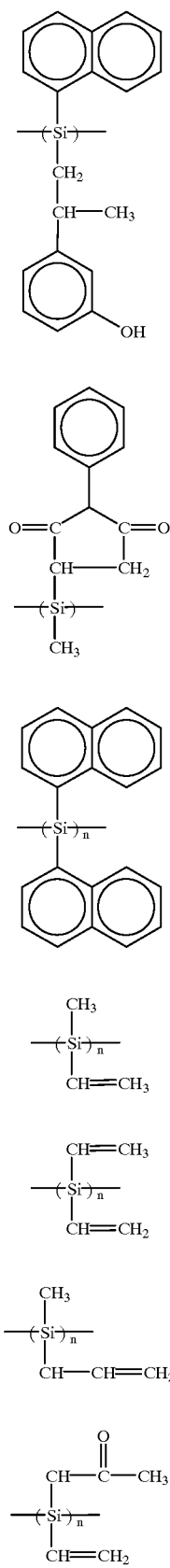

[1-46]
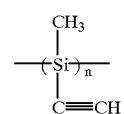
[1-47]
[1-48]
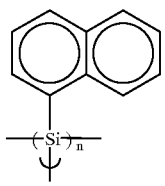
[1-49]
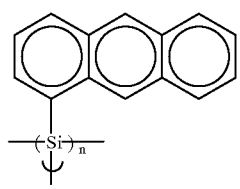
[1-50]
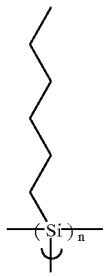
[1-51]
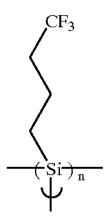
[1-52]
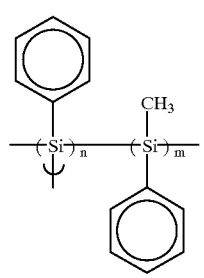
[1-53]
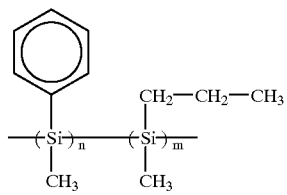
[1-54]
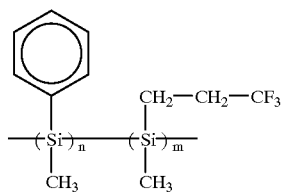
[1-55]
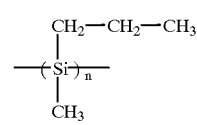
[1-56]
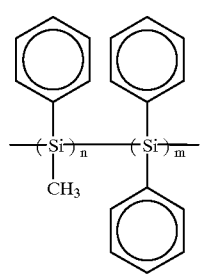
[1-57]
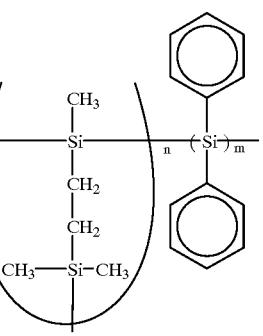
[1-58]
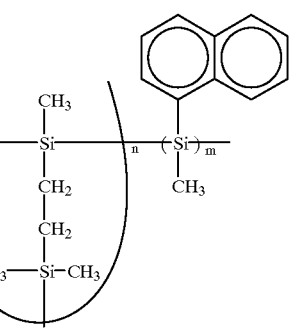

[1-59]
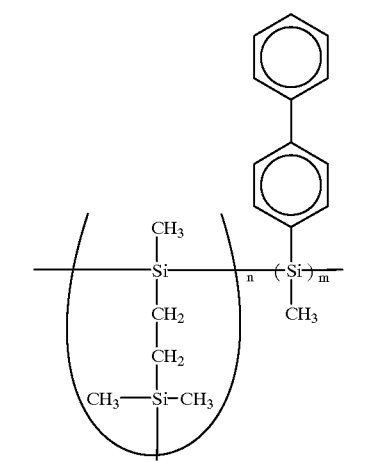
[1-60]
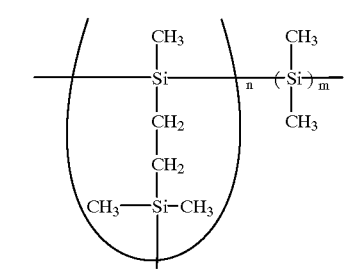
[1-61]
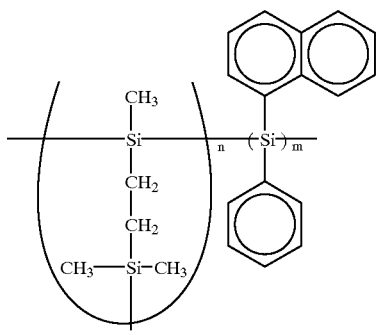
[1-62]
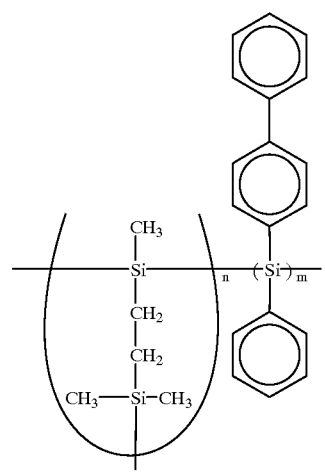
[1-63]
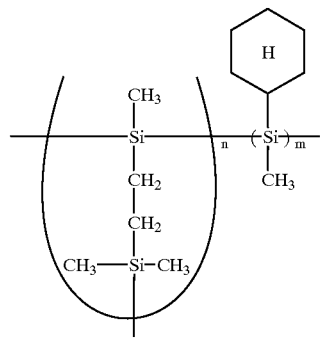
[1-64]
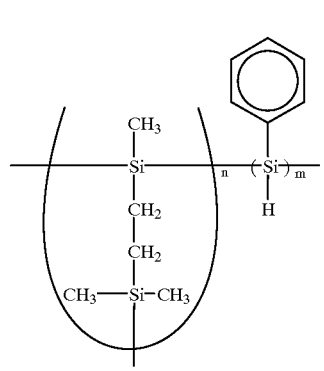
[1-65]
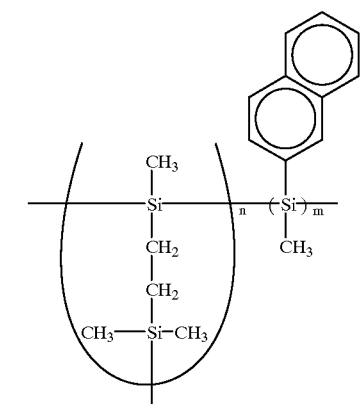
[1-66]
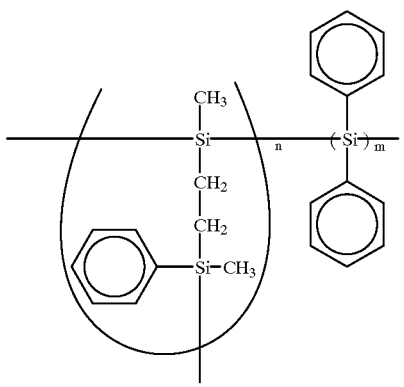

[1-67]
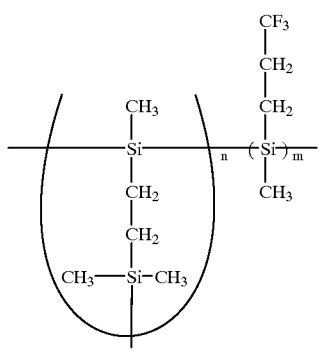
[1-68]
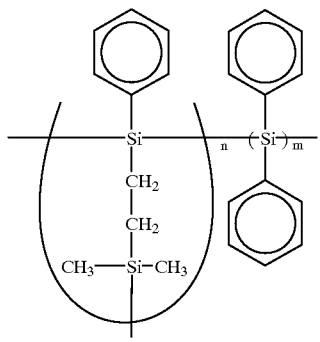
[1-69]
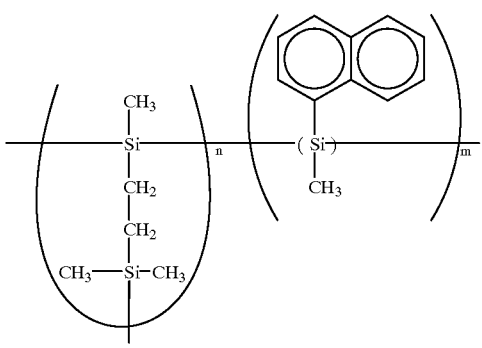
[1-70]
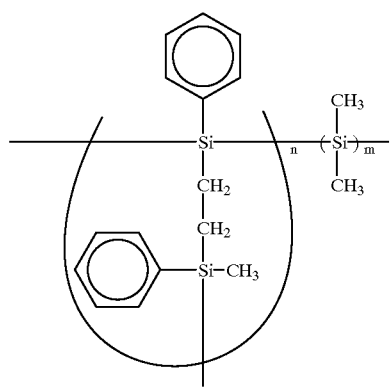
[1-71]
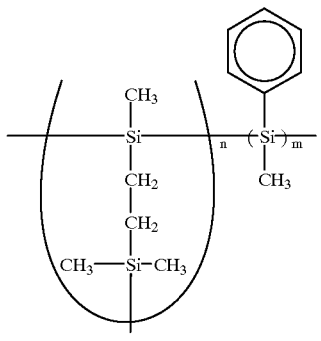
[1-72]
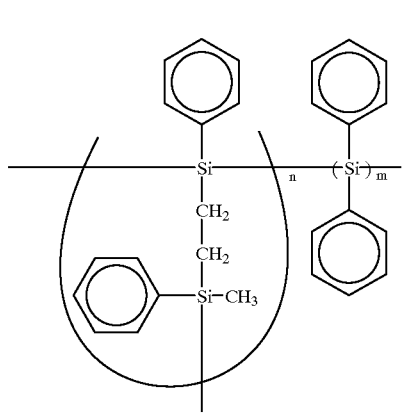
[1-73]
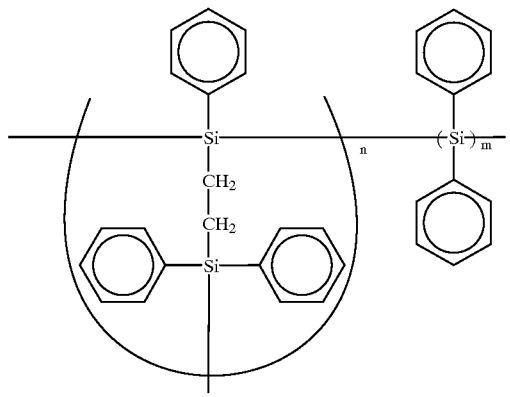
[1-74]
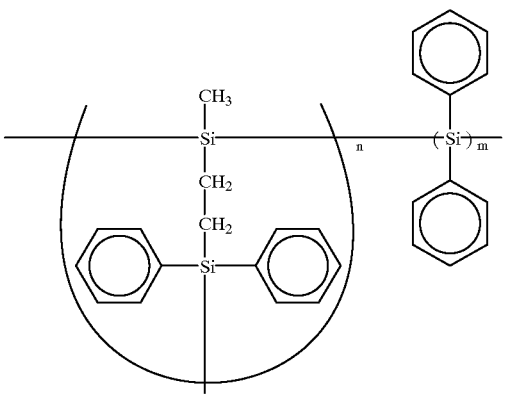

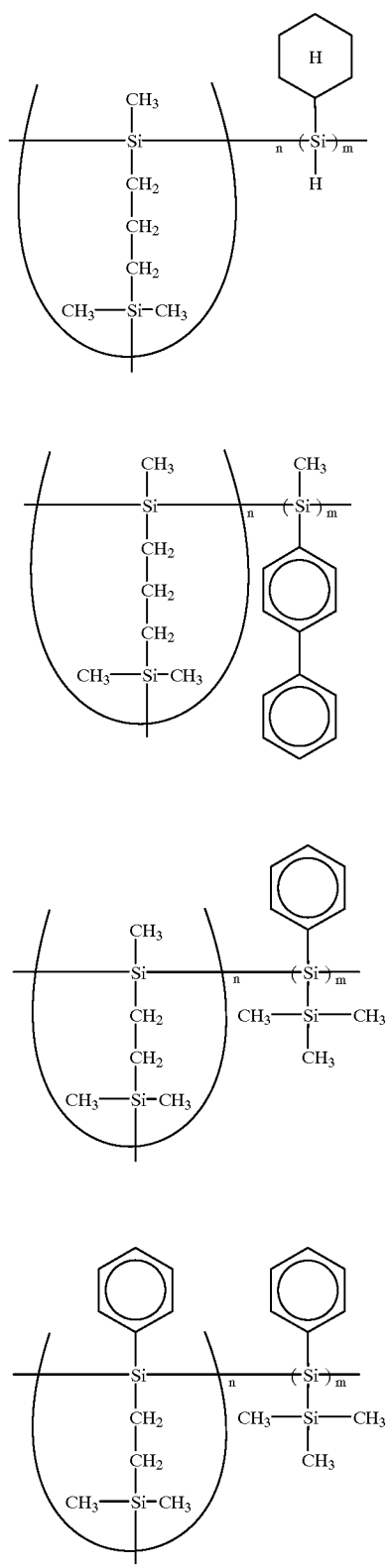
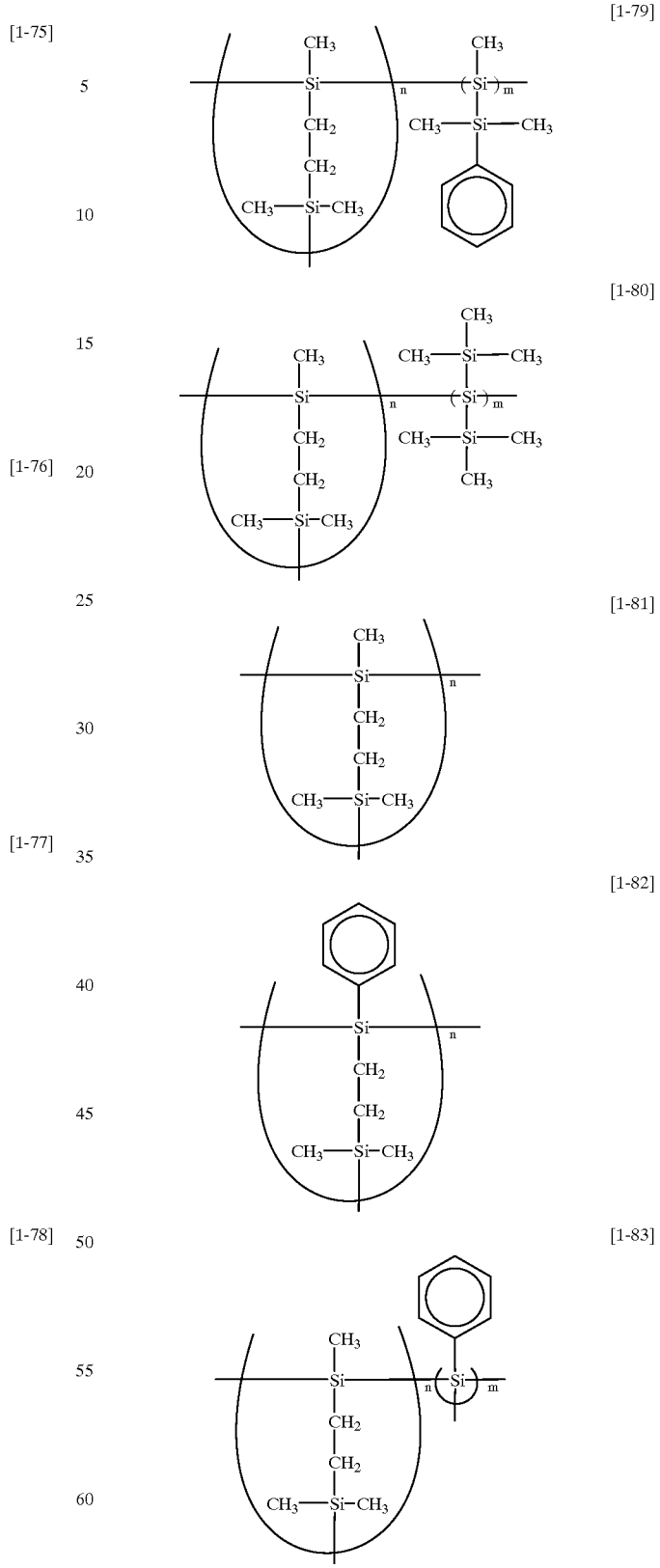

[1-84]
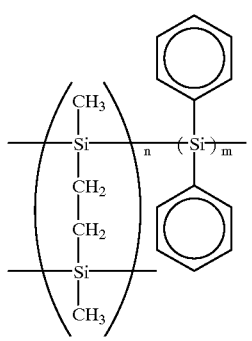
[1-85]
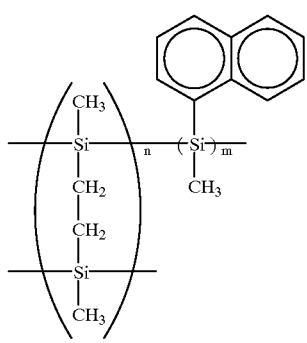
[1-86]
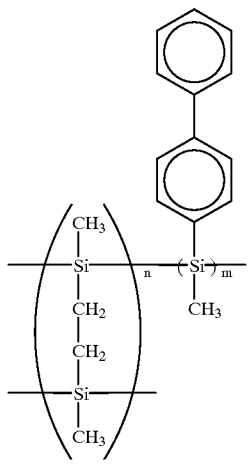
[1-87]
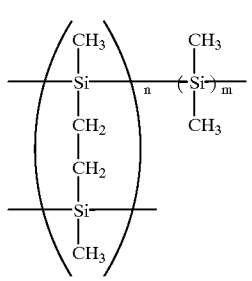
[1-88]
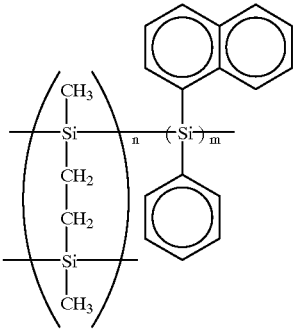
[1-89]
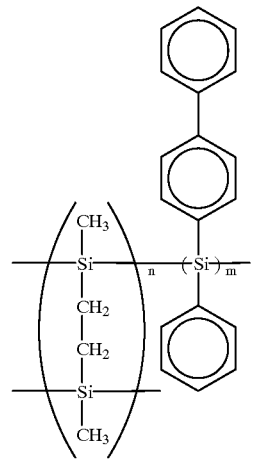
[1-90]
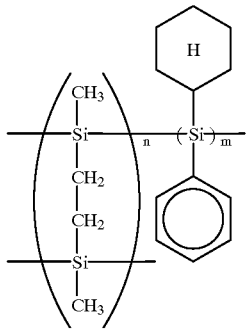
[1-91]
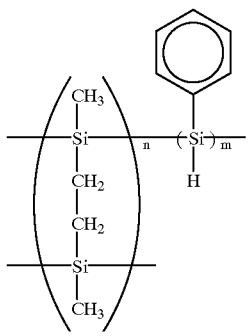

[1-92]
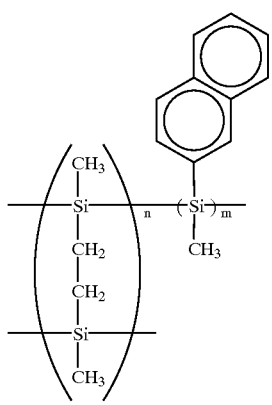
[1-93]
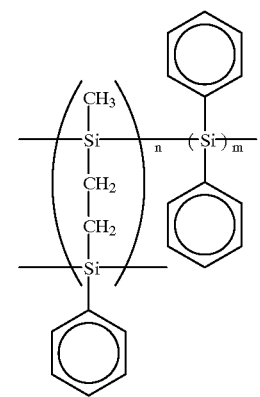
[1-94]
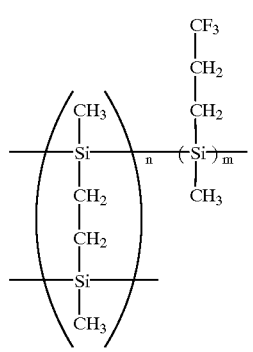
[1-95]
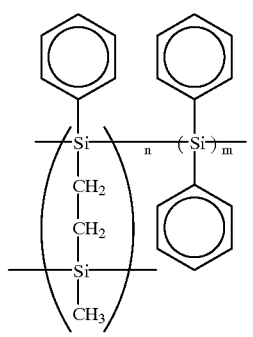
[1-96]
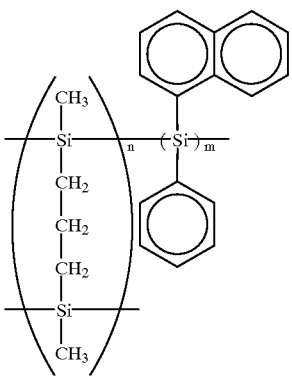
[1-97]
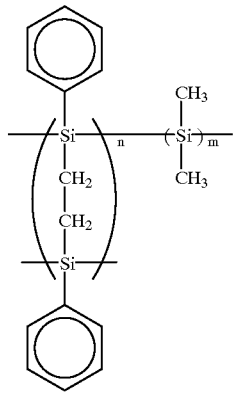
[1-98]
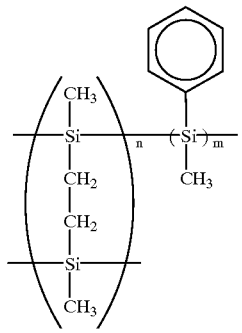
[1-99]
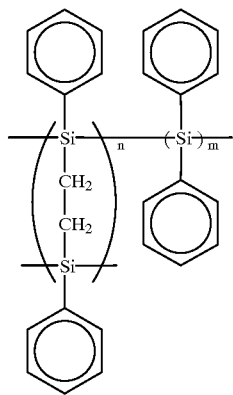

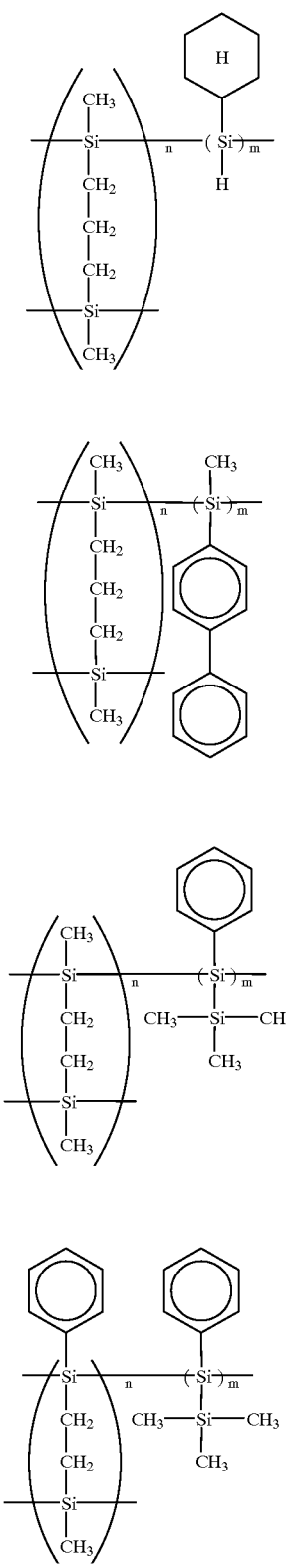
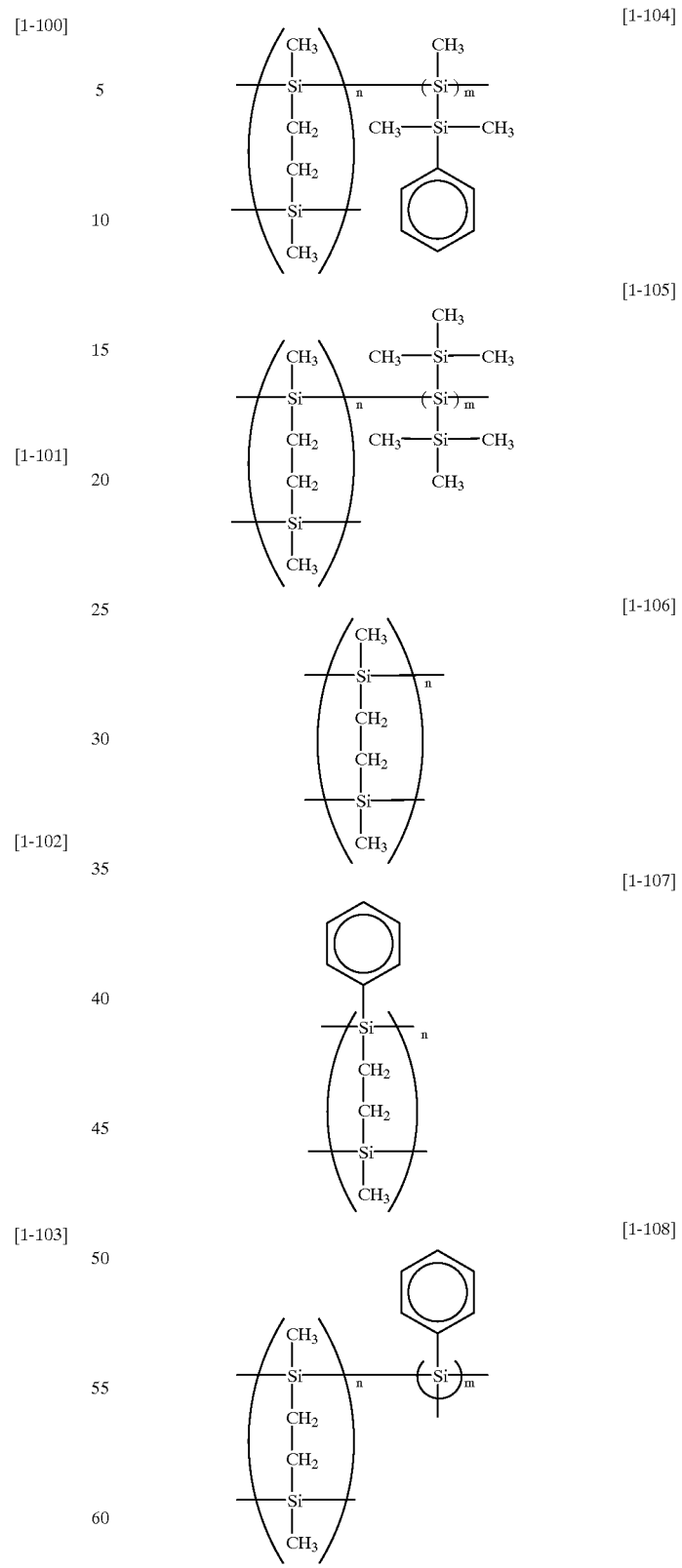

[1-109]
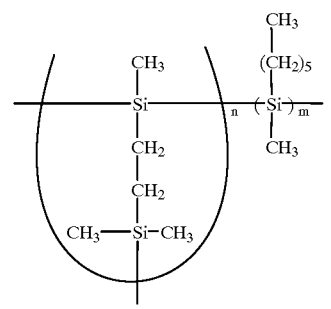

[1-110]
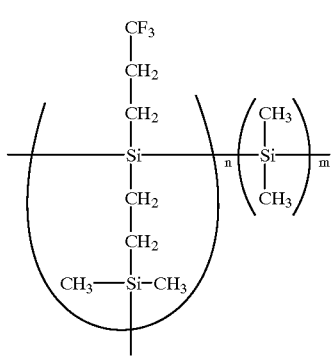

[1-111]
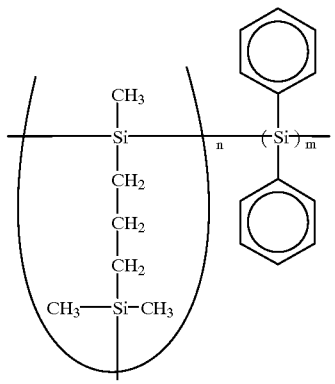

[1-112]
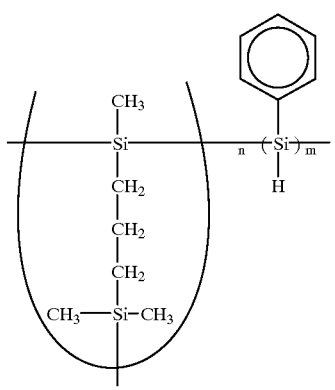

[1-113]
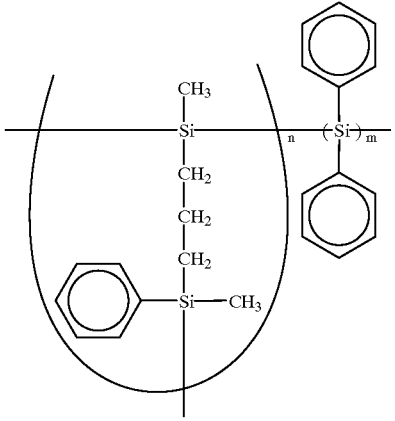

[1-114]
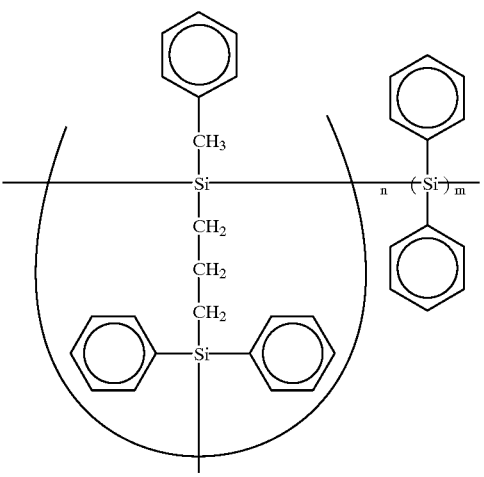

With regard to the average molecular weight of these organosilicon compounds, though there is not any particular restriction, it should preferably be in the range of from 200 to 100,000. Because if the average molecular weight thereof is less than 200, the organosilicon compound may be easily dissolved in a solvent for the resist, while if the average molecular weight thereof exceeds over 100,000, it may become difficult to dissolve the organosilicon compound in an organic solvent, thus making it difficult to prepare a solution of the organosilicon compound.

These organosilicon compounds may be employed singly or in combination of two or more kinds. If desired, a thermal polymerization inhibitor for improving the storage stability of the organosilicon compound; an adhesion improver for improving the adhesion of the organosilicon compound to a silicon-based insulating film; an ultraviolet absorbing dye for preventing the light reflected by the silicon-based insulating film from reflecting into a resist film; an ultraviolet-absorbing polymer such as polysulfone, polybenzimdazole, etc.; a conductive material for preventing a resist film from being accumulated with electric charge at the occasion of exposure using a charged beam; a substance exhibiting conductivity by the effect from light or heat; a crosslinking agent for crosslinking the organosilicon compound for providing it with solvent resistivity and heat resistivity; or a radical-generating agent for promoting the crosslinking of the organosilicon compound may be added to these organosilicon compounds.

The aforementioned conductive material may be selected from organic sulfonic acid, organic carboxylic acid, polyhydric alcohol, polyhydric thiol (such as iodide and bromide), $SbF_5$, $PF_5$, $BF_5$ and $SnF_5$. The aforementioned substance exhibiting conductivity by the effect from light or heat may be selected from a carbon cluster ($C_{60}$ and $C_{70}$), cyanoanthracene, dicyanoanthracene, triphenylpillium, tetrafluoroborate, tetracyanoquinodimethane, tetracyanoethylene, phthalimide triphenol, perchloropentacyclododecane, dicyanobenzene, benzonitrile, trichloromethyltriazine, benzoyl peroxide, benzophenone tetracarboxylic acid and t-butyl peroxide.

Specific examples of such a substance are the following compounds represented by the chemical formulas (2-1) to (2-183).

[2-1]
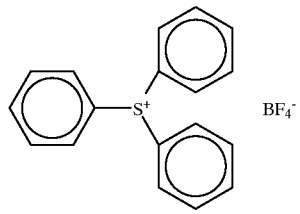

[2-2]
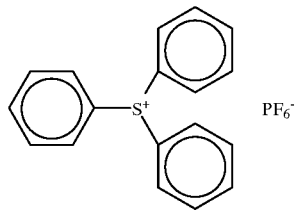

[2-3]
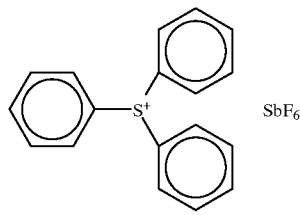

[2-4]
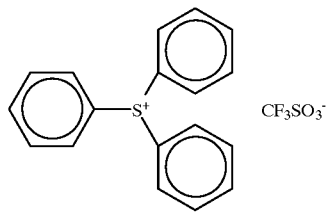

[2-5]
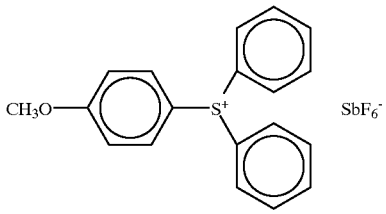

[2-6]
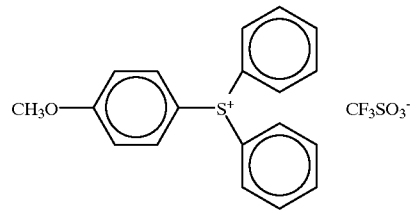

[2-7]
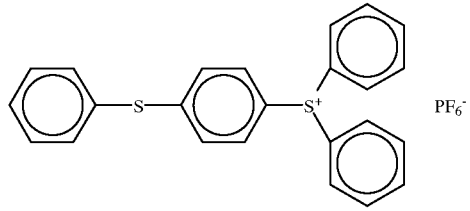

[2-8]
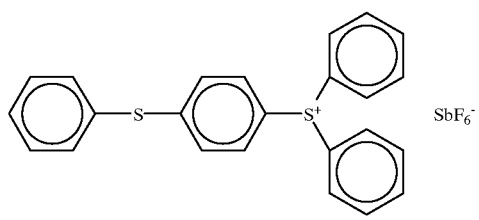

[2-9]
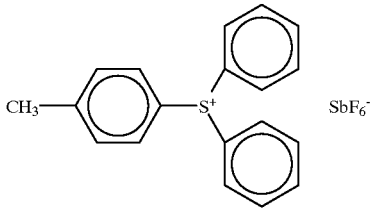

[2-10]
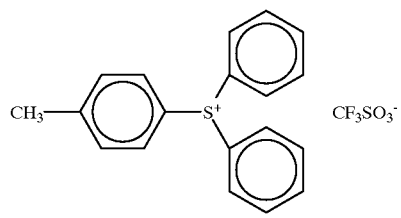

-continued
[2-11]
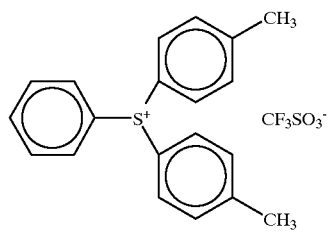 CF₃SO₃⁻
[2-12]
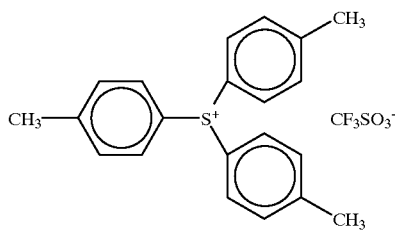 CF₃SO₃⁻
[2-13]
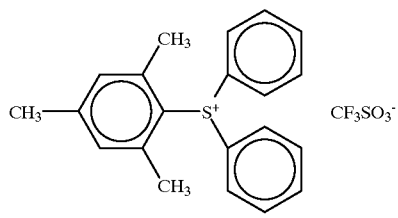 CF₃SO₃⁻
[2-14]
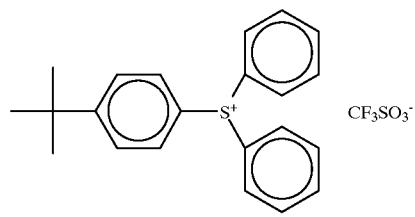 CF₃SO₃⁻
[2-15]
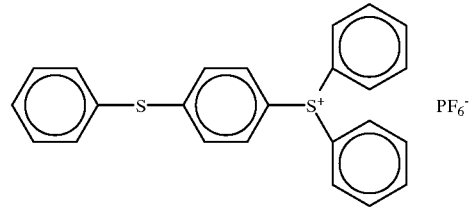 PF₆⁻
[2-16]
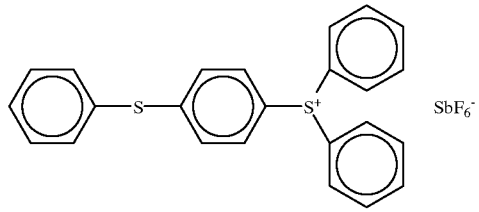 SbF₆⁻
[2-17]
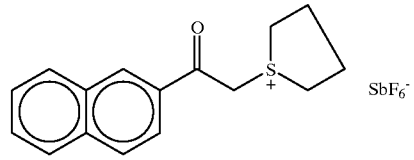 SbF₆⁻
[2-18]
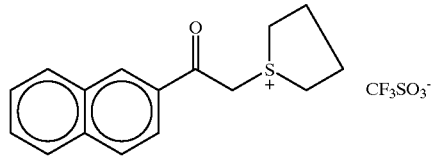 CF₃SO₃⁻
[2-19]
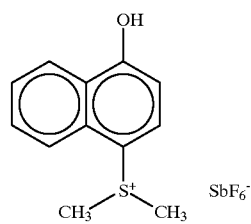 SbF₆⁻
[2-20]
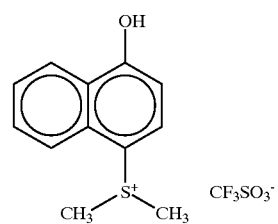 CF₃SO₃⁻
[2-21]
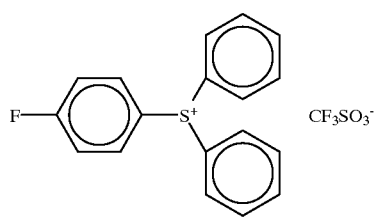 CF₃SO₃⁻
[2-22]
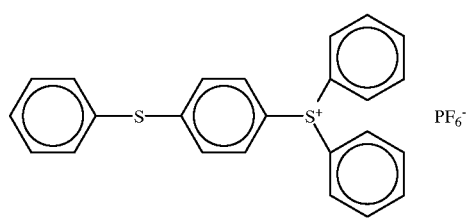 PF₆⁻
[2-23]
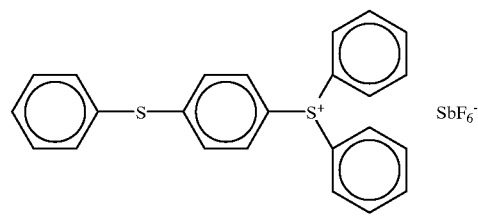 SbF₆⁻
[2-24]
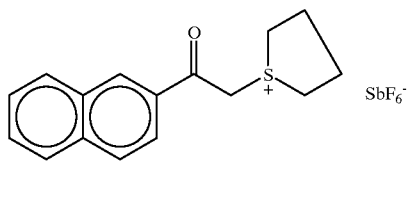 SbF₆⁻

-continued
[2-25] 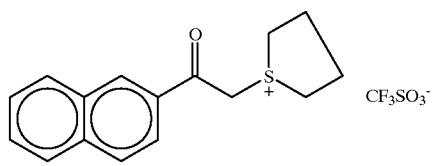
[2-26] 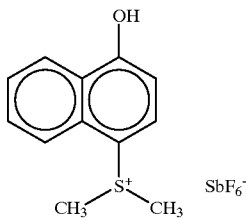
[2-27] 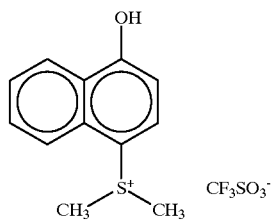
[2-28] 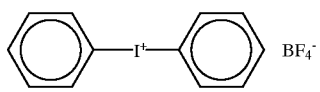
[2-29] 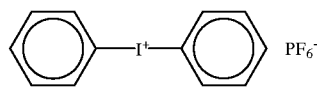
[2-30] 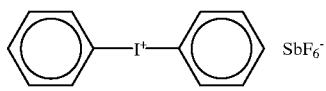
[2-31] 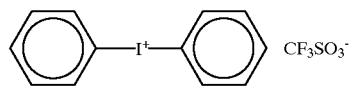
[2-32] 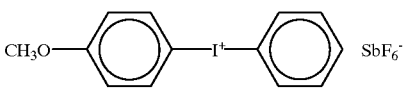
[2-33] 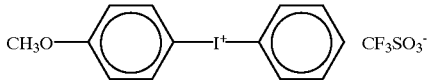
[2-34] 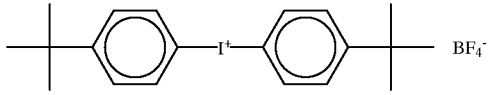
[2-35] 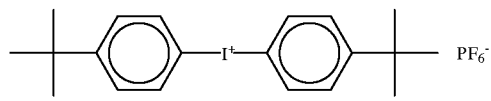
[2-36] 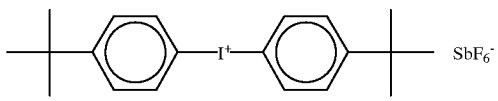
[2-37] 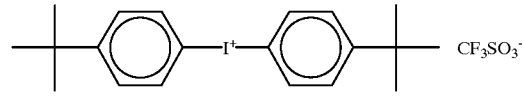
[2-38] 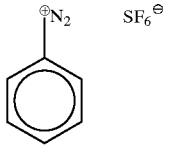
[2-39] 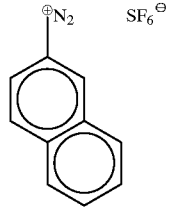
[2-40] 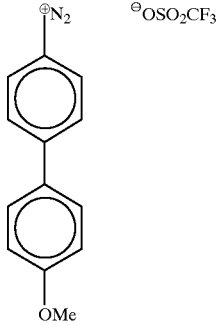

-continued
[2-41]
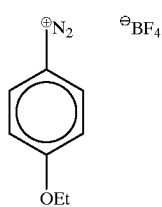
[2-42]
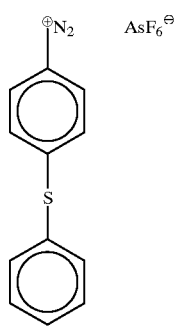
[2-43]
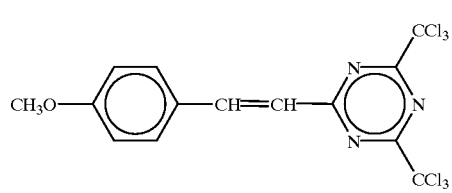
[2-44]
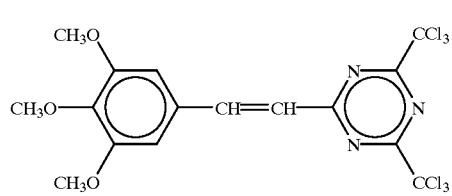
[2-45]
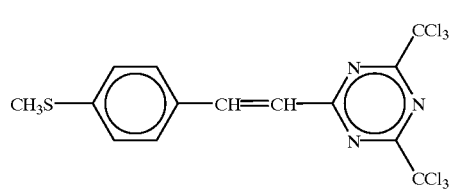
[2-46]
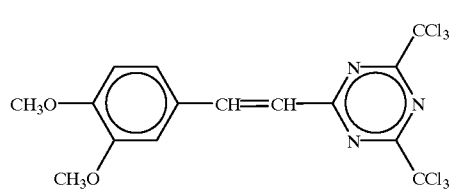
[2-47]
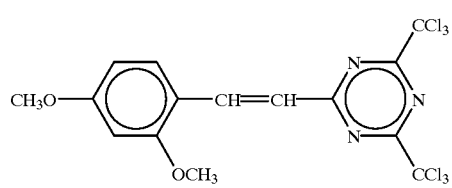
[2-48]
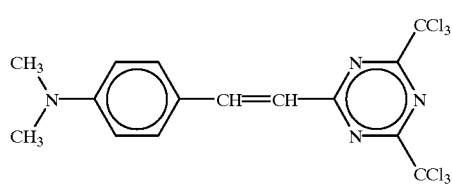
[2-49]
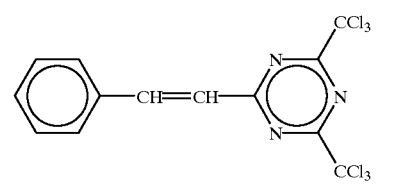
[2-50]
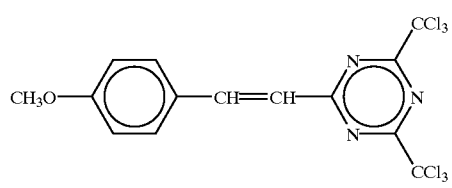
[2-51]
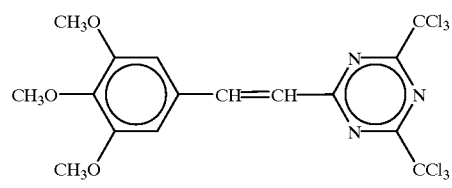
[2-52]
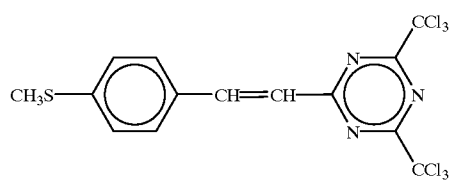
[2-53]
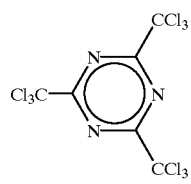
[2-54]
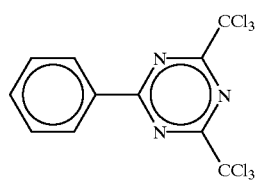

-continued
[2-55]
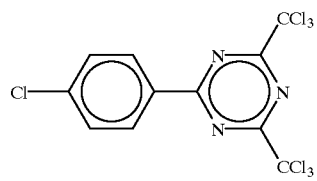
[2-56]
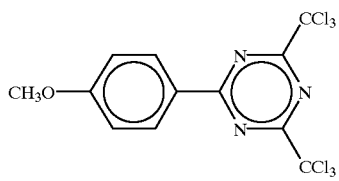
[2-57]
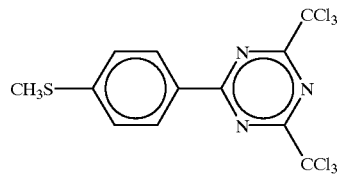
[2-58]
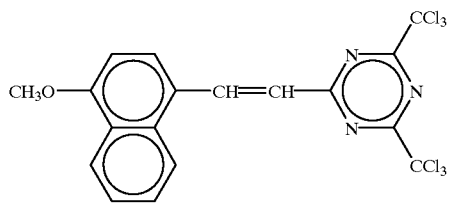
[2-59]
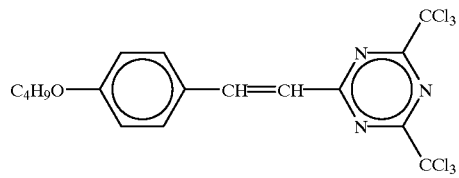
[2-60]
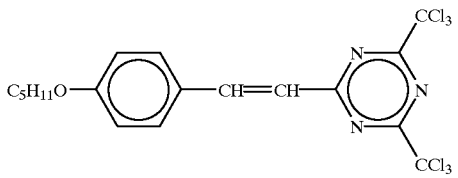
[2-61]
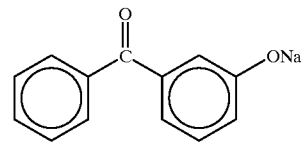
[2-62]
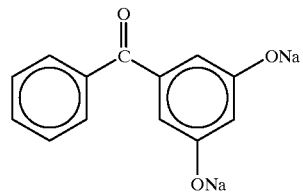
[2-63]
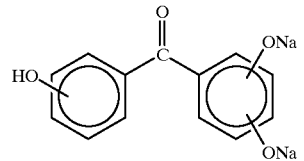
[2-64]
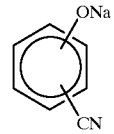
[2-65]
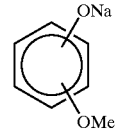
[2-66]
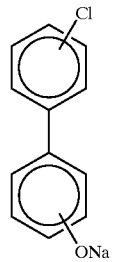
[2-67]
C$_2$H$_5$ONa
[2-68]
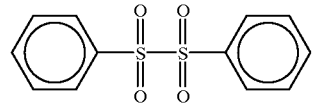
[2-69]
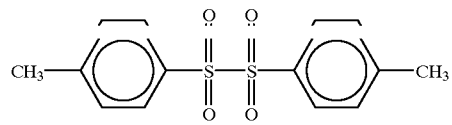
[2-70]
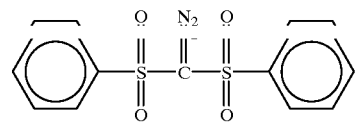

-continued

-continued
[2-89]
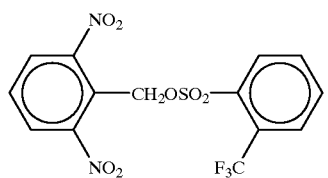
[2-90]
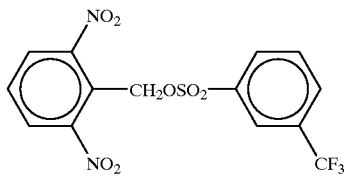
[2-91]
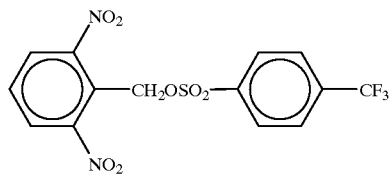
[2-92]
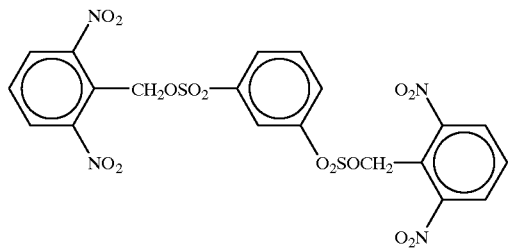
[2-93]
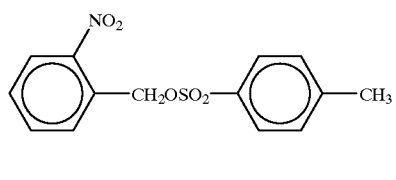
[2-94]
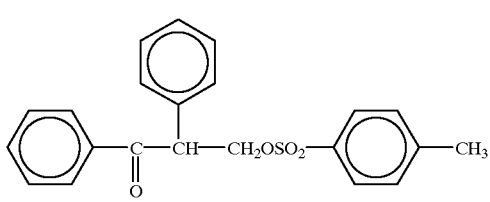
[2-95]
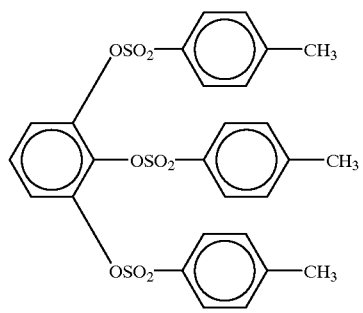
[2-96]
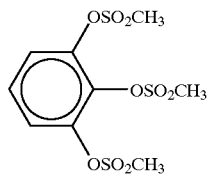
[2-97]
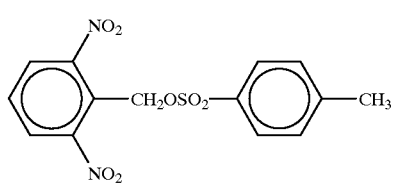
[2-98]
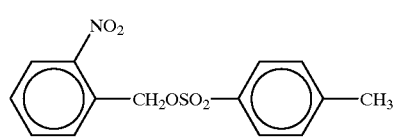
[2-99]
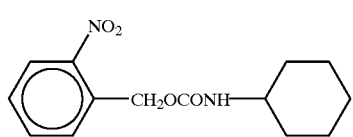
[2-100]
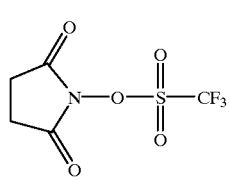
[2-101]
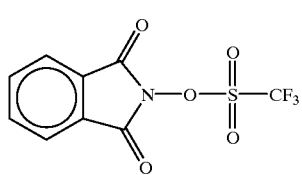
[2-102]
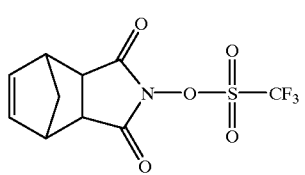

[2-103]
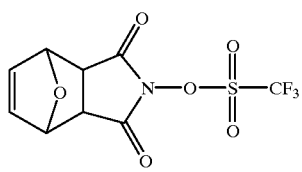
[2-104]
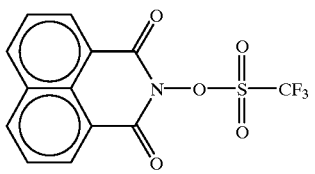
[2-105]
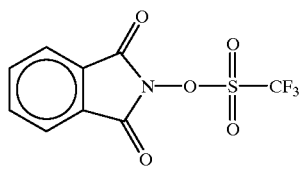
[2-106]
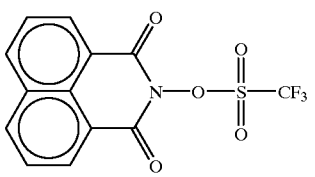
[2-107]
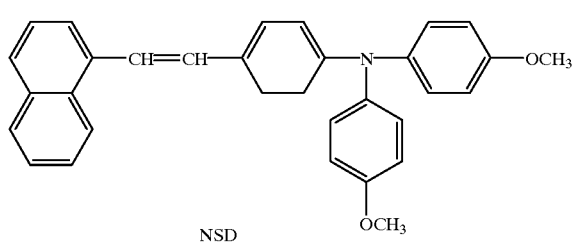
NSD
[2-108]
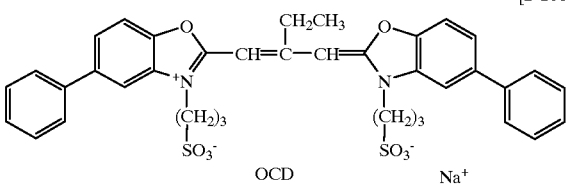
OCD
[2-109]
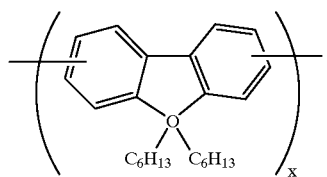
[2-110]
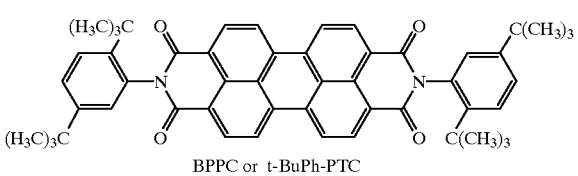
BPPC or t-BuPh-PTC
[2-111]
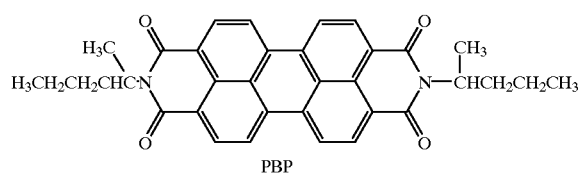
PBP
[2-112]
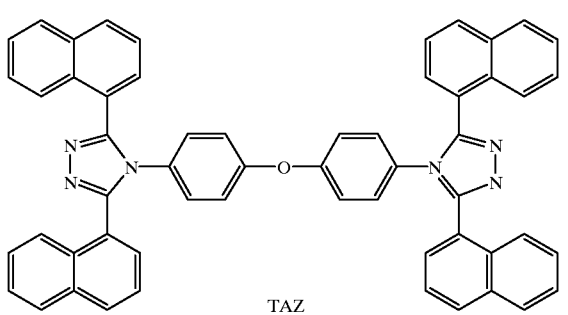
TAZ
[2-113]
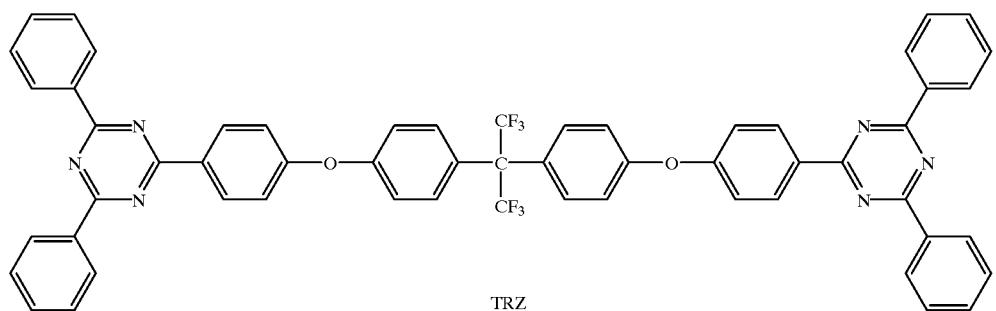
TRZ -continued
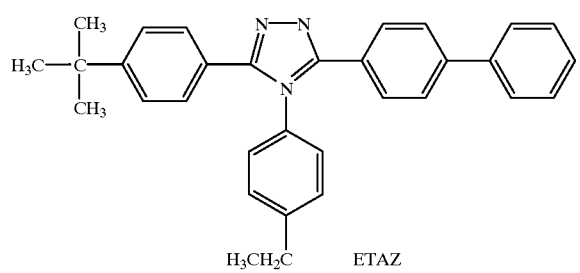
ETAZ
[2-114]
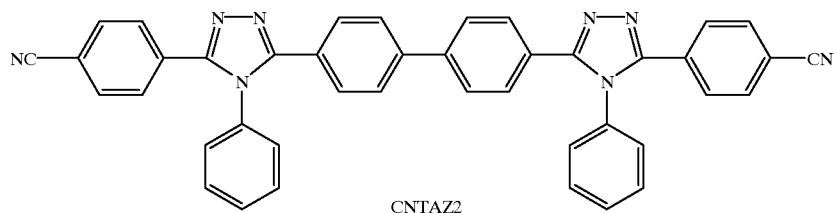
CNTAZ2
[2-115]
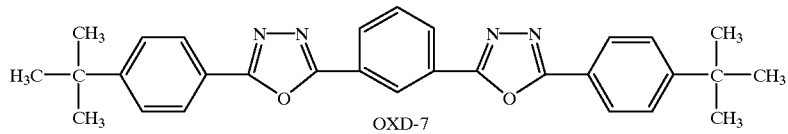
OXD-7
[2-116]
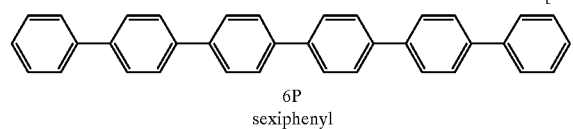
6P
sexiphenyl
[2-117]
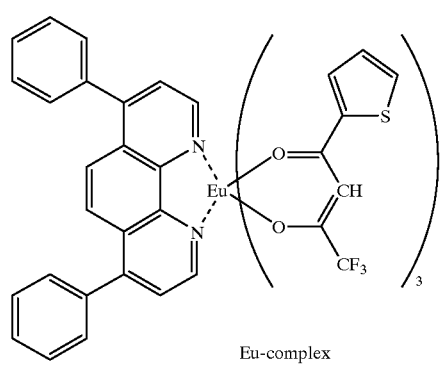
Eu-complex
[2-118]
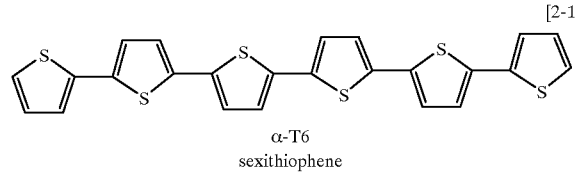
α-T6
sexithiophene
[2-119]
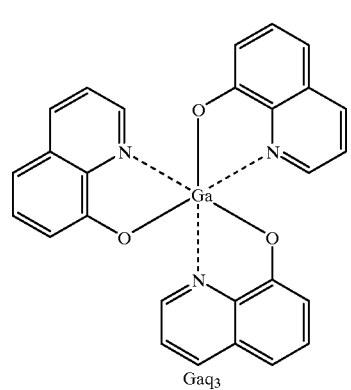
Gaq₃
[2-120]

-continued
[2-121]
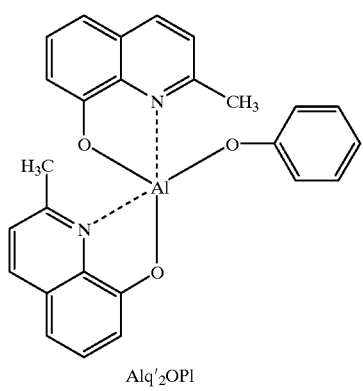
Alq'₂OPl
[2-122]
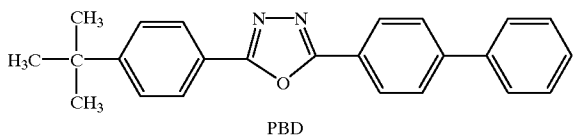
PBD
[2-123]
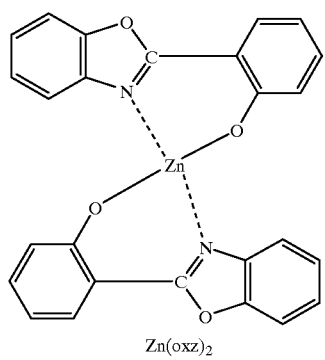
Zn(oxz)₂
[2-124]
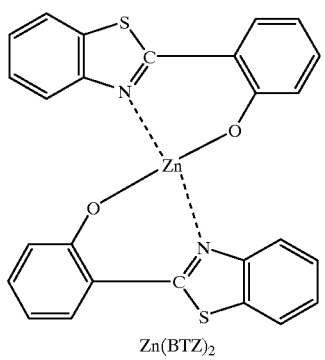
Zn(BTZ)₂
[2-125]
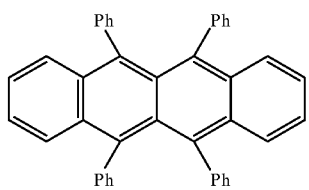
[2-126]
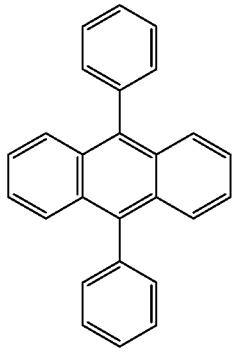
[2-127]
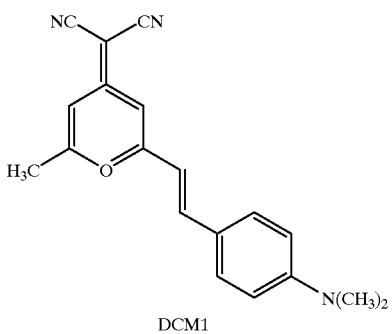
DCM1
[2-128]
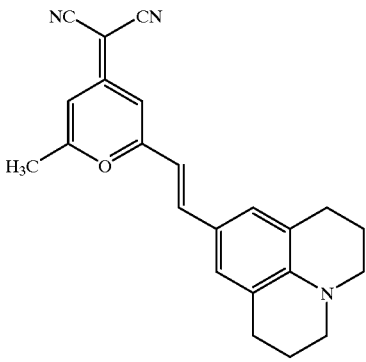
DCM2

-continued
[2-129]
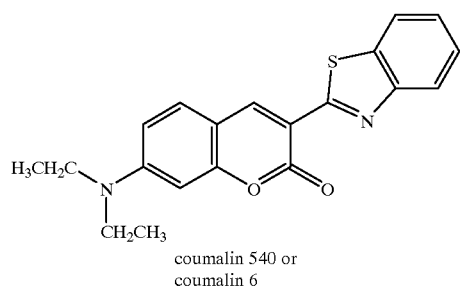
coumalin 540 or
coumalin 6
[2-130]
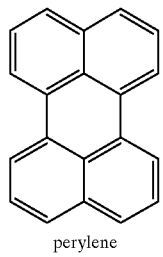
perylene
[2-131]
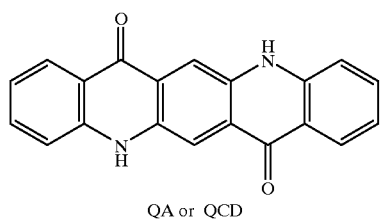
QA or QCD
[2-132]
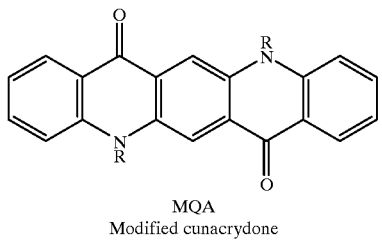
MQA
Modified cunacrydone
[2-133]
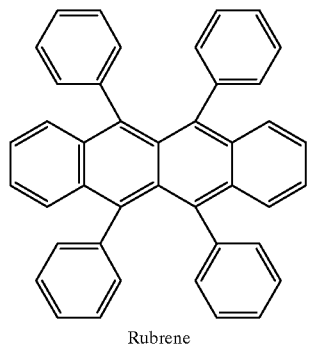
Rubrene
[2-134]
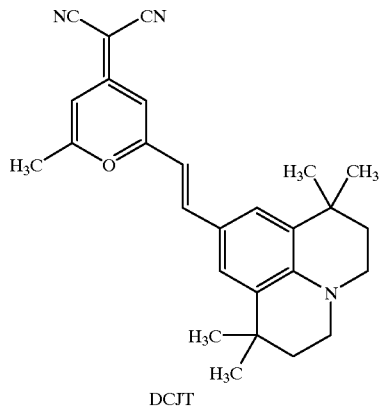
DCJT
[2-135]
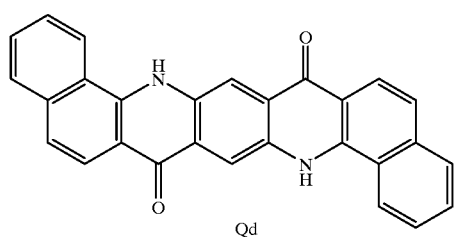
Qd
[2-136]
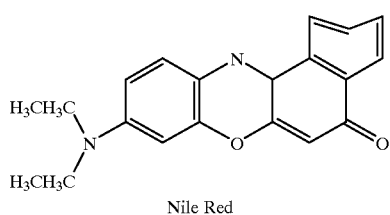
Nile Red
[2-137]
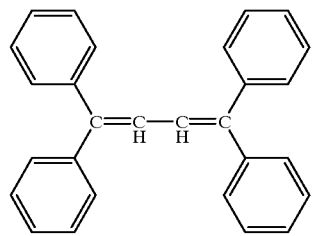
[2-138]
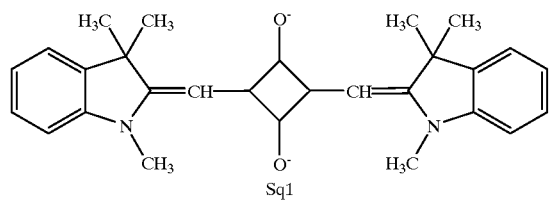
Sq1

-continued
[2-139]
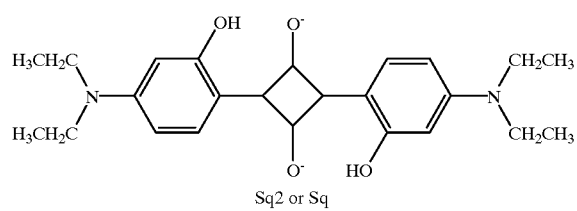
Sq2 or Sq
[2-140]
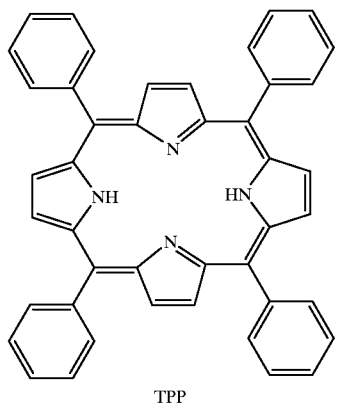
TPP
[2-141]
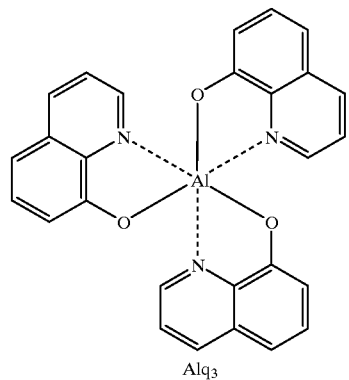
Alq$_3$
[2-142]
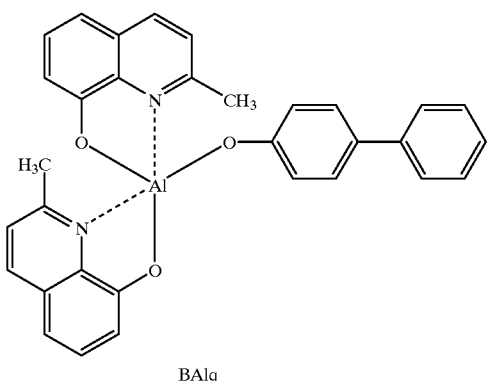
BAlq
[2-143]
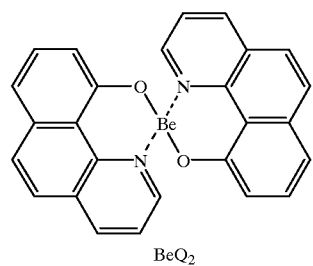
BeQ$_2$
[2-144]
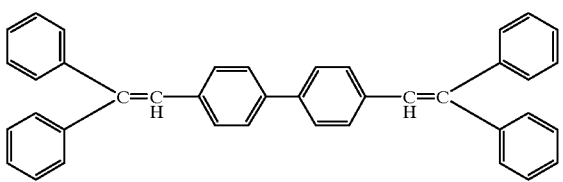
DPVBi
[2-145]
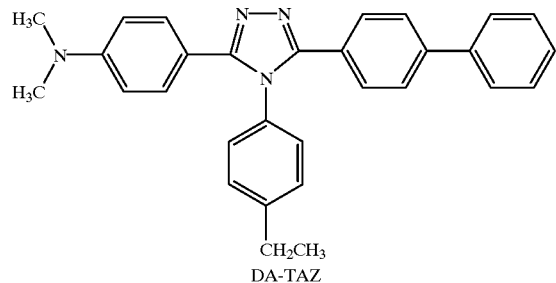
DA-TAZ
[2-146]
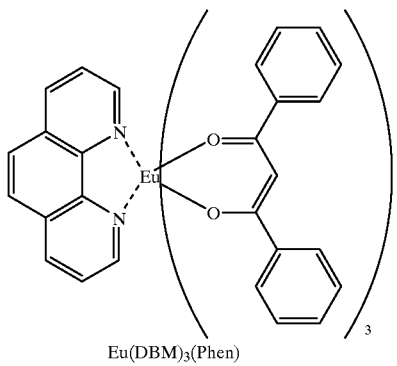
Eu(DBM)$_3$(Phen)

[2-147]
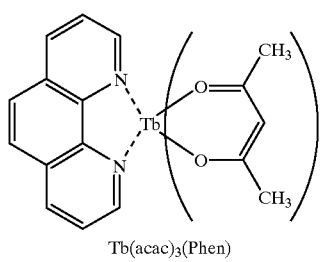
Tb(acac)₃(Phen)
[2-148]
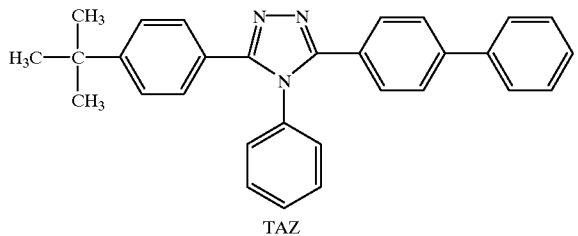
TAZ
[2-149]
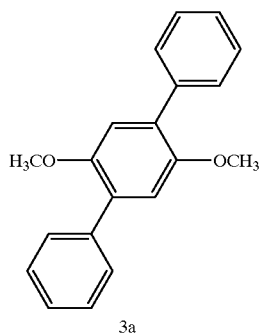
3a
[2-150]
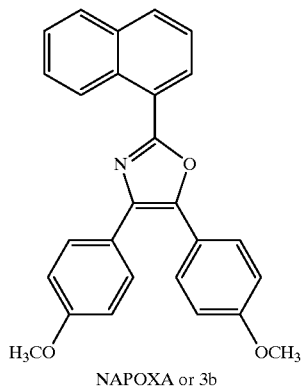
NAPOXA or 3b
[2-151]
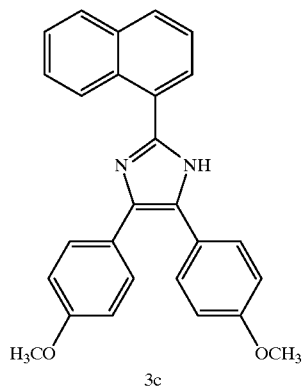
3c
[2-152]
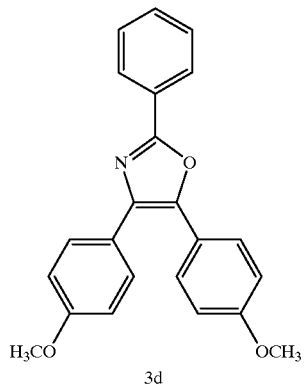
3d
[2-153]
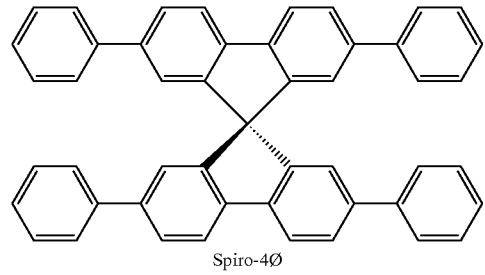
Spiro-4Ø
[2-154]
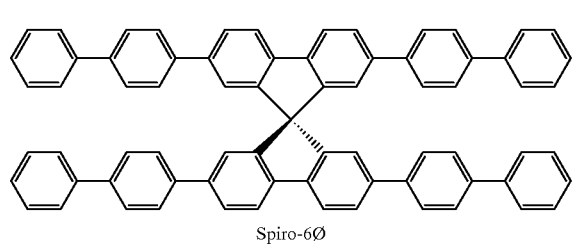
Spiro-6Ø

[2-155]
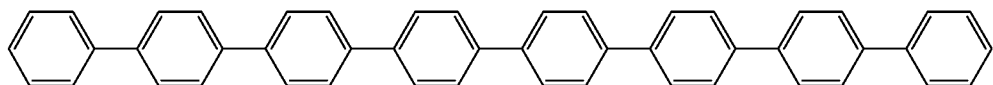
Spiro-8Ø
[2-156]
Spiro-10Ø
[2-157]
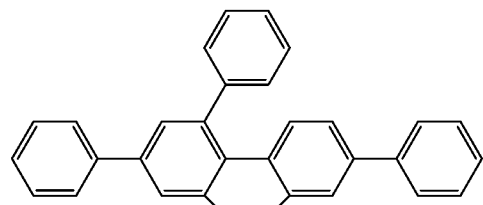
Octo-1
[2-158]
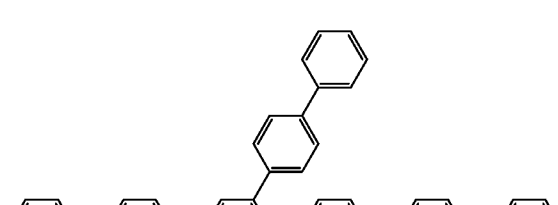
[2-159]
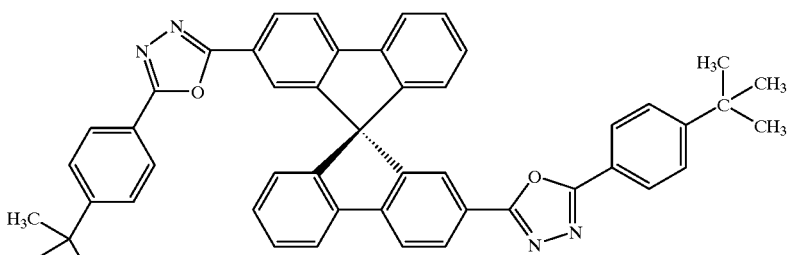
Spiro-PBD
[2-160]
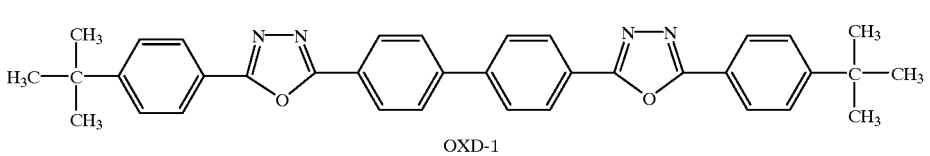
OXD-1

-continued
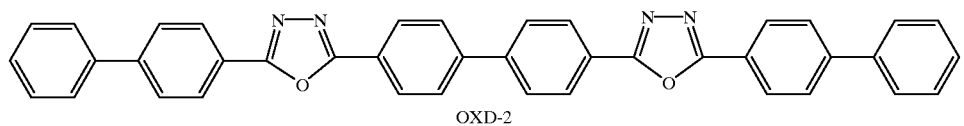
OXD-2
[2-161]
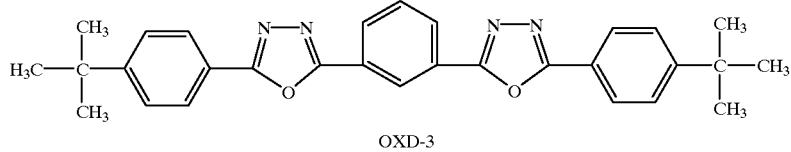
OXD-3
[2-162]
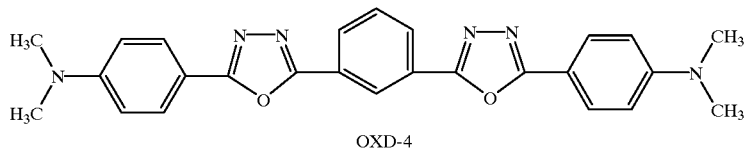
OXD-4
[2-163]
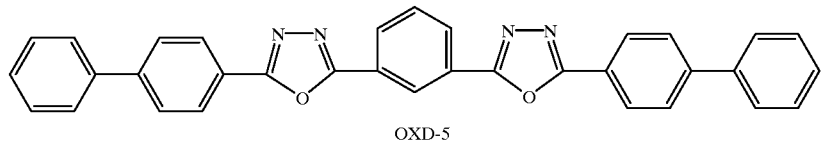
OXD-5
[2-164]
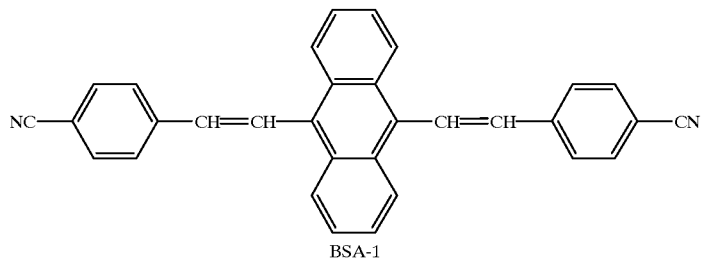
BSA-1
[2-165]
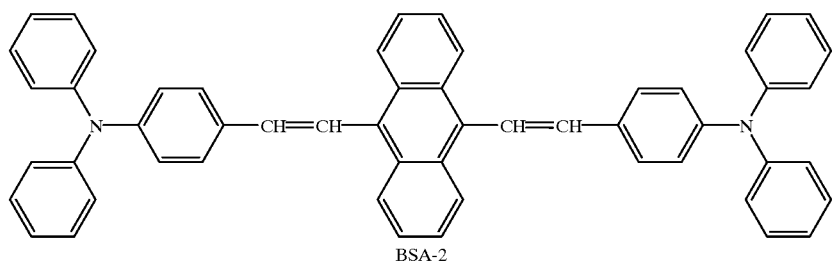
BSA-2
[2-166]
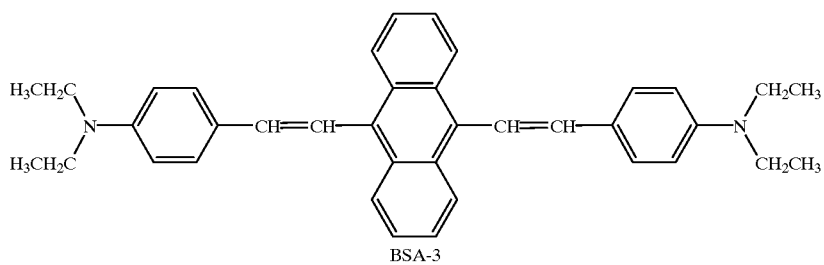
BSA-3
[2-167]

-continued
[2-168]
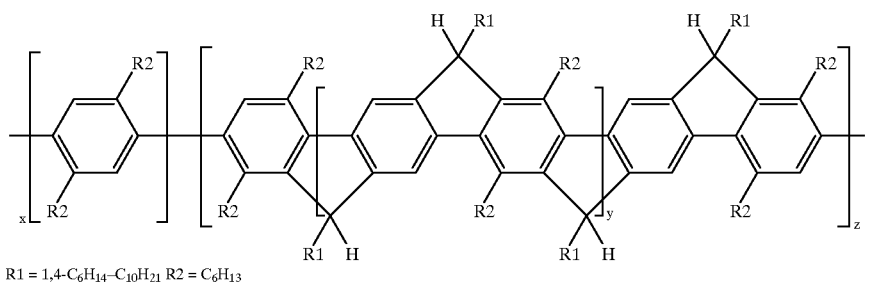
R1 = 1,4-C$_6$H$_{14}$–C$_{10}$H$_{21}$   R2 = C$_6$H$_{13}$
[2-169]
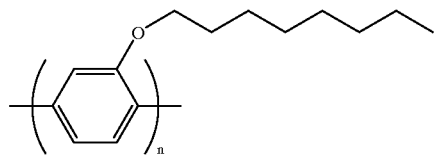
[2-170]
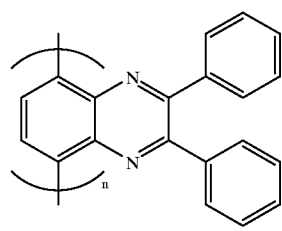
[2-171]
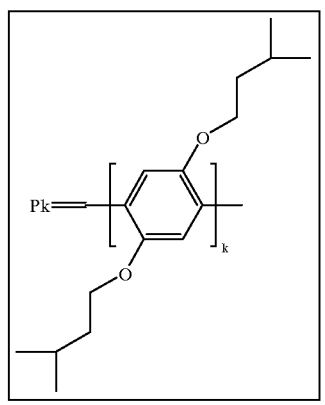
[2-172]
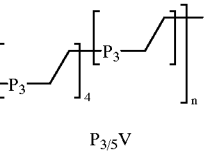
P$_{3/5}$V
[2-173]
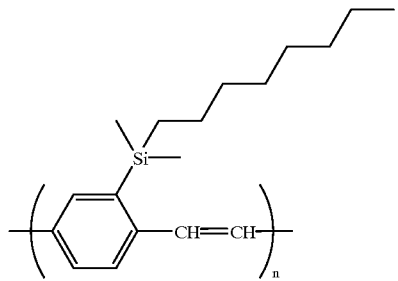
[2-174]
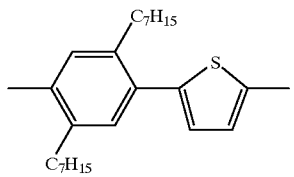
[2-175]
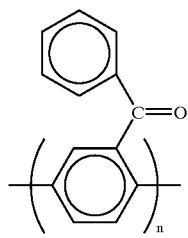
[2-176]
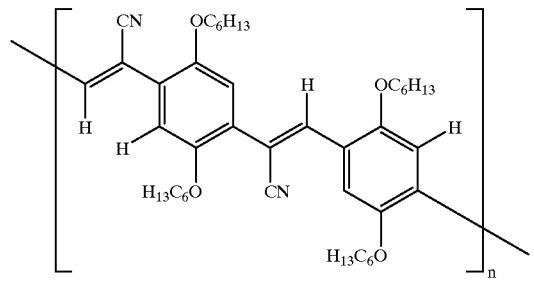

[2-177]
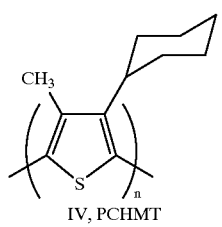
IV, PCHMT

[2-178]
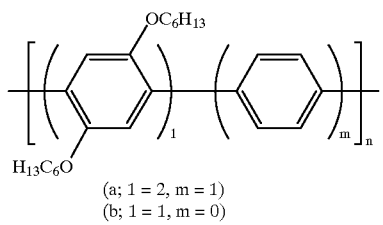
(a; l = 2, m = 1)
(b; l = 1, m = 0)

[2-179]
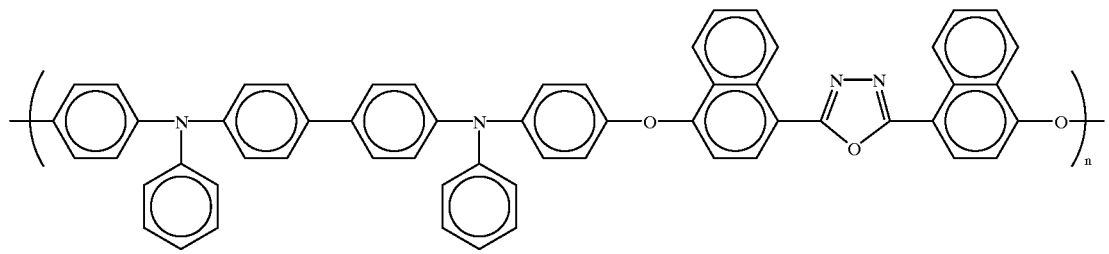

[2-180]
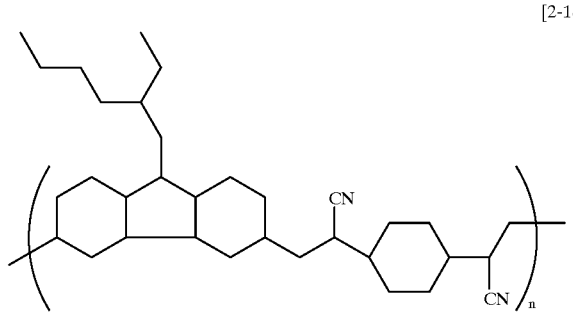

[2-181]
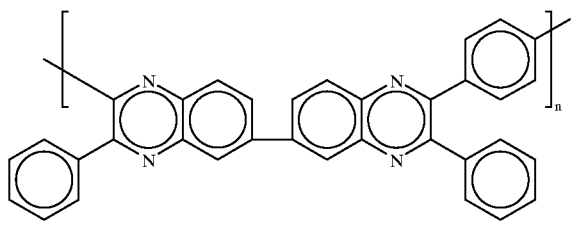

[2-182]
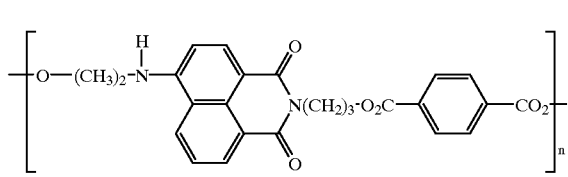

[2-183]
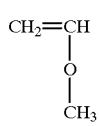

If the aforementioned crosslinking agent is to be added to these organosilicon compounds, the organosilicon compounds should preferably be selected from those having hydrogen atom bonded to silicon atom constituting the backbone chain of the organosilicon compounds.

As for the crosslinking agent, an organic substance having a multiple bond may be employed. By the organic substance having a multiple bonds, it is meant a compound having a double bond or triple bond, more specifically a compound having vinyl, acryl, aryl or acetylenyl group. This organic substance having a multiple bond may be a monomer, oligomer or polymer.

This organic substance having a multiple bond functions, by the effect of heat or light, to bring about an addition reaction between the organic substance and the Si—H bond of the organosilicon compound, thereby crosslinking the organosilicon compound. The organic substance having a multiple bond may be in a state of self-polymerization. Following chemical formulas (3-1) to (3-88) are specific examples of the organic substance having a multiple bond.

[3-1]
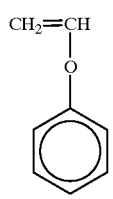

[3-2]
$CH_2=CH$
$|$
$O$
$|$
$CH_3$

-continued
[3-3]
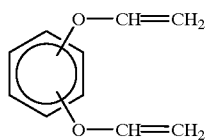
[3-4]
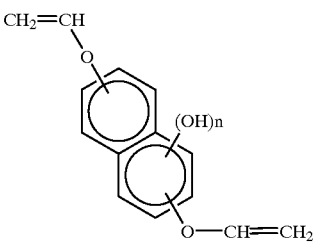
[3-5]
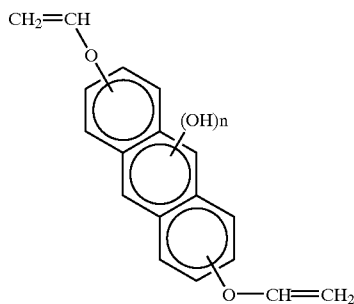
[3-6]
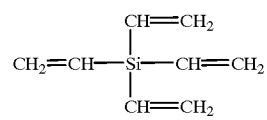
[3-7]
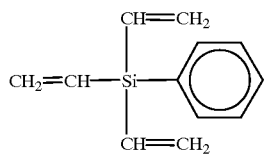
[3-8]
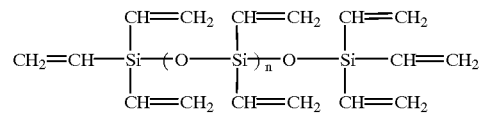
[3-9]
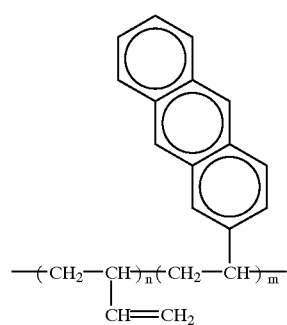
[3-10]
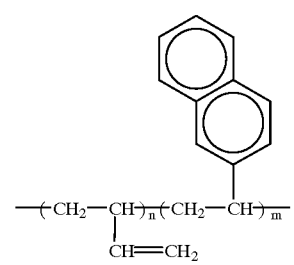
[3-11]
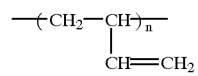
[3-12]
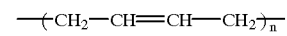
[3-13]
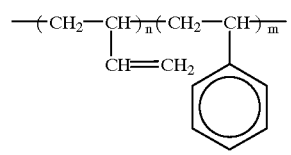
[3-14]
$CH_2=CHCOOCH_2CH(CH_3)_2$
[3-15]
$CH_2=CHCOOC(CH_3)_3$
[3-16]
$CH_2=CHCOOC_{12}H_{25}$
[3-17]
$CH_2=CHCOOC_nH_{2n+1}$
(n = 12, 13)
[3-18]
$CH_2=CHCOOC_{16}H_{33}$
[3-19]
$CH_2=CHCOOC_{18}H_{37}$
[3-20]
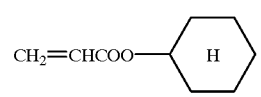

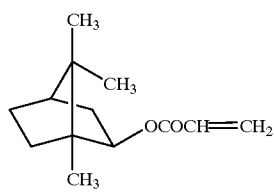
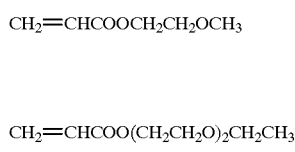
CH₂=CHCOO(CH₂CH₂O)₂CH₂CH₃
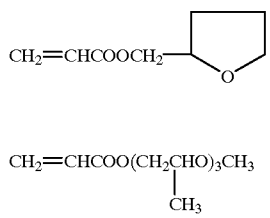
CH₂=CHCOO(CH₂CHO)₃CH₃
                    |
                    CH₃
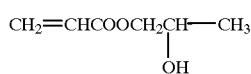
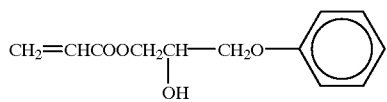
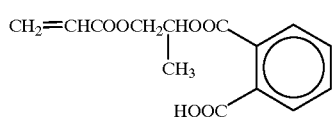
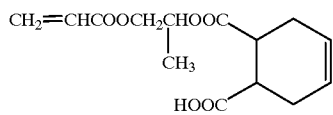
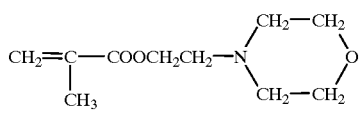
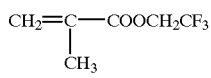
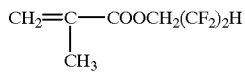
[3-21]
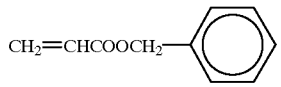
[3-22]
[3-23]
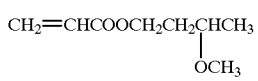
[3-24]
[3-25]
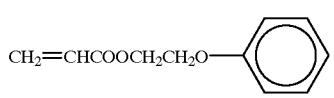
[3-26]
[3-27]
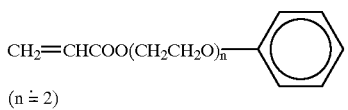
(n ≒ 2)
[3-28]
[3-29]
CH₂=CHCOOCH₂CH₂OH
[3-30]
[3-31]
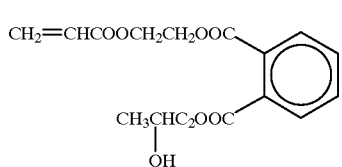
[3-32]
[3-33]
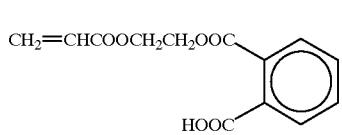
[3-34]
[3-35]
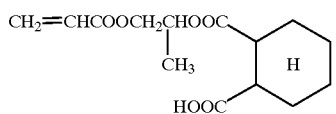
[3-36]
[3-37]
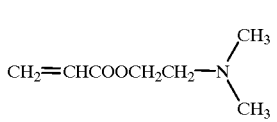
[3-38]
[3-39]
CH₂=CHCOOCH₂CF₃
[3-40]
[3-41]
CH₂=CHCOOCH₂(CF₂)₂H
[3-42]
[3-43]
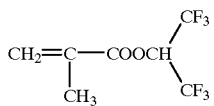
[3-44]

  [3-45]
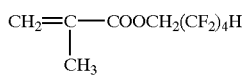  [3-46]
  [3-47]
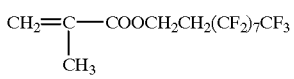  [3-48]
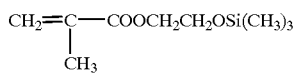  [3-49]
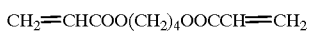  [3-50]
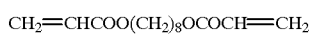  [3-51]
  [3-52]
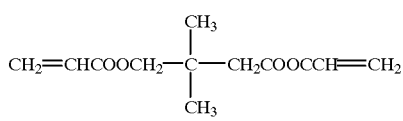  [3-53]
  [3-54]
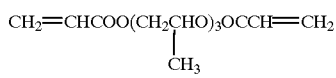  [3-55]
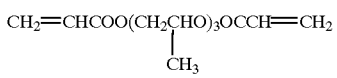  [3-56]
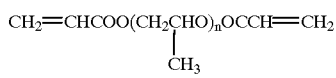  [3-57]
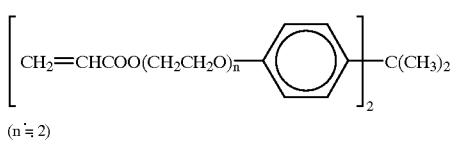  [3-58]
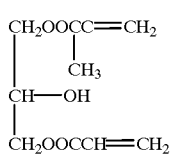  [3-59]
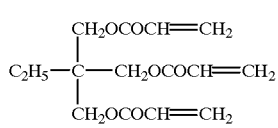  [3-60]
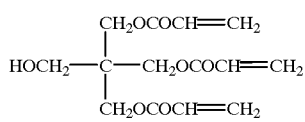  [3-61]
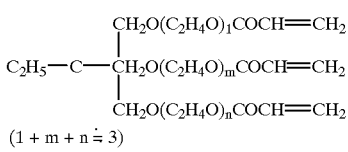  [3-62]
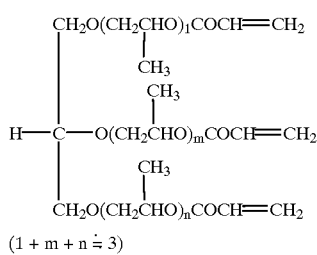  [3-63]
  [3-64]
$(CH_2=CHCOOCH_2CH_2O)_3PO$ -continued
[3-65]
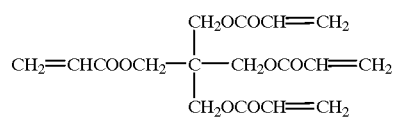
[3-66]
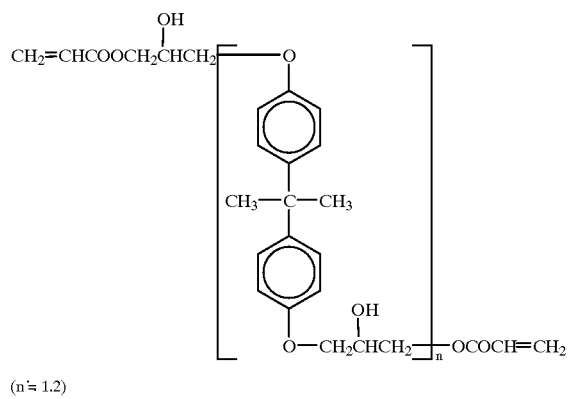
(n = 1.2)
[3-67]
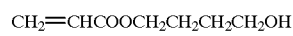
[3-68]
[3-69]
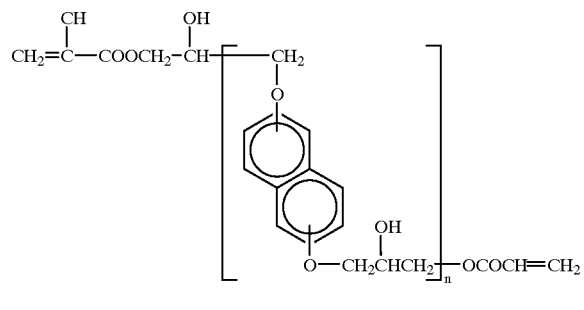
[3-70]
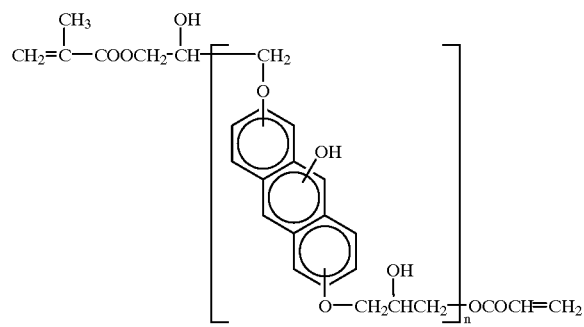
[3-71]
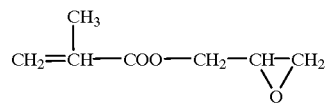
[3-72]
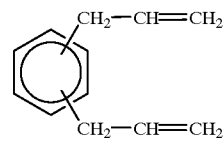
[3-73]
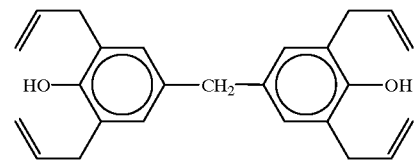
[3-74]
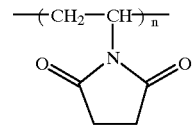
[3-75]
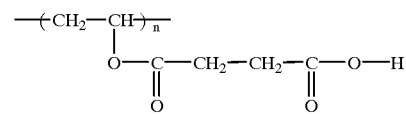
[3-76]
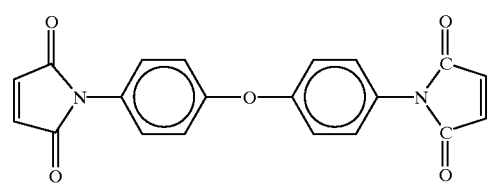
[3-77]
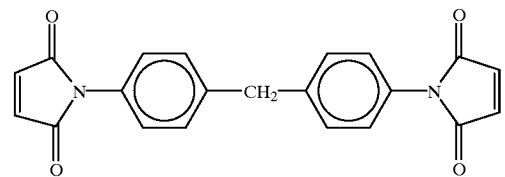
[3-78]
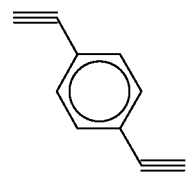

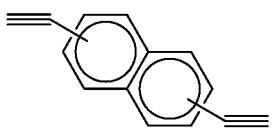 [3-79]

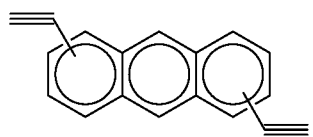 [3-80]

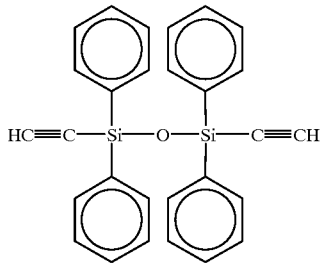 [3-81]

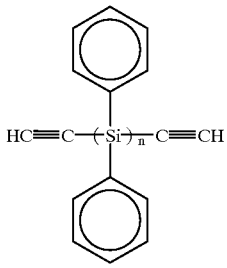 [3-82]

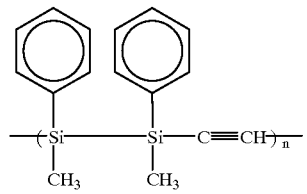 [3-83]

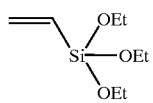 [3-84]

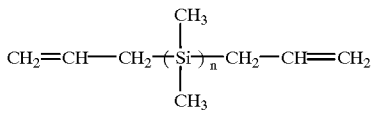 [3-85]

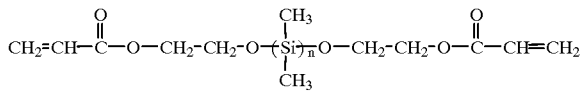 [3-86]

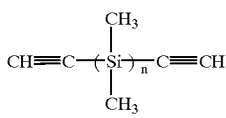 [3-87]

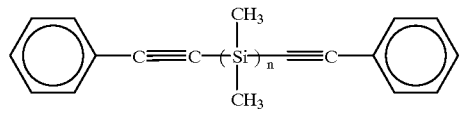 [3-88]

When an organic substance having a multiple bond is added to an organosilicon polymer as mentioned above, a radical-generating agent or an oxygen-generating agent may also be added as a catalyst to the organosilicon polymer. Any of these radical-generating agent and oxygen-generating agent function to assist the addition reaction between the organic substance having a multiple bond and the Si—H bond of the organosilicon compound or to promote the self-polymerization of the organosilicon compound.

The radical-generating agent may be selected from an azo compound (for example, azobisisobutyronitrile), a peroxide, alkylaryl ketone, silyl peroxide and an organic halogen compound. The radical-generating agent is designed to generate radicals through the decomposition of O—O bond or C—C bond in the molecule thereof by the effect of light irradiation or heat. Specific examples of such a radical-generating agent are the following compounds represented by the chemical formulas (4-1) to (4-24):

| | |
|---|---|
| Benzoyl peroxide | (4-1) |
| Di-tertiary butyl peroxide | (4-2) |

-continued

| | |
|---|---|
| Benzoin | (4-3) |
| Benzoin alkylether | (4-4) |
| Benzoin alkylaryl thioether | (4-5) |
| Benzoyl arylether | (4-6) |
| Benzyl alkylaryl thioether | (4-7) |
| Benzyl aralkyl ethanol | (4-8) |
| Phenyl glyoxalalkyl acetal | (4-9) |
| Benzoyl oxime | (4-10) |
| triphenyl-t-butylsilyl peroxide | (4-11) |

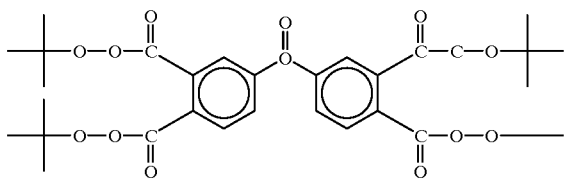 [4-12]

[4-13]
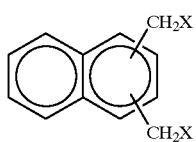

[4-14]
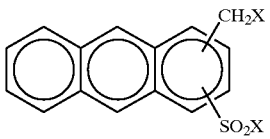

[4-15]
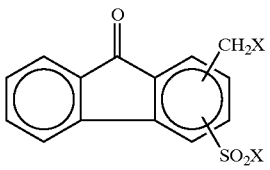

[4-16]
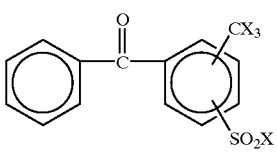

[4-17]
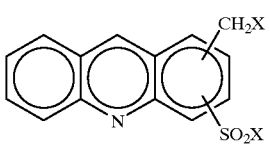

[4-18]
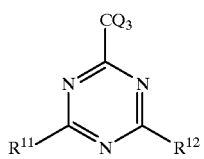

[4-19]
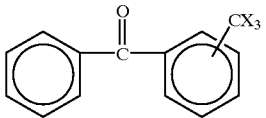

[4-20]
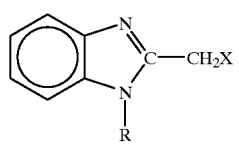

[4-21]
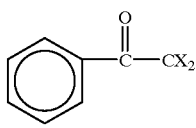

[4-22]
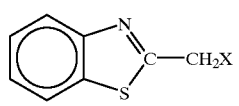

[4-23]
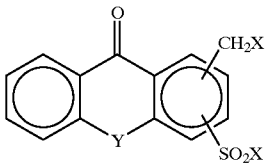

[4-24]
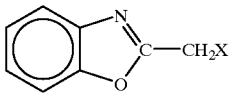

(Y = O, $CH_2$, CHX, S, C = O; X = Cl, Br, I)

As for the organic halide useful as a radical-generating agent, trihalomethyl-s-triazine represented by the general formula (4-18) (for example, U.S. Pat. No. 3,779,778) is preferable. In the general formula (4-18), Q is bromine or chlorine; $R^{11}$ is —$CQ_3$, —$NH_2$, —$NHR^{13}$, —$N(R^{13})_2$, —$OR^{13}$ or a substituted or unsubstituted phenyl group; and $R^{12}$ is —$CQ_3$, —$NH_2$, —$NHR^{13}$, —$N(R^{13})_2$, —$OR^{13}$, —(CH=CH)$_n$—W, or a substituted or unsubstituted phenyl group (herein $R^{13}$ is phenyl, naphthyl or lower alkyl group having not more than 6 carbon atoms; n is an integer of 1 to 3; and W is an aromatic ring, a heterocyclic ring or a group represented by the following general formula). Under some circumstances, these compounds are capable of effecting the crosslinking of polysilane under the influence of light or heat without accompanying the presence of the compound having a multiple bond.

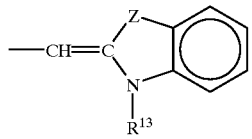

wherein Z is oxygen or sulfur; $R^{14}$ is a lower alkyl or phenyl group.

Among trihalomethyl-s-triazine represented by the general formula (4-18), a compound having a group of —(CH=CH)$_n$—W as $R^{12}$, i.e. vinyltrihalomethyl-s-triazine (for example, U.S. Pat. No. 3,987,037) is preferable. Vinyltrihalomethyl-s-triazine is featured in that it contains trihalomethyl group and ethylenic unsaturated bond to be conjugated with a triazine ring, and can be decomposed by the irradiation of light.

By the way, the aromatic ring or heterocyclic ring represented by the aforementioned W may contain a substituent group such as chlorine, bromine, phenyl group, a lower alkyl group having not more than 6 carbon atoms, nitro group, phenoxy group, alkoxyl group, acetoxy group, acetyl group, amino group and alkylamino group.

Specific examples of trihalomethyl-s-triazine represented by the general formula (4-18) are shown in the following general formulas (4-25) to (4-34), and other kinds of radical-generating agents are shown in the following general formulas (4-35) to (4-39). Under some circumstances, these halides are capable of effecting the crosslinking of polysilane under the influence of light or heat without accompanying the presence of the compound having a multiple bond.

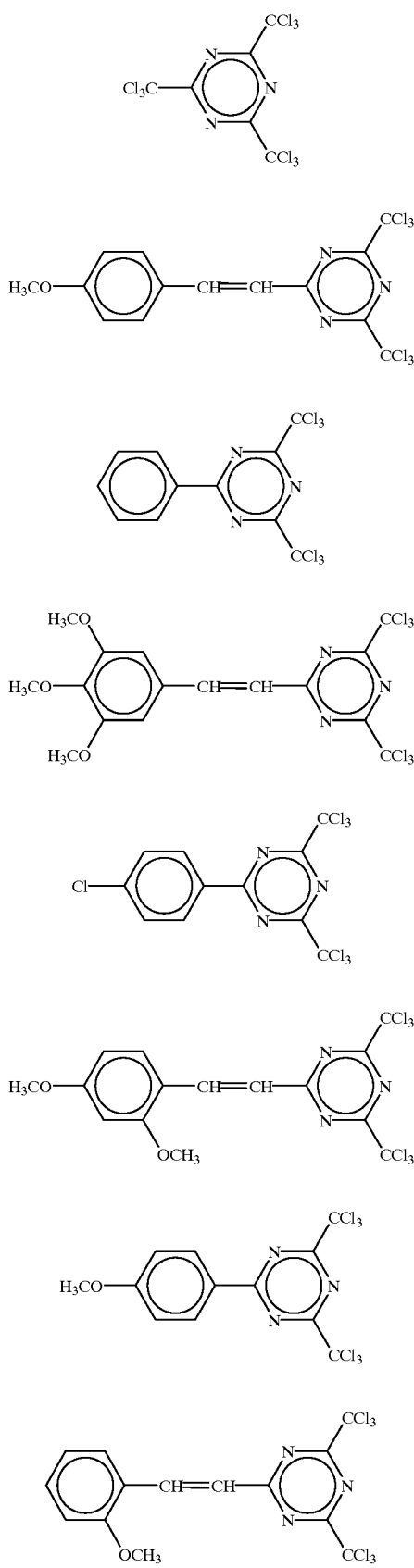
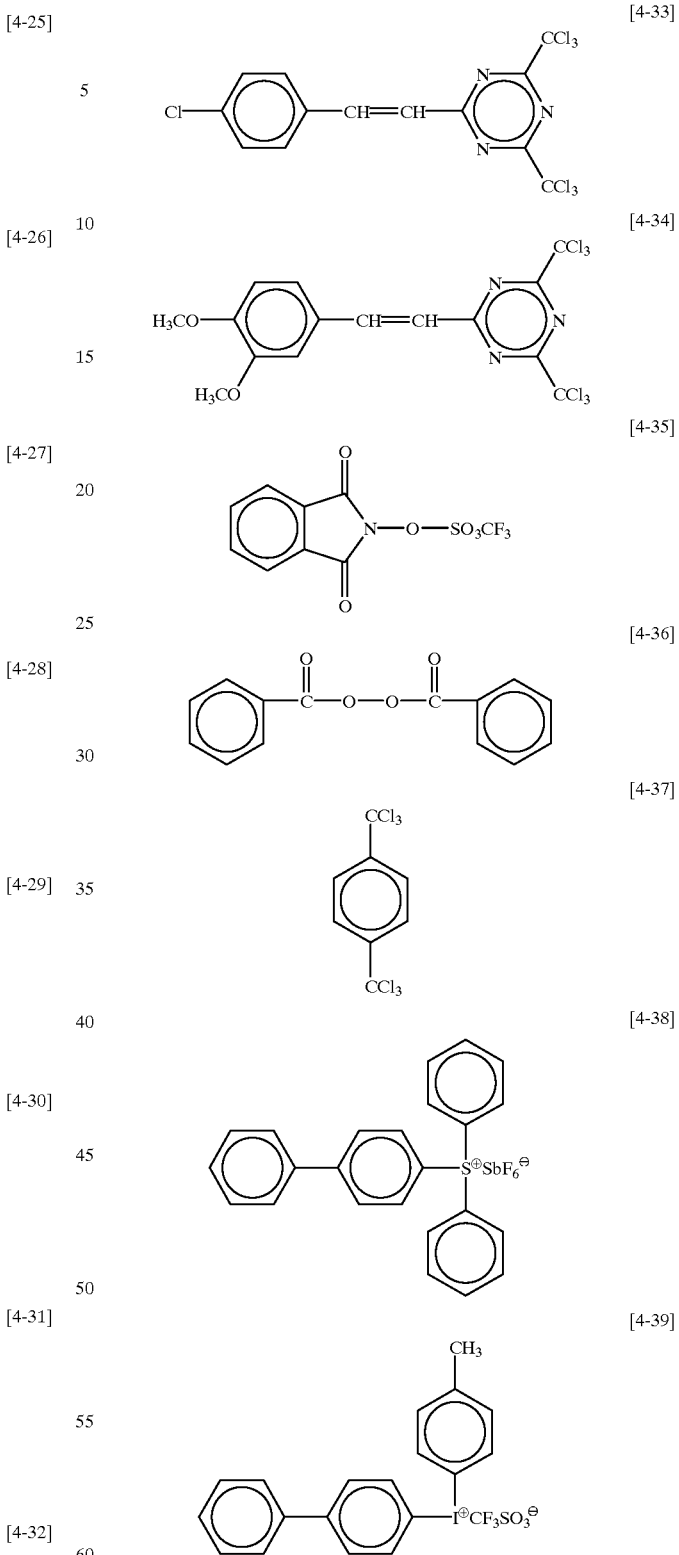
Examples of the acid-generating agent useful in this case are an onium salt, a halogen-containing compound, an orthoquinodiazide compound, a sulfone compound, sulfonic acid compound and nitrobenzyl compound. Among them, an onium salt and an orthoquinodiazide compound are preferable.

Specific examples of onium salt are iodonium salt, sulfonium salt, phosphonium salt, diazonium salt and ammonium salt. Preferable examples of onium salt are the compounds represented by the following general formulas (4-40) to (4-42).

Specific examples of the halogen-containing compound are a haloalkyl-containing hydrocarbon compound and a haloalkyl-containing heterocyclic compound. Preferable examples of the halogen-containing compound are the compounds represented by the following general formulas (4-43) and (4-44).

Specific examples of the orthoquinodiazide compound are a diazobenzoquinone compound and a diazonaphthoquinone compound. Preferable examples of the orthoquinodiazide compound are the compounds represented by the following general formulas (4-45) to (4-48).

Specific examples of the sulfone compound are β-ketosulfone and β-sulfonylsulfone. Preferable examples of the sulfone compound are the compounds represented by the following general formula (4-49).

Specific examples of the nitrobenzyl compound are a nitrobenzyl sulfonate compound and a dinitrobenzyl sulfonate compound. Preferable examples of the nitrobenzyl compound are the compounds represented by the following general formula (4-50).

Specific examples of the sulfonic acid compound are alkylsulfonate, haloalkylsulfonate, arylsulfonate and iminosulfonate. Preferable examples of the sulfonic acid compound are the compounds represented by the following general formulas (4-51) and (4-53).

[4-40]

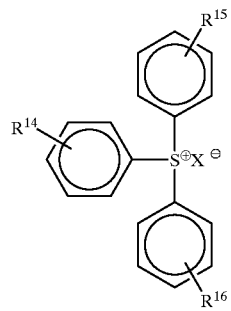

[4-41]

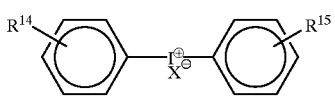

[4-42]

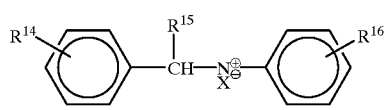

wherein $R^{14}$ to $R^{16}$ are the same or different and are individually hydrogen atom, amino group, nitro group, cyano group, a substituted or unsubstituted alkyl or alkoxyl group; and X is $SbF_6$, $PF_6$, $BF_4$, $CF_3CO_2$, $ClO_4$ or $CF_3CO_3$ or a compound represented by:

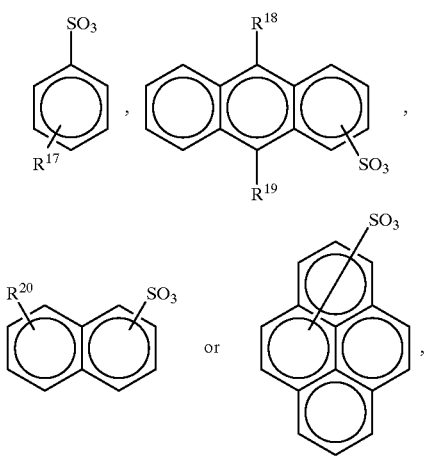

wherein $R^{17}$ is hydrogen atom, amino group, anilino group or a substituted or unsubstituted alkyl or alkoxyl group; $R^{18}$ and $R^{19}$ are the same or different and are individually a substituted or unsubstituted alkoxyl group; and $R^{20}$ is hydrogen atom, amino group, anilino group or a substituted or unsubstituted alkyl or alkoxyl group.

[4-43]

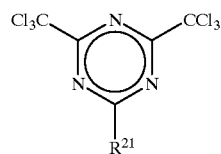

wherein $R^{21}$ is trichloromethyl group, phenyl group, methoxyphenyl group, naphthyl group or methoxynaphthyl group.

[4-44]

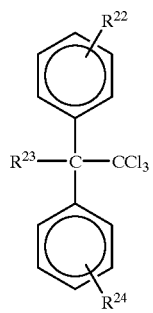

wherein $R^{22}$ to $R^{24}$ are the same or different and are individually hydrogen atom, halogen group, methyl group, methoxy group or hydroxyl group.

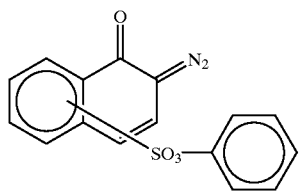

[4-45]

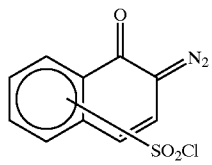

[4-46]

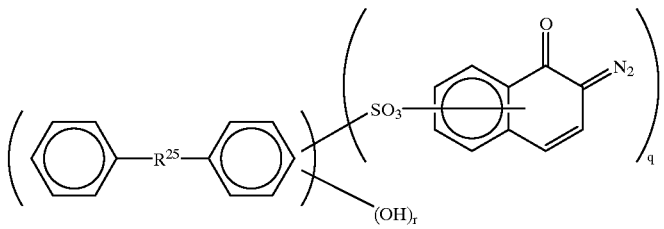

[4-47]

wherein $R^{25}$ represents —CH$_2$—, —C(CH$_3$)$_2$—, —C(=O)— or —SO$_2$—; q is an integer of 1 to 6; and r is an integer of 0 to 5 with a proviso that the total of q and r is in the range of 1 to 6.

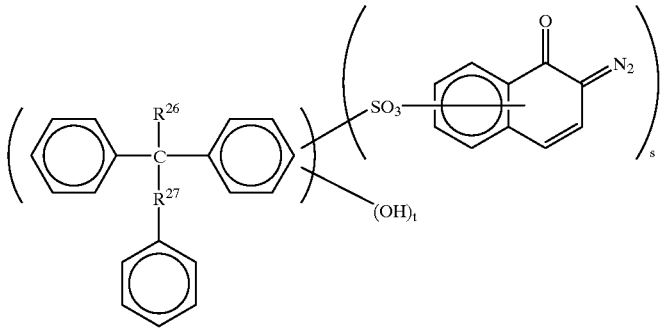

[4-48]

wherein $R^{26}$ represents hydrogen atom or methyl group; $R^{27}$ represents —CH$_2$—, —C(CH$_3$)$_2$—, —C(=O)— or —SO$_2$—; s is an integer of 1 to 6; and t is an integer of 0 to 5 with a proviso that the total of s and t is 1 to 6.

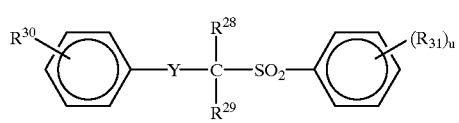

[4-49]

wherein $R^{28}$ to $R^{31}$ are the same or different and are individually a substituted or unsubstituted alkyl group or halogen group; Y is —C(=O)— or —SO$_2$—; and u is an integer of 0 to 3.

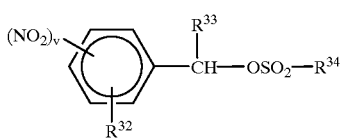

[4-50]

wherein $R^{32}$ is a substituted or unsubstituted alkyl group; $R^{33}$ represents hydrogen atom or methyl group; and $R^{34}$ is a compound represented by:

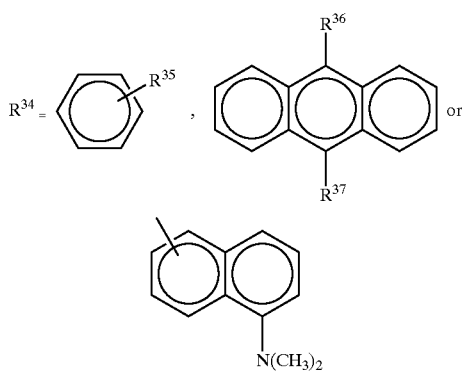

wherein $R^{35}$ represents hydrogen atom or methyl group; $R^{36}$ and $R^{37}$ are the same or different and are individually a substituted or unsubstituted alkoxyl group; and v is an integer of 1 to 3.

[4-51]

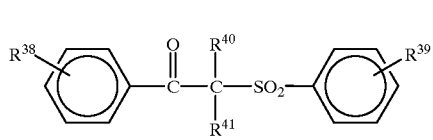

wherein $R^{38}$ and $R^{39}$ are the same or different and are individually hydrogen atom or a substituted or unsubstituted alkyl group; and $R^{40}$ and $R^{41}$ are the same or different and are individually hydrogen atom or a substituted or unsubstituted alkyl or aryl group.

[4-52]

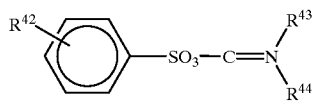

wherein $R^{42}$ is hydrogen atom or a substituted or unsubstituted alkyl group; $R^{43}$ and $R^{44}$ are the same or different and are individually a substituted or unsubstituted alkyl or aryl group; and $R^{43}$ and $R^{44}$ may be combined with each other forming a ring structure.

[4-53]

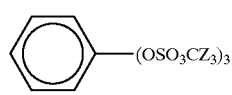

wherein Z represents fluorine atom or a chlorine atom.

As for the crosslinking agent for the organosilicon polymer, which is useful in this invention, the following substances other than the aforementioned organic compounds having a multiple bond may be employed. Namely, an organic compound having hydroxyl group; an organic compound having epoxy group; an organic compound having amino group; pyridine oxide; a silicon compound having alkoxysilyl group, silyl ester group, oximesilyl group, enoxysilyl group, aminosilyl group, amidesilyl group, aminoxysilly group or halogen; an organometallic compound; and a compound containing halogen may be employed.

Specific examples of the organic compound having hydroxyl group are polyhydric alcohol, novolak resin, a compound having carboxyl group, and silanol. These compounds are capable of reacting under the influence of light or heat with Si—H bond so as to crosslink the organosilicon polymer. Specific examples of such an organic compound are those represented by the following general formulas (5-1) and (5-28).

Specific examples of the compound having epoxy group are so-called epoxy resin of epibis type or alicyclic epoxy resin. These may be partially attached with hydroxyl group. The aforementioned acid-generating agent may be employed together with any of these epoxy resins. Specific examples of such an compound are those represented by the following general formulas (6-1) and (6-12).

Specific examples of the compound having amino group are those represented by the following chemical formulas (7-1) and (7-9).

Specific examples of the pyridine oxide are those represented by the following chemical formulas (8-1) and (8-6).

Specific examples of the silicon compound having alkoxysilyl group, silyl ester group, oximesilyl group, enoxysilyl group, aminosilyl group, amidesilyl group, aminoxysilly group or halogen are those represented by the following general formulas (9-1) and (9-52). In these chemical formulas, X represents any one of the aforementioned substituent groups. It is possible to employ, together with these compounds, a metallic catalyst such as platinum or organotin compound, and a base which are generally employed as a condensation catalyst for silicone.

By the term organometallic compound, it is meant a metallic salt or a metallic complex for which an organic group is substituted. The metal useful in this case is selected from B, Mg, Al, Ca, Ti, V, Mn, Fe, Co, Ni, Cu, Zn, Zr, Mo, Rh, Pd, Cd, In and Sn. Specific examples of these compounds are those represented by the following chemical formulas (10-1) and (10-9).

Specific examples of the compound containing halogen are those represented by the following general formulas (11-1) and (11-9).

[5-1]

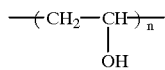

[5-2]

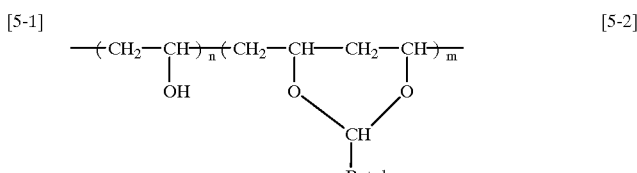

[5-3]

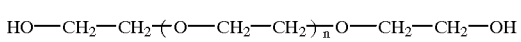

[5-4]

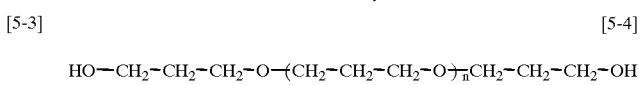

-continued
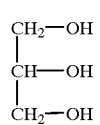
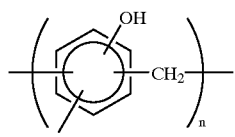 [5-5]
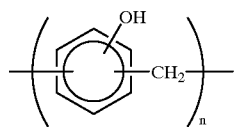 [5-6]
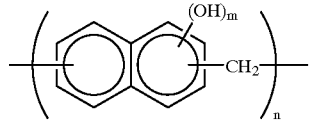 [5-7]
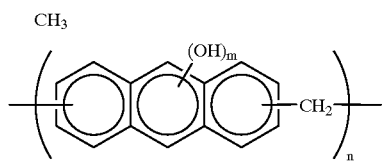 [5-8]
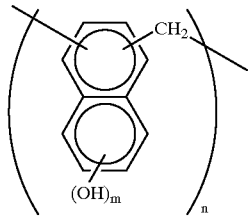 [5-9]
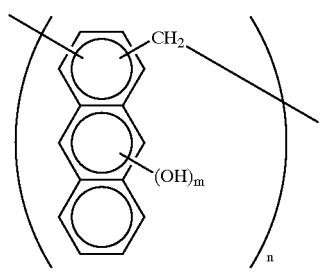 [5-10]
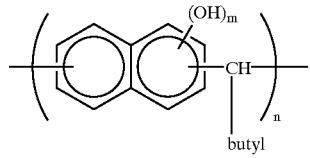 [5-11]
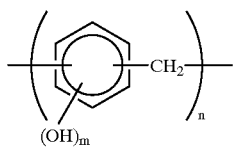 [5-12]
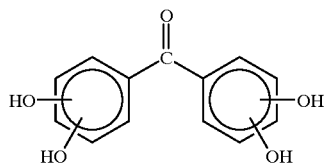 [5-13]
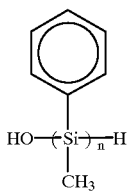 [5-14]
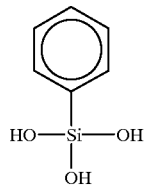 [5-15]
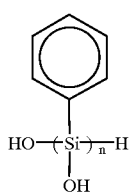 [5-16]
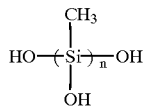 [5-17]
[5-18]

[5-19] 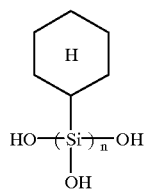
[5-20] 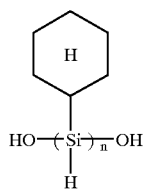
[5-21] 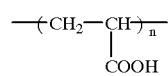
[5-22] 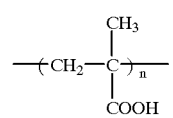
[5-23] 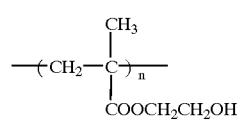
[5-24] 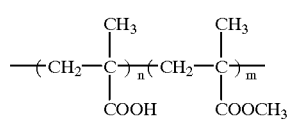
[5-25] 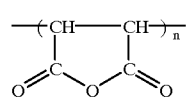
[5-26] 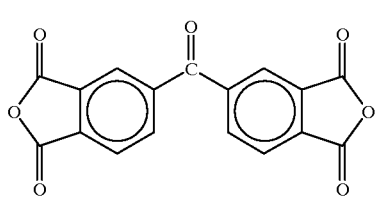
[5-27] 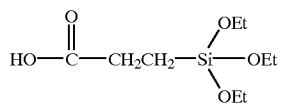
[5-28] 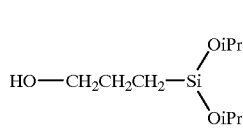
[6-1] 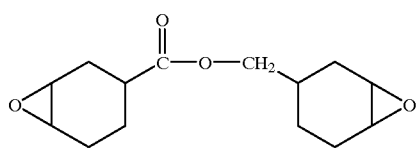
[6-2] 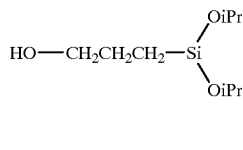
[6-3] 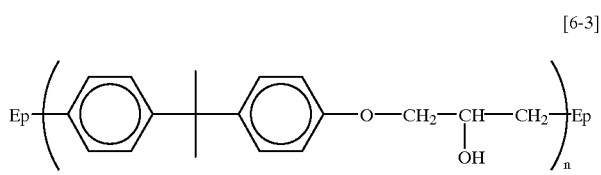
[6-4] 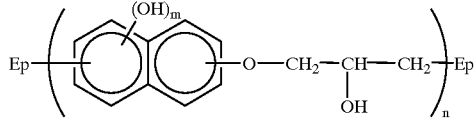
[6-5] 
[6-6] 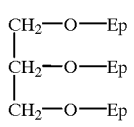
[6-7] 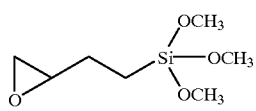
[6-8] 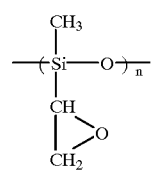

-continued
[6-9]
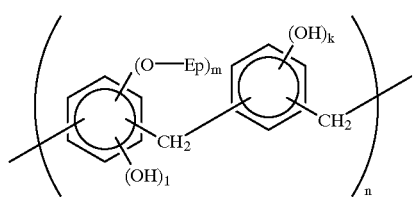
[6-10]
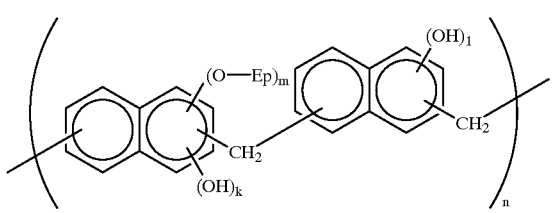
[6-11]
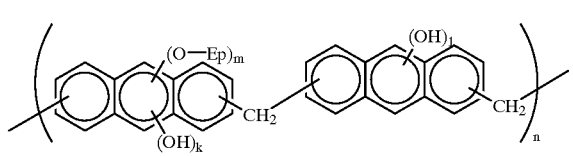
[6-12]
[7-1]
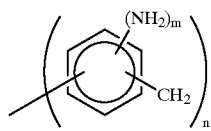
[7-2]
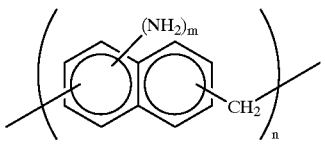
[7-3]
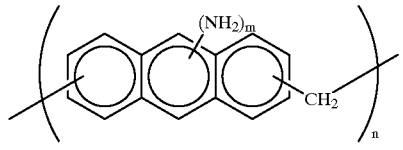
[7-4]
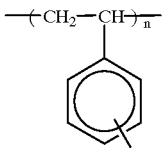
[7-5]
[7-6]
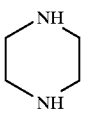
[7-7]
[7-8]
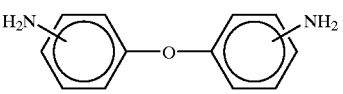
[7-9]
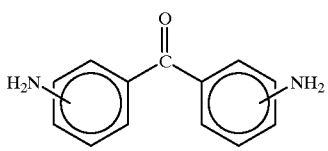
[7-10]
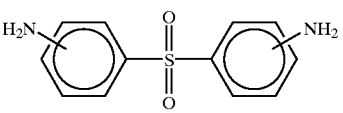
[7-11]
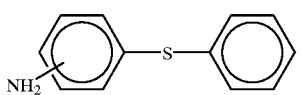
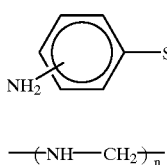
[7-12]
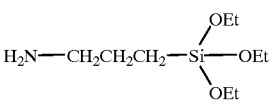
[7-13]
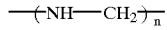
[8-1]
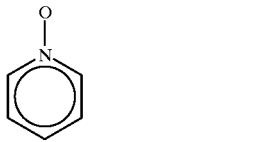

-continued
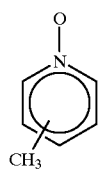 [8-1]
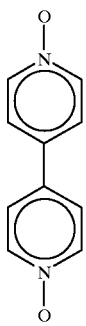 [8-2]
[8-3]
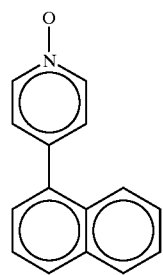 [8-4]
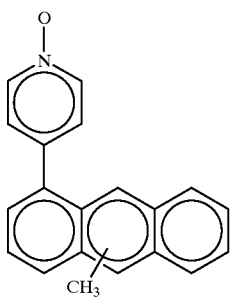 [8-5]
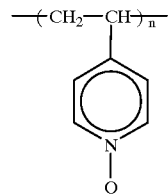 [8-6]
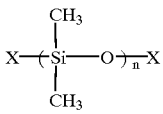 [9-1]
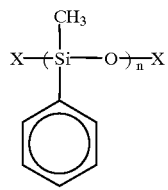 [9-2]
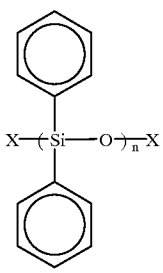 [9-3]
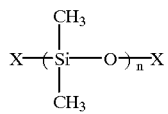 [9-4]
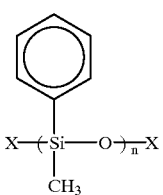 [9-5]

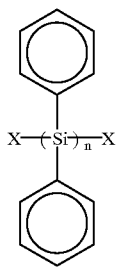
[9-6]
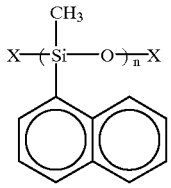
[9-7]
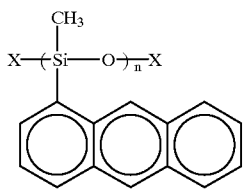
[9-8]
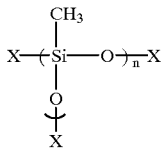
[9-9]
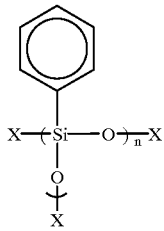
[9-10]
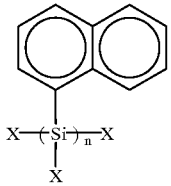
[9-11]
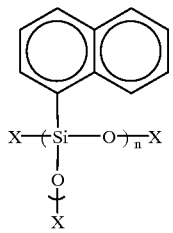
[9-12]
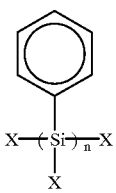
[9-13]
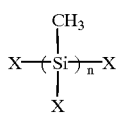
[9-14]
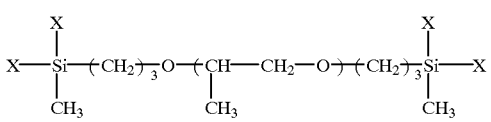
[9-15]
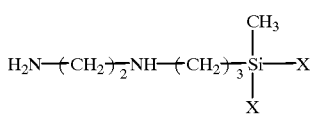
[9-16] X—(CH$_2$)$_3$—SiX$_3$
[9-17]
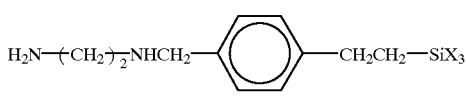
[9-18]
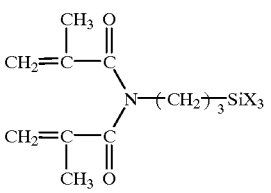
[9-19]

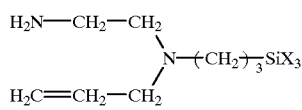
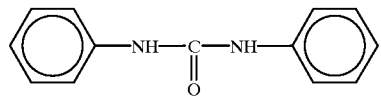
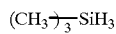
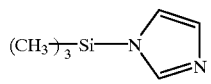
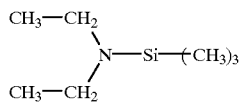
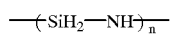
$CH_2\!=\!CHSi(OX)_3$
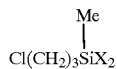
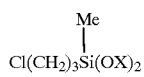
$H_2N(CH_2)_2NH(CH_2)_3Si(OX)_3$
$HS(CH_2)_3Si(OX)_3$
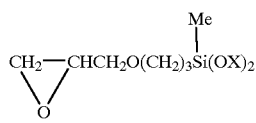
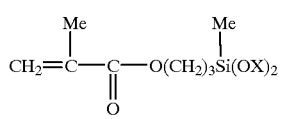
$[Me_2SiNH]_n$
(n =3–4)
$CH_3CONHSiMe_3$
-continued
[9-20]
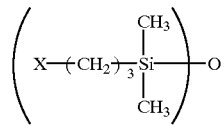   [9-21]
[9-22]  $(CH_3)_3Si\!-\!CN$   [9-23]
[9-24]  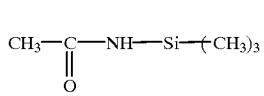   [9-25]
[9-26]  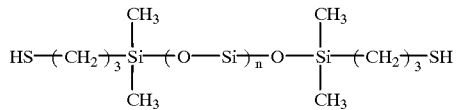   [9-27]
[9-28]  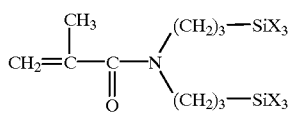   [9-29]
[9-30]  $CH_2\!=\!CHSiX_3$   [9-31]
[9-32]  $Cl(CH_2)_3Si(OX)_3$   [9-33]
[9-34]     [9-35]
[9-36]  $H_2N(CH_2)_3Si(OX)_3$   [9-37]
[9-38]  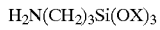   [9-39]
[9-40]     [9-41]
[9-42]  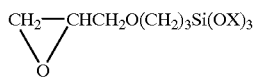   [9-43]
[9-44]  $Me_3SiNHSiMe_3$   [9-45]
[9-46]  $Me_3SiNHCONHSiMe_3$   [9-47]
[9-48]  $Me_3NSiMe_3$   [9-49]

[9-50] Et$_2$NSiMe$_3$

[9-51] 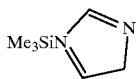

[10-1] Al(acac)$_3$

[10-2] Al(Etaa)$_3$

[10-3] Al(SA)$_3$

[10-4] 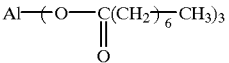 Al—(O—C(CH$_2$)$_6$CH$_3$)$_3$ with =O on C

[10-5] TiO(acac)$_2$

[10-6] Zr(acac)$_4$

[10-7] SnO(acac)$_2$

[10-8] VO(acac)$_2$ acac = acetylacetonato
Etaa = ethylacetacetate
SA = salicylaldehydato

[11-1] 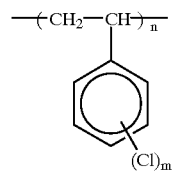

[11-2] 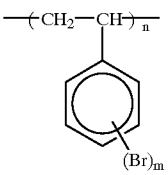

[11-3] 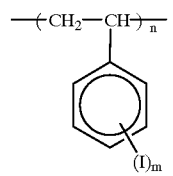

[11-4] 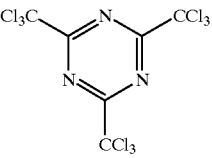

[11-5] 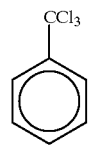

[11-6] 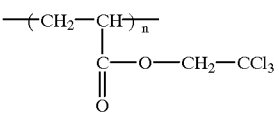

[11-7] 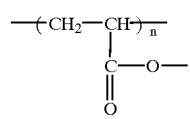

[11-8] 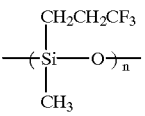

[11-9] 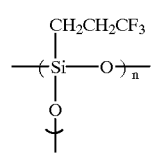

The organic solvent may be either a polar solvent or a non-polar solvent. However, since a solvent having a multiple bond is prone to react with an organosilicon compound to cause a denaturing with time of the resultant solution, it is preferable to employ a solvent not containing a multiple bond.

First of all, a material solution is prepared according to the aforementioned procedures and then, coated on a work film by means of a spin-coating method for instance. Thereafter, the coated layer is heated to allow the solvent to evaporate, thus forming an underlying film.

This underlying film may be formed using an organic compound which is capable of being hardened through the polymerization or crosslinking thereof by the irradiation of charged beam. When the underlying film is hardened in this manner, the etching rate of the underlying film is decreased, thus making it possible to use this charged beam exposure region as an etching mask so as to allow unexposed regions to be selectively etched to form a pattern of underlying film.

Further, the underlying film may be formed using a compound, the surface of which is capable of being carbonized by the irradiation of a charged beam. When the underlying film is carbonized in this manner, the etching rate of the underlying film is decreased, thus making it possible to use this charged beam exposure region as an etching mask so as to allow unexposed regions to be selectively etched to form a pattern of underlying film.

Then, a resist pattern is formed on the surface of the underlying film. Specifically, as shown in FIG. 1A, a resist solution is co at ed on the surf ace of the organosilicon film, and then the resultant coated layer is heat-treated to form a resist 13. The film thickness of the resist 13 may preferably be in the range of 0.01 to 10 $\mu$m. However, as long as the resist 13 is of such a film thickness that enables the underlying layer to be etched with an excellent dimension controllability, the film thickness of the resist 13 should be made as thin as possible in order to improve the exposure tolerance, focus tolerance or resolution at the occasion of energy beam exposure.

There is not any particular limitation on the kind of resist, i.e. either a positive resist or a negative resist can be suitably selected depending on the end-use. Specific examples of the positive resist are a resist comprising naphthoquinone diazide and novolak resin (IX-770, Nihon Synthetic Rubber Co.); and a chemical amplification type resist comprising polyvinylphenol resin protected by t-BOC and a photo-acid generator (APEX-E, Shiplay Co.).

Examples of the negative resist are, for instance, a chemical amplification type resist comprising polyvinylphenol, melamine resin and a photo-acid generator (SNR248, Shiplay Co.), and a resist comprising polyvinylphenol and a bisazide compound (RD-2000D, Hitachi Kasei Co.).

Any of these resist solutions is coated on the underlying film by means of a spin coating method for instance, and then the solvent in the resist solution is allowed to evaporate by heating it thereby to form a resist film.

Then, ultraviolet rays constituting a first energy beam are irradiated onto the resist film through a mask having a predetermined pattern. As for the light source for irradiating ultraviolet rays, g line (436 nm); i line (365 nm); or an excimer laser beam such as XeF (wavelength=351 nm), XeCl (wavelength=308 nm), KrF (wavelength=248 nm), KrCl (wavelength=222 nm), ArF (wavelength=193 nm) and $F_2$ (wavelength=151 nm) can be employed.

Figure 1B:
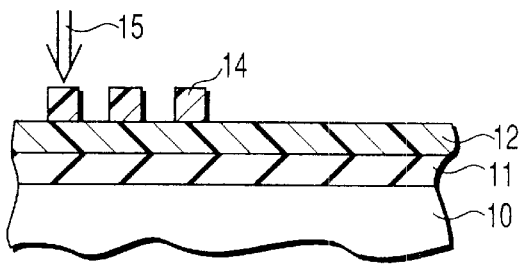

The resist film thus exposed is subjected, if required, to a post exposure baking, and then, subjected to a development treatment by making use of an aqueous tetramethyl ammonium hydroxide solution; an aqueous inorganic alkali solution such as sodium hydroxide, potassium hydroxide, etc.; or an organic solvent such as xylene and acetone, thereby to form a resist pattern 14 (FIG. 1B).

Figure 1C:
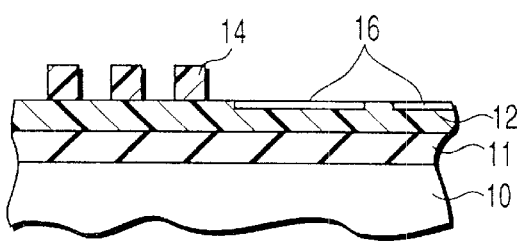

Then, the underlying film is exposed to an irradiation of predetermined pattern by making use of a charged beam as a second energy beam (FIG. 1C). When the underlying film is irradiated by the charged beam, the charged beam-irradiated region 16 can be modified so as to make it difficult to be selectively etched.

Preferably, the information on position of the resist pattern 14 is detected at this occasion by making use of a light or charged beam 15 so as to make it possible to correct the position of a predetermined pattern to be formed by a charged beam exposure on the basis of the aforementioned information regarding the position. According to this alignment method, since the pattern to be formed through a charged beam exposure is directly aligned with the resist pattern formed through light exposure, it is possible to realize a higher alignment precision as compared with the conventional method wherein the position of pattern that has been formed by making use of light exposure as well as the position of pattern that has been formed by making use of a charged beam are both indirectly aligned with each other by referring to the alignment marks that have been formed on the underlying substrate.

Figure 1D:
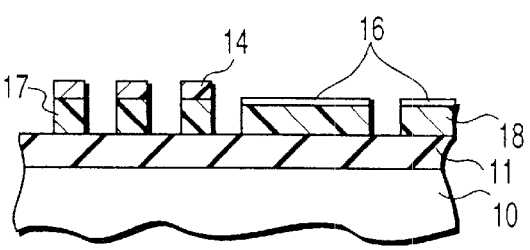

Then, the underlying film 12 is dry-etched by making use of the resist pattern 14 and the charged beam exposure region 16 of the underlying film as an etching mask (FIG. 1D). As for the etching method useful in this case, a reactive ion etching, a magnetron type reactive ion etching, an electron beam ion etching, an ICP etching or ECR ion etching may be employed. Namely, there is not any particular limitation on this etching method as long as it is possible to perform a fine etching process.

When an organosilicon compound having a silicon—silicon bond in the backbone chain thereof is employed as an underlying film, it is preferable to employ, as the source gas, a gas containing chlorine and/or bromine. For example, gases such as $CF_3Cl$, $CF_2Cl_2$, $CF_3Br$, $CCl_4$, $C_2F_5Cl_2$, $Cl_2$, $SiCl_4$, $Br_2$, HBr, HCl and $BCl_3$ may be employed.

The reason that these gases are preferable is as follows. Namely, although the organosilicon compound can be easily etched by the plasma that has been generated through the employment of a gas containing chlorine or bromine atom, the region of the organosilicon compound that has been irradiated with a charged beam is modified into an oxide/carbide silicon-like film thereby making it difficult to be etched by the plasma, so that the charged beam-unexposed region can be selectively etched, thus making it possible to obtain a highly anisotropic pattern.

When an organic compound constituted by carbon, oxygen, nitrogen, sulfur and hydrogen is employed as an underlying film, oxygen gas, halogen gas or a mixed gas consisting of oxygen gas and halogen gas may be employed as the source gas. As for the halogen gas, gases such as $CF_4$, $C_4F_8$, $CHF_3$, $CF_3Cl$, $CF_2Cl_2$, $CF_3Br$, $CCl_4$, $C_2F_5Cl_2$, $Cl_2$, SiCl4, $Br_2$, $I_2$, $SF_6$, HBr, HI, HCl and $BCl_3$ may be employed.

Though, in the above embodiment, ultraviolet rays are used as a first energy beam, and a charged beam is used as a second energy beam, it is possible to use a charged beam and ultraviolet rays as a first energy beam and a second energy beam, respectively.

Next, a method of forming a pattern according to a second embodiment will be explained with reference to FIGS. 3A to 3E.

This embodiment illustrates an example wherein a line-and-space pattern is formed by means of light exposure, whereas an isolated through-pattern which cannot be easily formed at a high resolution with a sufficient margin if it is to be formed using light exposure is formed by means of a charged beam exposure.

Figure 3A:
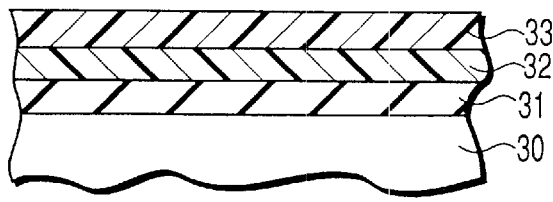
FIGS. 3A to 3E illustrate cross-sectional views sequentially showing the process of forming a pattern according to Example 3 of this invention.

First of all, a work film 31 is formed on a silicon wafer 30. Then, an anti-reflection film 32 is formed on the surface of the work film 31. Thereafter, a resist film 33 is formed on the anti-reflection film 32 (FIG. 3A).

Figure 3B:
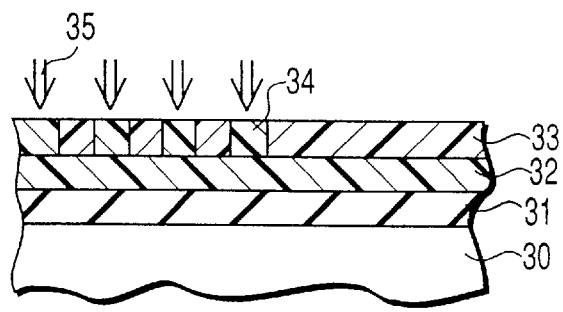
Figure 3C:
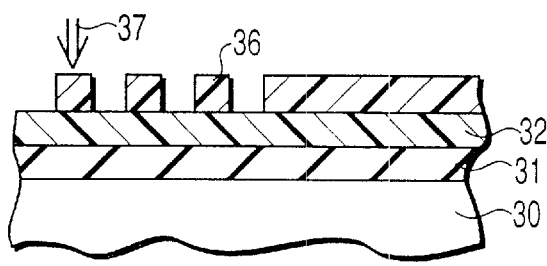

Then, the exposure of the resist film 33 is performed using a first energy beam 35, e.g. an excimer laser (FIG. 3B). After being baked, the resist film 33 is subjected to a development treatment thereby to dissolve and remove the exposure portions 34, thus forming a first resist pattern including a line-and-space pattern 36 (FIG. 3C).

Subsequently, the resist pattern 36 is irradiated with an electron beam or light 37 thereby to detect and obtain the information of position of the first resist pattern. The exposure dose at this occasion is such that the resist is not photo-sensitized.

Figure 3D:
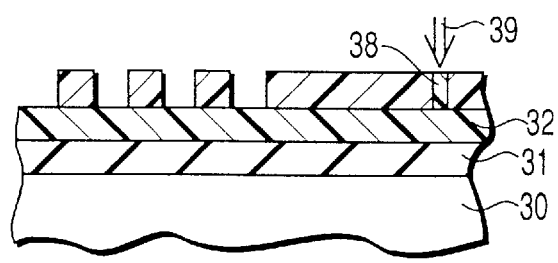
Figure 3E:
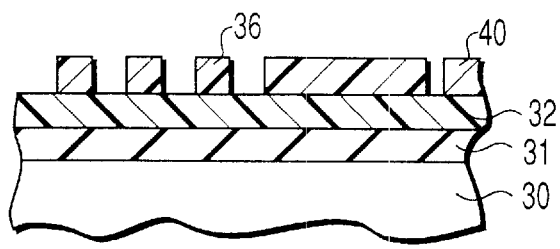

Then, a charged beam is employed as a second energy beam 39 so as to perform the exposure of the first resist pattern (FIG. 3D). As for the charged beam, an electron beam or an ion beam may be employed. Specific examples of ion beam include a Ga beam. At this occasion, the position of irradiation is determined on the basis of the detected result about the information on position of the first resist pattern. After being baked again, the first resist pattern is subjected to a development treatment thereby to dissolve and remove the exposure portions 38, thus forming a second resist pattern accompanying the line-and-space pattern 36 (FIG. 3E).

The materials of the work film 31 and the resist film 33 as well as the method forming these films in this embodiment are the same as those employed in the method of the first embodiment illustrated with reference to FIGS. 1A to 1D. With respect to the method of exposure and the method development, they may be suitably selected by referring to the method according to the first embodiment.

According to this embodiment, it is possible to align, at a high precision, the pattern formed through the light exposure with the pattern formed through the charged beam exposure.

This invention will be further explained in detail with reference to the following various Examples and Comparative Examples.

EXAMPLE 1

This example illustrates a case wherein a line-and-space pattern is formed by means of light exposure, whereas an isolated through-pattern which cannot be easily formed at a high resolution with a sufficient margin if it is to be formed using light exposure is formed by means of an electron beam exposure.

First of all, an $SiO_2$ film having a thickness of 300 nm was deposited as a work film 11 on the surface of a silicon wafer 10 by means of LPCVD method. Then, an underlying film 12 was formed on the surface of the work film 11 by the following methods (S1) to (S10) (FIG. 1A).

(S1): 10 g of an organosilicon compound (n/m=¼) represented by the formula (1-54) and having a weight average molecular weight of 8,000 was dissolved in 90 g of anisole to prepare a solution, which was then spin-coated on the surface of the work film 11. Then, the coated layer was heated for 90 seconds at a temperature of 160° C. by making use of a hot plate.

(S2): 10 g of an organosilicon compound (n/m=¼) represented by the formula (1-56) and having a weight average molecular weight of 9,000 was dissolved in 90 g of anisole to prepare a solution, which was then spin-coated and heated in the same manner as in (S1).

(S3): 10 g of an organosilicon compound (n/m=¼) represented by the formula (1-84) and having a weight average molecular weight of 12,000 was dissolved in 90 g of anisole to prepare a solution, which was then spin-coated and heated in the same manner as in (S1).

(S4): 8.5 g of an organosilicon compound represented by the formula (1-1) and having a weight average molecular weight of 8,000, 1 g of the crosslinking agent represented by the formula (3-86) and 0.5 g of the radical-generating agent represented by the formula (4-12) were dissolved in 90 g of toluene to prepare a solution, which was then spin-coated on the surface of the work film 11. Then, the coated layer was heated for 90 seconds at a temperature of 160° C. by making use of a hot plate in a nitrogen atmosphere having an oxygen concentration of 50 ppm.

(S5): 8.5 g of an organosilicon compound represented by the formula (1-23) and having a weight average molecular weight of 8,000, 1 g of the crosslinking agent represented by the formula (3-77) and 0.5 g of the radical-generating agent represented by the formula (4-12) were dissolved in 90 g of toluene to prepare a solution, which was then spin-coated and heated in the same manner as in (S4).

(S6): 8.5 g of an organosilicon compound represented by the formula (1-23) and having a weight average molecular weight of 8,000 and 0.5 g of the radical-generating agent represented by the formula (4-28) were dissolved in 90 g of toluene to prepare a solution, which was then spin-coated and heated in the same manner as in (S4).

(S7): 8.5 g of an organosilicon compound represented by the formula (1-24) and having a weight average molecular weight of 8,000, 1 g of the crosslinking agent represented by the formula (3-65) and 0.5 g of the radical-generating agent represented by the formula (4-12) were dissolved in 90 g of toluene to prepare a solution, which was then spin-coated and heated in the same manner as in (S4).

(S8): 9.5 g of an organosilicon compound (n/m=¼) represented by the formula (1-54) and having a weight average molecular weight of 8,000 and 0.5 g of the radical-generating agent represented by the formula (4-28) were dissolved in 90 g of anisole to prepare a solution, which was then spin-coated and heated in the same manner as in (S1).

(S9): 9 g of an organosilicon compound (n/m=¼) represented by the formula (1-56) and having a weight average molecular weight of 9,000 and 1 g of the radical-generating agent represented by the formula (4-28) were dissolved in 90 g of anisole to prepare a solution, which was then spin-coated and heated in the same manner as in (S1).

(S10): 9.5 g of an organosilicon compound (n/m=¼) represented by the formula (1-84) and having a weight average molecular weight of 12,000 and 0.5 g of sulfonimide were dissolved in 90 g of anisole to prepare a solution, which was then spin-coated and heated in the same manner as in (S1).

The film thickness of the underlying layer in all of the above methods was 300 nm. The complex index of refraction of these underlying films at an exposure wavelength of 248 nm was measured using a spectral ellipsometer, the results measured being shown in the following Table 1. It will be seen from Table 1 that the underlying films are all provided with a suitable absorbency in relative to the exposure wavelength, and hence, are useful as an anti-reflection film at the occasion of light exposure.

Then, a resist film 13 was formed on the surface of each underlying film (see FIG. 1A). Namely, first of all, 9.9 g of an inhibitor resin wherein 30% of hydroxyl group of polyvinylphenol having a weight average molecular weight of 12,000 was substituted by tertiary buthoxy carbonyl group and 0.1 g of sulfonimide as an acid-generating agent were dissolved in 90 g of ethyl lactate to thereby form a resist solution, which was then coated on each of the underlying films by means of spin-coating method to form the resist film 13. Thereafter, the resist film 13 was baked for 90 seconds at a temperature of 110° C. by making use of a hot plate. The film thickness of the resist film 13 after this baking was 200 nm.

The resist film 13 was then subjected to 0.25 $\mu$m line-and-space pattern exposure by making use of a reduced optical type stepper using KrF excimer laser as a first energy beam. Further, the resist film 13 was baked again for 90 seconds at a temperature of 110° C. by making use of a hot plate. Thereafter, the resist film 13 was subjected to a developing treatment by making use of a 0.21N TMAH developing solution to form a line-and-space pattern 14 (FIG. 1B).

When the profile section of the line-and-space pattern 14 thus obtained was observed by making use of a scanning electron microscope, a rippling profile due to standing wave was not recognized in any of the underlying films, thus indicating that the reflection of exposure light from the work film was effectively suppressed.

Then, an electron beam 15 of 1.8 kV in accelerating voltage was irradiated onto the resist pattern 14 so as to detect the information on position of the resist pattern. In this case, the exposure dose was controlled such that the resist was not photo-sensitized.

While performing the correction of position on the basis of the aforementioned information regarding the position, an electron beam of 10 kV in accelerating voltage was irradiated onto each of the underlying films, thereby forming modified regions 16 so as to turn the unirradiated regions into an isolated through-pattern. The minimum exposure dosage of electron beam required for forming a modified region useful for forming the isolated through-pattern is shown in the following Table 1.

It should be noted that the coated films illustrated in (S-8) to (S-10) are ones wherein a radical-generating agent or an acid-generating agent is added to the solutions illustrated in (S-1) to (S-3). It will be seen from Table 1 that the minimum exposure dosage of electron beam required for forming a modified region useful for forming the isolated through-pattern is lowered in (S-8) to (S-10).

It will be seen from this fact that the sensitivity of the coated film may be improved by the addition of a radical-generating agent or an acid-generating agent to an underlying film, so that it may be preferable if required to add any of these compounds to an underlying film.

By the way, the irradiating position of electron beam was determined on the basis of the detected result on the information regarding the position of the resist pattern. As a result, the alignment precision between the line-and-space pattern 14 and the electron beam irradiating region 16 was found to be within the range of 10 to 30 nm, thus making it possible to obtain a high precision alignment between the pattern formed through a light exposure and the pattern formed through an electron beam exposure without raising any problem in the formation of a pattern required for forming a large scale integrated circuit of giga bit class.

Then, the resist pattern 14 and the electron beam exposure region 16 of the underlying film were employed as a mask to dry-etch the underlying film. In this case, a magnetron type reactive ion etcher was employed as an etching apparatus, and the etching of the underlying film was performed under the conditions of 80° C. in substrate temperature, 200W in excitation power and 40 mTorr in vacuum degree, using a source gas which is illustrated in the following Table 1 (FIG. 1D).

TABLE 1

| | Complex index of refraction | Exposure dose | Source gas |
|---|---|---|---|
| (S1) | n = 2.01, k = 0.17 | 22 $\mu C/cm^2$ | $Cl_2$ = 200 SCCM |
| (S2) | n = 2.04, k = 0.22 | 23 $\mu C/cm^2$ | HBr = 200 SCCM |
| (S3) | n = 2.03, k = 0.24 | 24 $\mu C/cm^2$ | $Cl_2$ = 200 SCCM, HBr = 200 SCCM |
| (S4) | n = 2.07, k = 0.38 | 25 $\mu C/cm^2$ | $CF_4$ = 80 SCCM, $Cl_2$ = 120 SCCM |
| (S5) | n = 2.10, k = 0.49 | 22 $\mu C/cm^2$ | $CF_3Cl$ = 200 SCCM |
| (S6) | n = 2.09, k = 0.48 | 23 $\mu C/cm^2$ | $C_4F_8$ = 300 SCCM |
| (S7) | n = 2.08, k = 0.42 | 24 $\mu C/cm^2$ | $Cl_2$ = 200 SCCM |

TABLE 1-continued

| | Complex index of refraction | Exposure dose | Source gas |
|---|---|---|---|
| (S8) | n = 2.01, k = 0.17 | 12 $\mu C/cm^2$ | $Cl_2$ = 200 SCCM |
| (S9) | n = 2.04, k = 0.22 | 13 $\mu C/cm^2$ | HBr = 200 SCCM |
| (S10) | n = 2.03, k = 0.24 | 14 $\mu C/cm^2$ | $Cl_2$ = 200 SCCM, HBr = 200 SCCM |

As a result, the underlying film pattern 17 formed using the resist pattern 14 as an etching mask as well as the underlying film pattern 18 formed using the electron beam exposure region 16 of the underlying film 12 as an etching mask were both excellent in anisotropy, indicating an excellent worked configuration. The reason for realizing an excellent anisotropic etching of the underlying film by making use of the resist pattern as an etching mask can be ascribed to the fact that an organosilicon compound having a silicon-silicon bond in a backbone chain thereof is highly etchable, an thus making it possible to etch the organosilicon compound at a high selective ratio in relative to the resist.

Further, the reason for realizing an excellent etching of the unexposed region by making use of the electron beam exposure region of the underlying film as an etching mask can be ascribed to the fact that an organosilicon compound can be turned into an oxide/carbide silicon-like film by the irradiation of an electron beam, thus making the film hardly etchable and enabling the unexposed region to be etched at a high selective ratio as compared with the exposure region.

COMPARATIVE EXAMPLE 1

A patterning exposure of a resist film was performed using an electron beam and ultraviolet rays, and then, the resist film was subjected to a development treatment thereby to form a resist pattern.

Figure 2A:
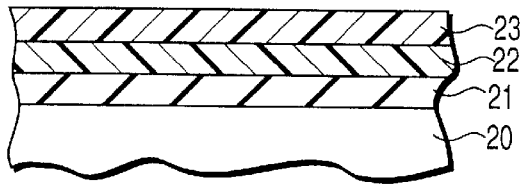
FIGS. 2A to 2C illustrate cross-sectional views sequentially showing the process of forming a pattern according to Comparative Example.

Namely, first of all, a work film 21 was formed in the same manner as explained in Example 1, and then, an underlying film 22 was formed according to the method described in (S1) of Example 1. Then, a resist film 23 was formed in the same manner as explained in Example 1 (FIG. 2A).

Figure 2B:
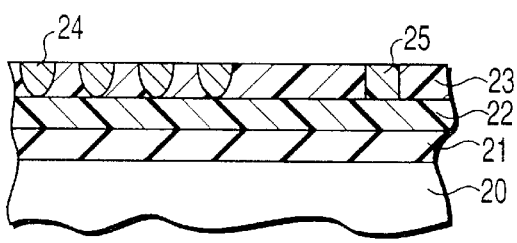

The resist film 23 was then subjected to 0.25 $\mu$m line-and-space pattern exposure by making use of a reduced optical type stepper using KrF excimer laser as a light source. Then, the resist film 23 was further irradiated with an electron beam of 50 keV in accelerating voltage at a dosage of 10 $\mu C/cm^2$ to perform an exposure of isolated through-pattern having a line width of 0.10 $\mu$m (FIG. 2B). The distributions of light intensity and of electron beam intensity in the resist film are shown in FIG. 2B. Further, the resist film 23 was baked again for 90 seconds at a temperature of 110° C. by making use of a hot plate. Thereafter, the resist film 23 was subjected to a developing treatment by making use of a 0.21N TMAH developing solution to form a resist pattern mixedly comprising a line-and-space pattern 26 and an isolated through-pattern 27.

Figure 2C:
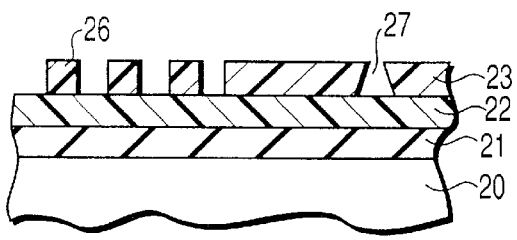

Although the line-and-space pattern 26 thus obtained by making use of the light exposure had a perpendicular profile, the isolated through-pattern 27 which was formed by making use of the electron beam exposure had an inversely tapered profile (FIG. 2C). The reason for producing this inversely tapered profile may be explained as follows.

First of all, the light intensity distribution and electron beam intensity distribution in the resist film at the occasion of exposure are assumed as being as indicated respectively by 24 and 25 in FIG. 2B. As seen from FIG. 2B, the light intensity 24 in the resist film 23 was gradually lowered as it approached closer to the bottom layer thereof. In the case of the resist film employed in Example 1 and in Comparative Example 1 however, it was possible to obtain a perpendicular profile. The reason for this may be ascribed to the fact that since the dissolving rate of the lower portion of the resist film to the developing solution was higher than that of the upper portion of the resist film, so that even if the light intensity was low in the lower portion of the resist film, the lower portion of the resist film could be dissolved more easily as compared with the upper portion thereof.

On the other hand, the electron beam intensity 25 in the resist film was constantly distributed in the direction of film thickness. Therefore, since the resist employed in this Comparative Example 1 was designed such that the lower portion thereof was more easily dissolved in the developing solution as compared with the upper portion thereof, the portion which was formed by making use of the electron beam exposure had a inversely tapered profile.

As seen from this Comparative Example, it is possible according to this invention to realize the formation of pattern which is provided with both excellent resolution inherent to the electron beam exposure and excellent productivity inherent to the light exposure even if a resist which is adjusted in composition for use in light exposure but is not suited for use in obtaining an excellent profile through an electron beam exposure is employed.

EXAMPLE 2

This example illustrates a case wherein an organic resin other than organosilicon compounds was employed as a material for the underlying film.

First of all, a work film was deposited on the surface of a silicon wafer in the same manner as in Example 1. Then, an underlying film was formed on the surface of this work film 11 by the following methods (S11) to (S15).

(S11): 10 g of novolak resin represented by the following formula (12-1) and having a weight average molecular weight of 8,000 was dissolved in 90 g of ethyl lactate to prepare a solution, which was then spin-coated on the surface of the work film. Then, the coated layer was heated for 90 seconds at a temperature of 320° C. by making use of a hot plate.

(S12): 8 g of polysulfone represented by the following formula (12-2) and having a weight average molecular weight of 12,000 was dissolved in 92 g of cyclohexanone to prepare a solution, which was then spin-coated and heated for 90 seconds at a temperature of 220° C. by making use of a hot plate.

(S13): 8 g of polybenzimidazole represented by the following formula (12-3) and having a weight average molecular weight of 8,000 was dissolved in 92 g of cyclohexanone to prepare a solution, which was then spin-coated and heated in the same manner as in (S12).

(S14): 10 g of polyimide represented by the following formula (12-4) and having a weight average molecular weight of 7,000 was dissolved in 90 g of cyclohexanone to prepare a solution, which was then spin-coated and heated in the same manner as in (S12).

(S15): 9 g of chloropolystyrene represented by the formula (12-5) and having a weight average molecular weight of 7,000 and polyaniline black as a dye were dissolved in ethyl lactate to prepare a solution, which was then spin-coated and heated in the same manner as in (S12).

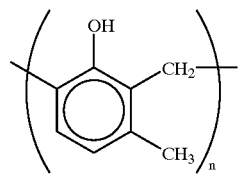

[12-1]

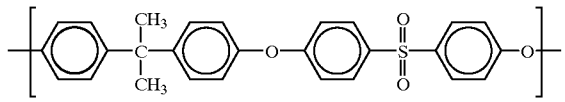

[12-2]

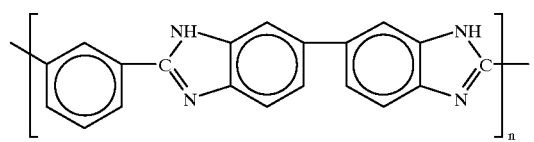

[12-3]

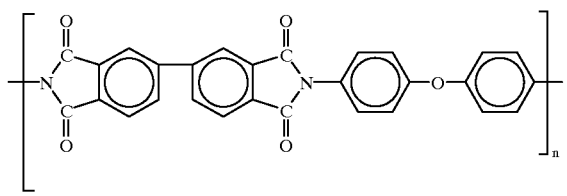

[12-4]

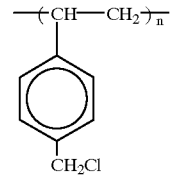

[12-5]

The film thickness of the underlying layer in all of the above methods was 300 nm. The complex index of refraction of these underlying films at an exposure wavelength of 248 nm was measured using a spectral ellipsometer, the results measured being shown in the following Table 2. It will be seen from Table 2 that the underlying films are all provided with a suitable absorbency in relative to the exposure light, and hence, are useful as an anti-reflection film at the occasion of light exposure.

TABLE 2

| | Complex index of refraction | Exposure dose | Source gas |
|---|---|---|---|
| (S11) | n = 1.62, k = 0.38 | 12 $\mu C/cm^2$ | $CF_4$ = 200 SCCM, $O_2$ = 200 SCCM |
| (S12) | n = 1.78, k = 0.22 | 13 $\mu C/cm^2$ | $Cl_2$ = 200 SCCM |
| (S13) | n = 1.68, k = 0.42 | 14 $\mu C/cm^2$ | $CF_4$ = 80 SCCM, $Cl_2$ = 120 SCCM |
| (S14) | n = 1.64, k = 0.43 | 15 $\mu C/cm^2$ | $CF_3Cl$ = 200 SCCM |
| (S15) | n = 1.72, k = 0.20 | 12 $\mu C/cm^2$ | $O_2$ = 200 SCCM, Ar = 400 SCCM |

Then, a line-and-space pattern was formed on the surface of the underlying film in the same manner as in Example 1. Further, in the same manner as in Example 1, the underlying film was exposed to an electron beam in an isolated through-pattern. The exposure dose of the electron beam is shown in the above Table 2.

Then, the resist pattern and the electron beam exposure region of the underlying film were employed as an etching mask to dry-etch the underlying film. In this case, a magnetron type reactive ion etcher was employed as an etching apparatus, and the etching of the underlying film was performed under the conditions of 60° C. in substrate temperature, 200W in excitation power and 40 mTorr in vacuum degree, using a source gas which is illustrated in the above Table 2. When the worked configuration of the underlying film after the etching was observed, it was recognized that the underlying film was worked with such an excellent anisotropy as in the case of Example 1.

Following Examples 3 to 7 relate to the second embodiment.

EXAMPLE 3

This example illustrates a case wherein a line-and-space pattern was formed by means of light exposure, and an isolated through-pattern which cannot be easily formed at a high resolution with a sufficient margin if it is to be formed using light exposure was formed by means of an electron beam exposure.

First of all, as the work film 31, an $SiO_2$ film having a thickness of 300 nm was formed on a silicon wafer 30 by means of the LPCVD method. Then, a solution which was prepared by dissolving 8 g of polysulfone in 92 g of cyclohexanone was spin-coated on the surface of the work film 31, and the coated layer was heated for 90 seconds at a temperature of 200° C. by making use of a hot plate to obtain an anti-reflection film 32 having a thickness of 100 nm.

The complex index of refraction of the anti-reflection film 32 at an exposure wavelength of 248 nm was measured using a spectral ellipsometer, finding that n=1.78 and k=0.24, thus indicating a suitable absorbency thereof and the usefulness thereof as an anti-reflection film at the occasion of light exposure.

Then, a resist film 33 was formed on the surface of the anti-reflection film 32 (FIG. 3A). Namely, first of all, 9.9 g of an inhibitor resin wherein 30% of hydroxyl group of polyvinylphenol having a weight average molecular weight of 12,000 was substituted by tertiary buthoxy carbonyl group and 0.1 g of sulfonimide as an acid-generating agent were dissolved in 90 g of ethyl lactate to thereby form a resist solution, which was then coated on the surface of the anti-reflection film 32 by means of spin-coating method to form the resist film 33. Thereafter, the resist film 33 was baked for 90 seconds at a temperature of 110° C. by making use of a hot plate. The film thickness of the resist film 33 after this baking was 200 nm.

The exposure of the resist film 33 was performed by making use of a reduced optical type stepper using a first energy beam 35, i.e. KrF excimer laser as a light source (FIG. 3B). Further, after the resist film 33 was baked for 90 seconds at a temperature of 110° C. by making use of a hot plate, the resist film 33 was subjected to a developing treatment by making use of a 0.21N TMAH developing solution, thereby dissolving and removing the exposed portion 34 to form a first resist pattern including a line-and-space pattern 36 (FIG. 3C).

Thereafter, an electron beam 37 of 1.8 keV in accelerating voltage was irradiated onto the resist pattern 36 thereby to detect the information on position of the first resist pattern. The exposure dose at this moment was controlled to as sufficiently low as 0.01 $\mu C/cm^2$ so as to prevent the resist film from being photo-sensitized.

Then, the first resist pattern was further subjected to an exposure with a second energy beam 39 or an electron beam of 10 keV in accelerating voltage at a dosage of 10 $\mu C/cm^2$ (FIG. 3D). At this occasion, the position of irradiation was determined on the basis of the detected result about the information on position of the first resist pattern. After being baked again for 90 seconds at a temperature of 110° C. by making use of a hot plate, the first resist pattern was subjected to a developing treatment by making use of a 0.21N TMAH developing solution, thereby dissolving and removing the exposed portion 38 to form a second resist pattern mixedly comprising an isolated through-pattern 40 having a through line width of 0.10 $\mu$m and a line-and-space pattern 36 having a line width of 0.25 $\mu$m (FIG. 3E).

According to this Example, the alignment precision between the line-and-space pattern 36 that had been formed through the light exposure and the isolated through-pattern 49 that had been formed through the electron beam exposure was found to be within the range of 10 to 30 nm, thus making it possible to obtain a high precision alignment between the pattern formed through the light exposure and the pattern formed through the electron beam exposure without raising any problem in the formation of a pattern required for forming a large scale integrated circuit of giga bit class.

EXAMPLE 4

This example illustrates a case wherein an alignment mark was formed in a resist film, and the alignment of patterns was performed using this alignment mark.

Figure 4A:
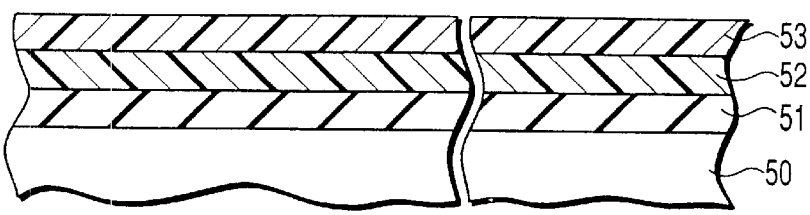
FIGS. 4A to 4E illustrate cross-sectional views sequentially showing the process of forming a pattern according to Example 4 of this invention.
Figure 4B:
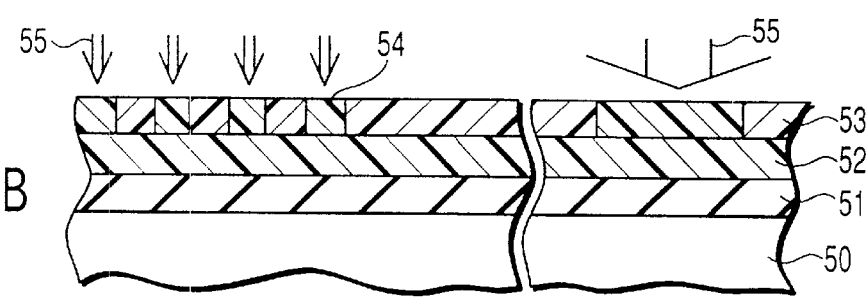

First of all, in the same manner as in Example 3, a work film 51, an anti-reflection film 52 and a resist film 53 were successively formed on the surface of a silicon wafer 50 (FIG. 4A). Then, the exposure of the resist film 53 was performed by making use of a reduced optical type stepper using a first energy beam 55, i.e. KrF excimer laser as a light source (FIG. 4B). The photomask employed in this case included cross patterns to be employed as an alignment mark at the subsequent step of electron beam irradiation, so that the exposure of the alignment marks was simultaneously performed.

Figure 4C:
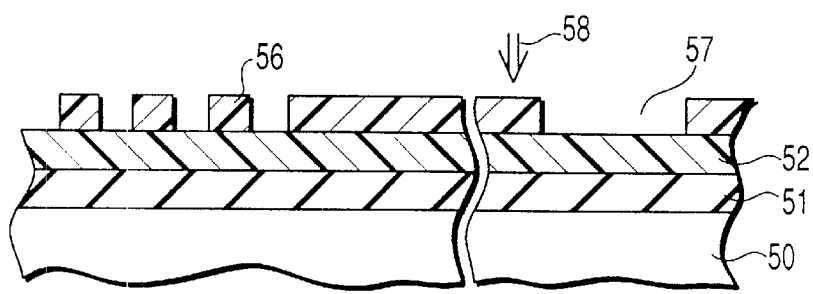

Then, after the resist film 53 was baked for 90 seconds at a temperature of 110° C. by making use of a hot plate, the resist film 53 was subjected to a developing treatment by making use of a 0.21N TMAH developing solution, thereby dissolving and removing the exposed portion to form a first resist pattern including a line-and-space pattern 56 and a cross pattern 57 (FIG. 4C).

Thereafter, a helium neon laser 58 was irradiated onto the cross pattern 57 thereby to perform the detection of the information on position of the first resist pattern. The light to be employed for detecting the position of the first resist pattern is required to be of a wavelength that would not photo-sensitize the resist or of an exposure dose that would not photo-sensitize the resist. Actually, the wavelength of the helium neon laser 58 employed in this Example was 633 nm, thus obviating any possibility to photo-sensitize the resist.

Figure 4D:
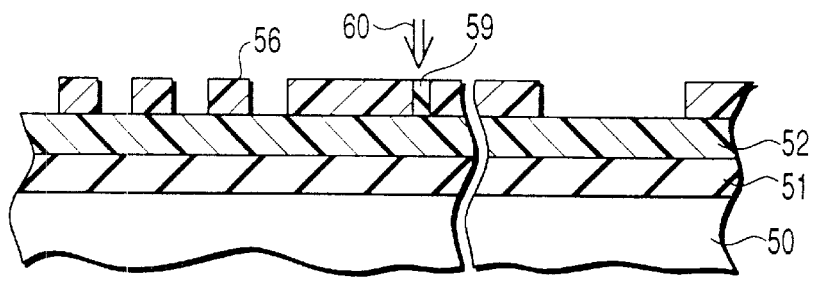
Figure 4E:
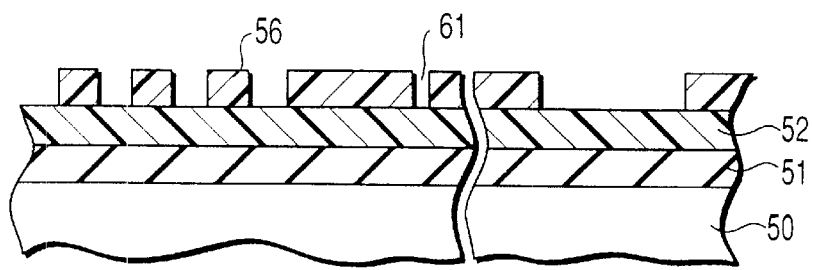

Then, the first resist pattern formed through aforementioned light exposure as further subjected to an exposure with a second energy beam 60 or an electron beam of 10 keV in accelerating voltage at a dosage of 10 $\mu C/cm^2$ (FIG. 4D). At this occasion, the position of irradiation by the electron beam was determined on the basis of the detected result about the information on position of the first resist pattern. After being baked again for 90 seconds at a temperature of 110° C. by making use of a hot plate, the first resist pattern was subjected to a developing treatment by making use of a 0.21N TMAH developing solution, thereby dissolving and removing the exposed portion 59 to form a second resist pattern mixedly comprising an isolated through-pattern 61 having a through line width of 0.10 μm and the line-and-space pattern 56 having a line width of 0.25 μm (FIG. 4E).

According to this Example, the alignment precision between the line-and-space pattern 56 that had been formed through the light exposure and the isolated through-pattern 61 that had been formed through the electron beam exposure was found to be almost the same as that obtained in Example 3.

EXAMPLE 5

This example illustrates a case wherein the exposures by means of electron beam exposure and by means of light exposure were performed in the mentioned order, thereby obtaining predetermined patterns, respectively.

Figure 5A:
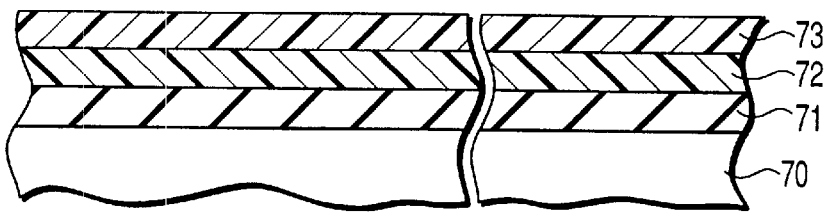
FIGS. 5A to 5E illustrate cross-sectional views sequentially showing the process of forming a pattern according to Example 5 of this invention.
Figure 5B:
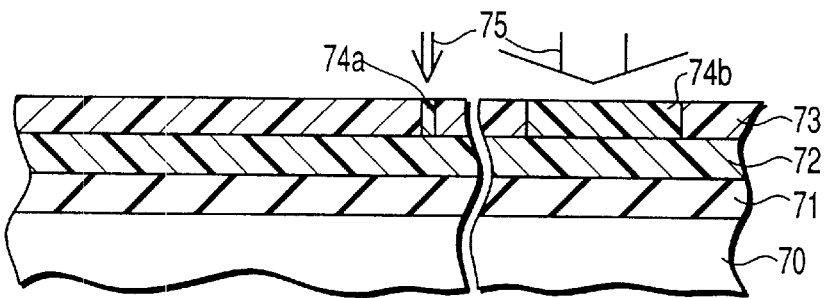

First of all, in the same manner as in Example 3, a work film 71, an anti-reflection film 72 and a resist film 73 were successively formed on the surface of a silicon wafer 70 (FIG. 5A). Then, the exposure of the resist film 73 was performed by making use of a first energy beam 75, i.e. an electron beam of 10 keV in accelerating voltage at a dosage of 10 μC/cm² (FIG. 5B). Concurrently, the exposure of cross patterns 77 to be employed as an alignment mark at the subsequent step of light exposure was also performed.

The irradiation of an electron beam was performed by means of a character projection-wherein the isolated through-pattern and the cross patterns were etched inside the aperture, thereby allowing the isolated through-pattern as well as the cross patterns to be transferred simultaneously to the resist film by a single step of transferring.

Figure 5C:
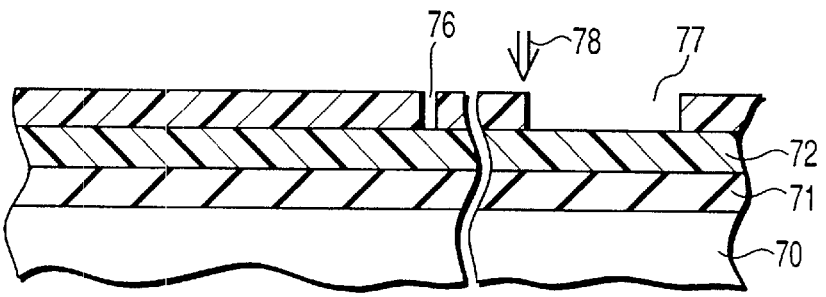

Then, after being baked for 90 seconds at a temperature of 110° C. by making use of a hot plate, the resist film 73 was subjected to a developing treatment by making use of a 0.21N TMAH developing solution, thereby dissolving and removing the exposed portions 74a and 74b, thus forming a first resist pattern including the isolated through-pattern 76 and the cross pattern 77 (FIG. 5C).

Thereafter, a helium neon laser 78 was irradiated onto the cross pattern 77 thereby to perform the detection of the information on position of the first resist pattern that had been formed through the irradiation of an electron beam. The light to be employed for detecting the position of the first resist pattern is required to be of a wavelength that would not photo-sensitize the resist or of an exposure dose that would not photo-sensitize the resist. Actually, the wavelength of the helium neon laser 78 employed in this Example was 633 nm, thus obviating any possibility to photo-sensitize the resist.

Figure 5D:
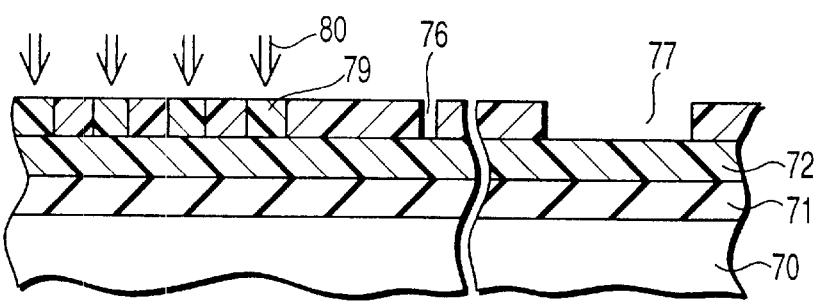

Then, the exposure of the resist film 73 was performed by making use of a reduced optical type stepper using a second energy beam 80, i.e. KrF excimer laser as a light source (FIG. 5D). At this occasion, the position of the pattern was determined on the basis of the detected result about the information on position of the cross pattern.

Figure 5E:
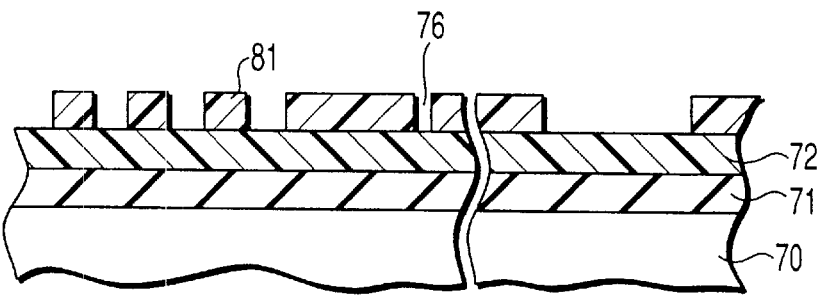

After being baked again for 90 seconds at a temperature of 110° C. by making use of a hot plate, the first resist pattern was subjected to a developing treatment by making use of a 0.21N TMAH developing solution, thereby removing the exposed portion 79, thus forming a second resist pattern mixedly comprising the line-and-space pattern 81 having a line width of 0.25 μm and an isolated through-pattern 76 having a through line width of 0.10 μm (FIG. 5E).

According to this Example, the alignment precision between the line-and-space pattern 81 that had been formed through the light exposure and the isolated through-pattern 76 that had been formed through the electron beam exposure was found to be almost the same as that obtained in Example 1.

EXAMPLE 6

This example illustrates a case wherein a positive resist pattern was formed by making use of a first energy beam, and then, a negative resist pattern was formed by making use of a second energy beam.

Figure 6A:
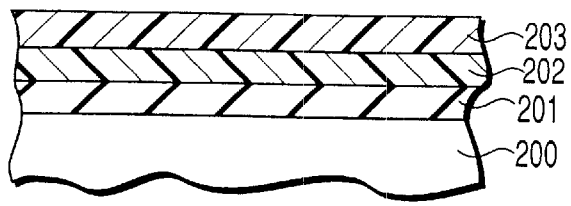
FIGS. 6A to 6E illustrate cross-sectional views sequentially showing the process of forming a pattern according to Example 6 of this invention.
Figure 6B:
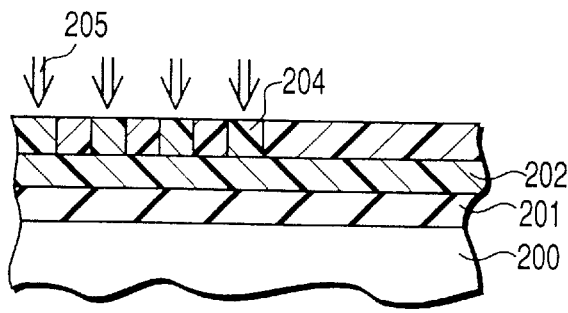

First of all, in the same manner as in Example 3, a work film 201, an anti-reflection film 202 and a resist film 203 were successively formed in the mentioned order on the surface of a silicon wafer 200 (FIG. 6A). Then, the exposure of the resist film 203 was performed by making use of a reduced optical type stepper using a first energy beam 205, i.e. KrF excimer laser as a light source (FIG. 6B).

Figure 6C:
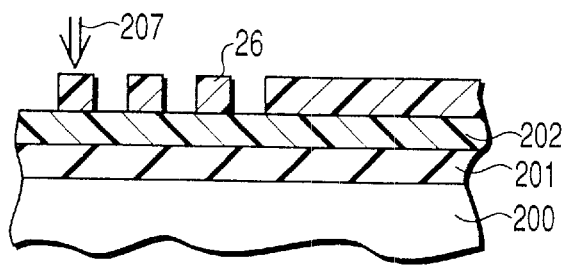

Then, after the resist film 203 was baked for 90 seconds at a temperature of 110° C. by making use of a hot plate, the resist film 203 was subjected to a developing treatment by making use of a 0.21N TMAH developing solution, thereby dissolving and removing the exposed portion 204, thus forming a first resist pattern including a line-and-space pattern 206 (FIG. 6C).

Figure 6D:
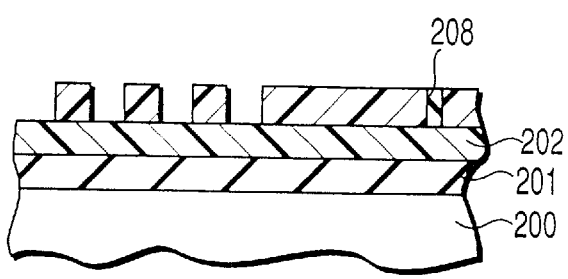

Thereafter, an electron beam 207 was irradiated onto the resist pattern 206 thereby to perform the detection of the information on position of the first resist pattern. Then, the entire region of the resist film except the region 208 was subjected to an exposure with a second energy beam (not shown) or an electron beam of 10 keV in accelerating voltage at a dosage of 10 μC/cm² (FIG. 6D). At this occasion, the position of irradiation by the electron beam was determined on the basis of the detected result about the information on position of the first resist pattern.

Figure 6E:
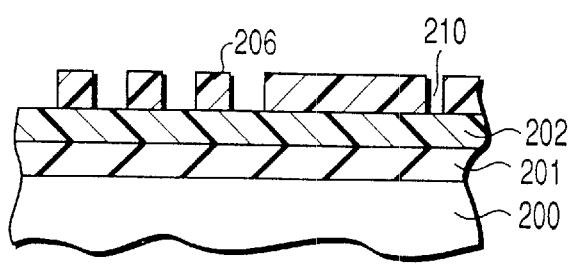

After being baked again for 90 seconds at a temperature of 110° C. by making use of a hot plate, the first resist pattern was subjected to a developing treatment by making use of a developing solution comprising methylisobutyl ketone, thereby dissolving and removing the region 208 other than the exposed region thereby to form a second resist pattern mixedly comprising an isolated through-pattern 61 having a through line width of 0.10 μm and the line-and-space pattern 206 having a line width of 0.25 μm (FIG. 6E).

According to this Example, the alignment precision between the line-and-space pattern 206 that had been formed through the light exposure and the isolated through-pattern 210 that had been formed through the electron beam exposure was found to be almost the same as that obtained in Example 3.

As explained above, according to the first embodiment of this invention, since a resist film is patterned using a first energy beam, and an underlying film is patterned using a second energy beam, by using light or electron beam as the first and second energy beam, respectively, it becomes possible to form a pattern enabling to obtain a high resolution specific to the electron beam and to realize an excellent productivity specific to ultraviolet rays, even if it employs a resist which is incapable of forming an excellent profile when the second energy beam exposure is employed.

According to the second embodiment of this invention, since the resist pattern formed by means of a first energy beam is employed as an alignment mark in the alignment of the pattern to be formed using a second energy beam (i.e. these patterns are directly aligned with each other), the alignment (registration) accuracy can be greatly improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern by making use of a hybrid exposure, said method comprising the steps of:

forming an underlying film on a work film;

forming a resist film on said underlying film;

exposing said resist film to a first energy beam of a first pattern;

forming a resist pattern by subjecting said resist film to a developing treatment;

exposing a region of the underlying film that is not covered with the resist film to a second energy beam of a second pattern; and dry-etching said underlying film by using as a mask, said resist pattern, and region of said underlying film exposed to said second energy beam.

2. The method forming a pattern according to claim 1, wherein said first energy beam is ultraviolet rays, while said second energy beam is a charged beam.

3. The method forming a pattern according to claim 2, wherein said charged beam is selected from the group consisting of an electron beam and an ion beam.

4. The method forming a pattern according to claim 1, wherein an extinction coefficient k of ultraviolet rays in said underlying film is in the range of $0.1<k<1.0$.

5. The method forming a pattern according to claim 1, wherein said underlying layer is formed of a resin film containing an organic silicon compound whose backbone chain includes a silicon-silicon bond.

6. The method forming a pattern according to claim 1, wherein said underlying layer is formed of a material which can be hardened by the irradiation of the second energy beam.

7. The method forming a pattern according to claim 1, wherein a dry etching of said underlying layer is performed by making use of a source gas containing chlorine atom or bromine atom.

8. The method forming a pattern according to claim 1, wherein the position of exposure to said underlying film for forming the second pattern by making use of said second energy beam is corrected based on the information on position of said resist pattern.

9. The method forming a pattern according to claim 8, wherein the detection of position is performed using a light beam or an electron beam.

10. A method of forming a pattern by making use of a hybrid exposure, said method comprising the steps of;

forming a resist film on a work film;

exposing said resist film to a first energy beam of a first pattern;

forming a first resist pattern by subjecting said resist film to a developing treatment;

detecting information on the position of said first resist pattern;

exposing said first resist pattern to a second energy beam of a second pattern based on a result of said information obtained on the position of said first resist pattern; and forming a second resist pattern by subjecting said first resist pattern to a developing treatment.

11. The method forming a pattern according to claim 10, wherein said first energy beam is ultraviolet rays, while said second energy beam is a charged beam.

12. The method forming a pattern according to claim 10, wherein said first energy beam is a charged beam, while said second energy beam is ultraviolet rays.

13. The method forming a pattern according to claim 10, wherein said first resist pattern and said second resist pattern are both a positive pattern.

14. The method forming a pattern according to claim 10, wherein said first resist pattern is a positive pattern, and said second resist pattern is a negative pattern.

15. The method forming a pattern according to claim 10, wherein said detection of positional information is performed using a light or electron beam.

16. The method forming a pattern according to claim 15, wherein said detection of position is performed in a manner to prevent said resist from being photosensitized.

* * * * *